(12) United States Patent
Suzawa et al.

(10) Patent No.: US 8,674,366 B2
(45) Date of Patent: Mar. 18, 2014

(54) DISPLAY DEVICE AND MANUFACTURING METHOD OF DISPLAY DEVICE

(75) Inventors: Hideomi Suzawa, Atsugi (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 190 days.

(21) Appl. No.: 12/904,536

(22) Filed: Oct. 14, 2010

(65) Prior Publication Data

US 2011/0031501 A1 Feb. 10, 2011

Related U.S. Application Data

(62) Division of application No. 11/500,296, filed on Aug. 8, 2006, now Pat. No. 7,838,347.

(30) Foreign Application Priority Data

Aug. 12, 2005 (JP) ................................. 2005-233890

(51) Int. Cl.
*H01L 29/04* (2006.01)
*H01L 29/22* (2006.01)

(52) U.S. Cl.
USPC .................................. 257/72; 257/98; 257/99

(58) Field of Classification Search
USPC ............ 257/72, 91, 95, 96, 98–100, E31.095, 257/E33.061, E33.064, E51.018, E51.019
See application file for complete search history.

(56) References Cited

U.S. PATENT DOCUMENTS

| 5,684,365 | A | 11/1997 | Tang et al. |
| 6,521,912 | B1 | 2/2003 | Sakama et al. |
| 6,781,162 | B2 | 8/2004 | Yamazaki et al. |
| 6,818,852 | B2 | 11/2004 | Ohmi et al. |
| 6,919,282 | B2 | 7/2005 | Sakama et al. |

(Continued)

FOREIGN PATENT DOCUMENTS

| CN | 1375859 | 10/2002 |
| CN | 1604278 | 4/2005 |

(Continued)

OTHER PUBLICATIONS

Chinese Office Action (Application No. 200910179076.4) Dated Jan. 12, 2011.

(Continued)

*Primary Examiner* — Hung Vu
(74) *Attorney, Agent, or Firm* — Eric J. Robinson; Robinson Intellectual Property Law Office, P.C.

(57) ABSTRACT

According to one feature of the present invention, a display device is manufactured according to the steps of forming a semiconductor layer; forming a gate insulating layer over the semiconductor layer; forming a gate electrode layer over the gate insulating layer; forming source and drain electrode layers in contact with the semiconductor layer; forming a first electrode layer electrically connected to the source or drain electrode layer; forming an inorganic insulating layer over part of the first electrode layer, the gate electrode layer, the source electrode layer, and the drain electrode layer; subjecting the inorganic insulating layer and the first electrode layer to plasma treatment; forming an electroluminescent layer over the inorganic insulating layer and the first electrode layer which are subjected to plasma treatment; and forming a second electrode layer over the electroluminescent layer.

32 Claims, 29 Drawing Sheets

(56) References Cited

U.S. PATENT DOCUMENTS

| | | | |
|---|---|---|---|
| 7,097,735 | B2 | 8/2006 | Ohmi et al. |
| 7,098,147 | B2 | 8/2006 | Nansei et al. |
| 7,105,365 | B2 | 9/2006 | Hiroki et al. |
| 7,166,899 | B2 | 1/2007 | Sakama et al. |
| 7,264,979 | B2 | 9/2007 | Yamagata et al. |
| 7,265,391 | B2 | 9/2007 | Yamazaki et al. |
| 7,291,970 | B2 | 11/2007 | Kuwabara |
| 7,303,996 | B2 | 12/2007 | Wang et al. |
| 7,364,954 | B2 | 4/2008 | Kuwashima et al. |
| 7,378,126 | B2 | 5/2008 | Yamazaki et al. |
| 7,410,839 | B2 | 8/2008 | Isobe et al. |
| 7,449,833 | B2 | 11/2008 | Kobayashi |
| 7,452,257 | B2 | 11/2008 | Tsuchiya et al. |
| 7,465,677 | B2 | 12/2008 | Isobe et al. |
| 7,485,478 | B2 | 2/2009 | Yamagata et al. |
| 7,608,490 | B2 | 10/2009 | Yamazaki et al. |
| 7,674,635 | B2 | 3/2010 | Hiroki et al. |
| 7,785,947 | B2 | 8/2010 | Isobe et al. |
| 7,825,419 | B2 | 11/2010 | Yamagata et al. |
| 7,868,543 | B2 | 1/2011 | Kobayashi |
| 2002/0020497 | A1 | 2/2002 | Ohmi et al. |
| 2004/0217431 | A1 | 11/2004 | Shimada |
| 2004/0246432 | A1* | 12/2004 | Tsuchiya et al. ............... 349/187 |
| 2005/0005854 | A1 | 1/2005 | Suzuki |
| 2005/0087769 | A1* | 4/2005 | Yamazaki et al. ............ 257/202 |
| 2006/0246633 | A1 | 11/2006 | Arai et al. |
| 2006/0270066 | A1 | 11/2006 | Imahayashi et al. |
| 2009/0001896 | A1 | 1/2009 | Yamazaki et al. |
| 2010/0157165 | A1 | 6/2010 | Hiroki et al. |
| 2011/0024787 | A1 | 2/2011 | Yamagata et al. |

FOREIGN PATENT DOCUMENTS

| | | |
|---|---|---|
| EP | 0 717 446 | 6/1996 |
| EP | 1 331 666 | 7/2003 |
| EP | 1 617 483 | 1/2006 |
| EP | 1 622 194 | 2/2006 |
| JP | 08-234683 | 9/1996 |
| JP | 2001-135824 | 5/2001 |
| JP | 2003-288994 | 10/2003 |
| JP | 2003-317955 A | 11/2003 |
| JP | 2004-087321 | 3/2004 |
| JP | 2004-127933 A | 4/2004 |
| JP | 2004-319952 | 11/2004 |
| JP | 2005-026358 A | 1/2005 |
| JP | 2005-135929 A | 5/2005 |
| JP | 2005-158393 A | 6/2005 |
| JP | 2005-209612 A | 8/2005 |
| WO | WO 2004/017396 | 2/2004 |
| WO | WO-2004/026002 | 3/2004 |
| WO | WO 2005/004223 | 1/2005 |

OTHER PUBLICATIONS

Nikkei Microdevices, Report [LSI] "The Advancing Introduction of Plasma Oxynitriding Apparatus Adopted by More than 10 LSI Makers," pp. 100-103, dated Apr. 1, 2005.

Office Action (Application No. 200610110958.1) dated Sep. 26, 2008.

Office Action (Application No. 200610110958.1) dated Apr. 24, 2009.

* cited by examiner

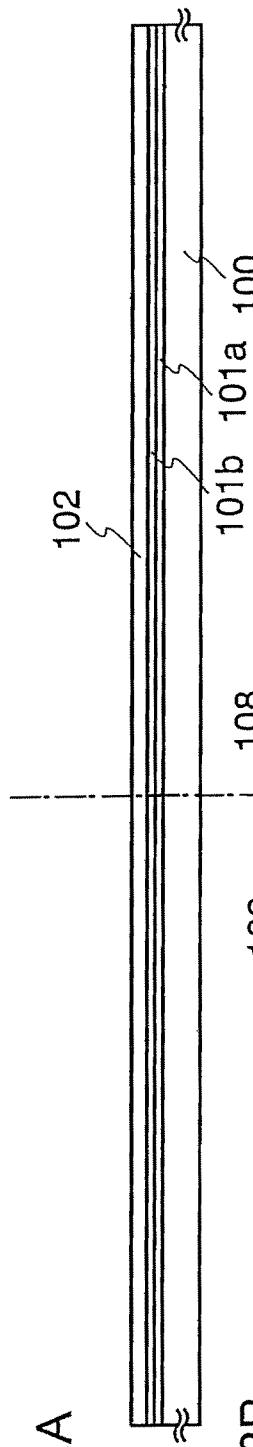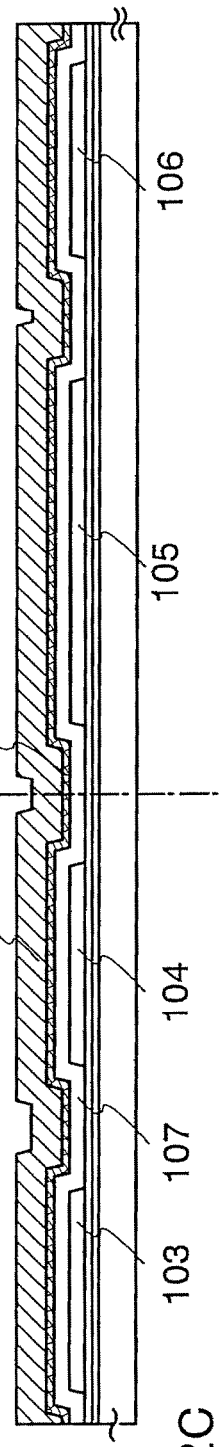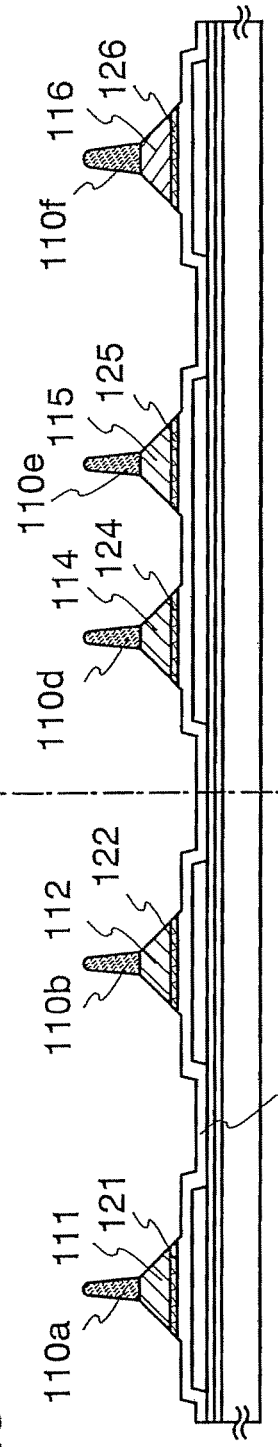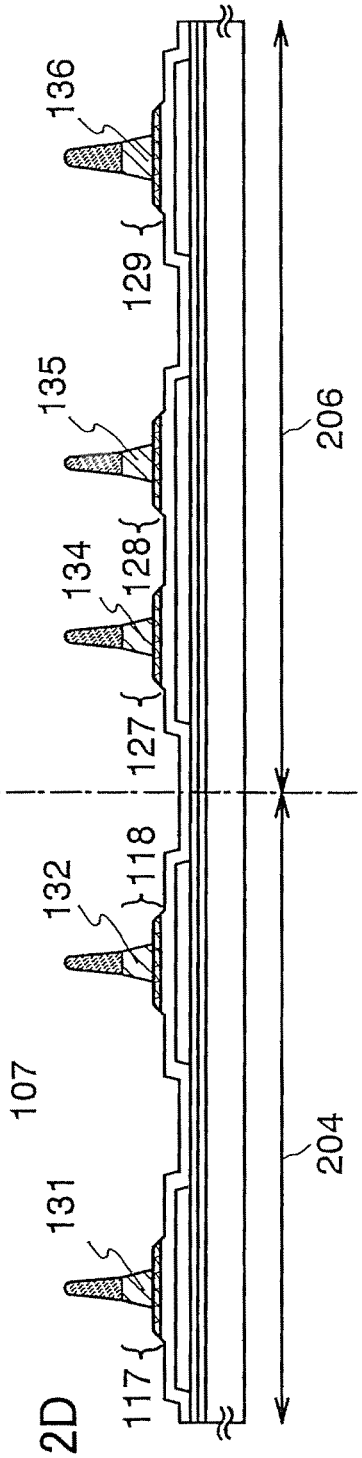

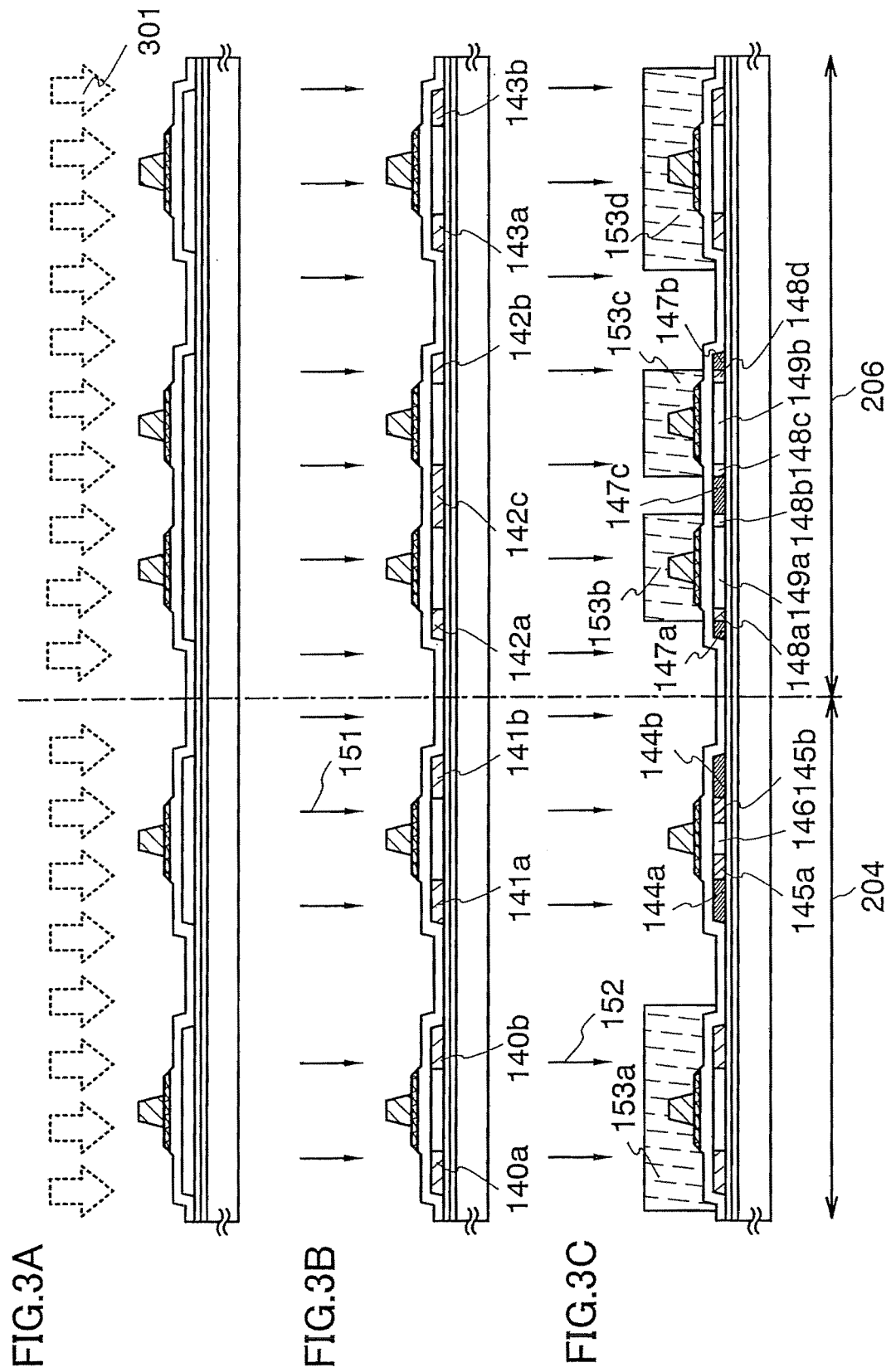

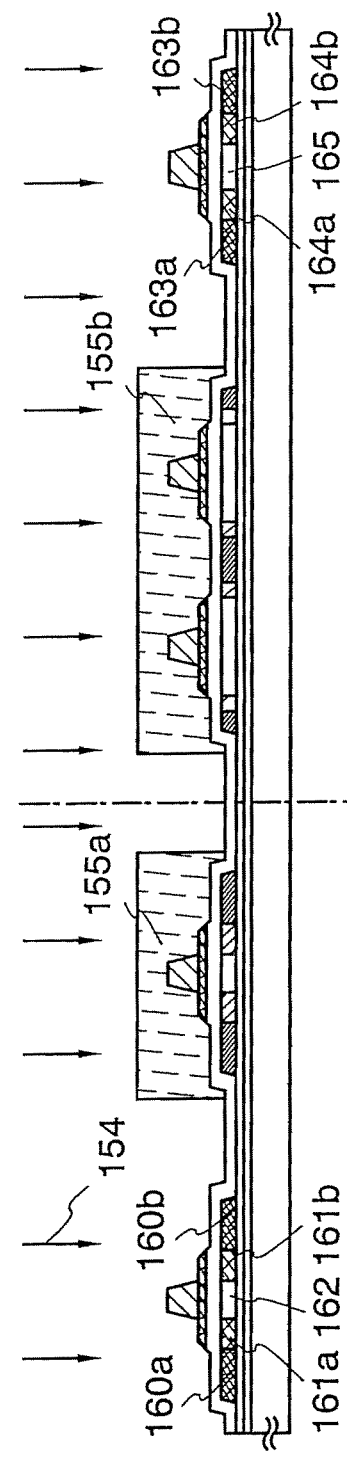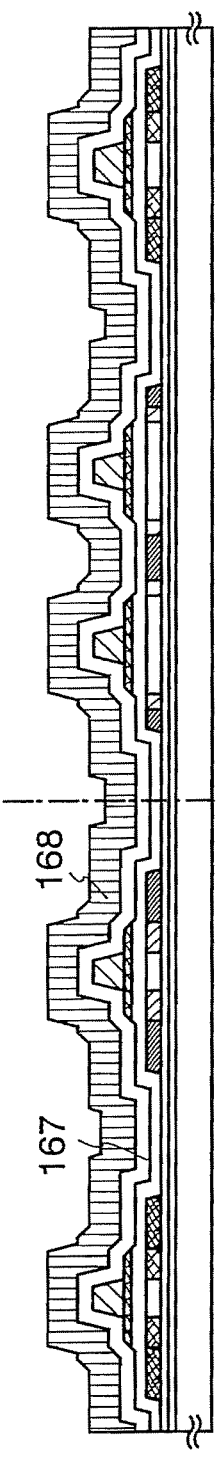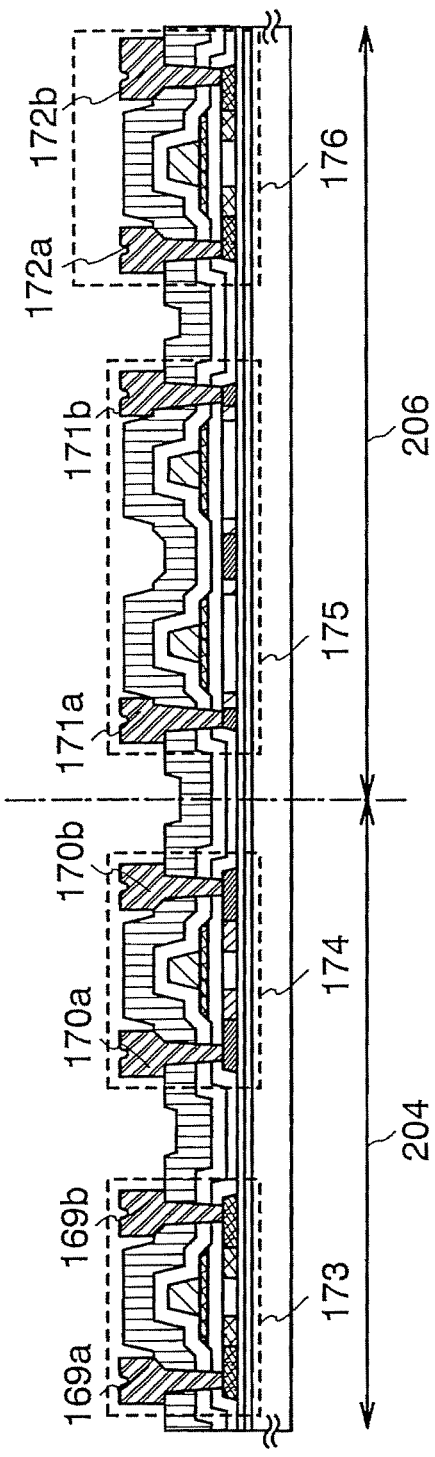

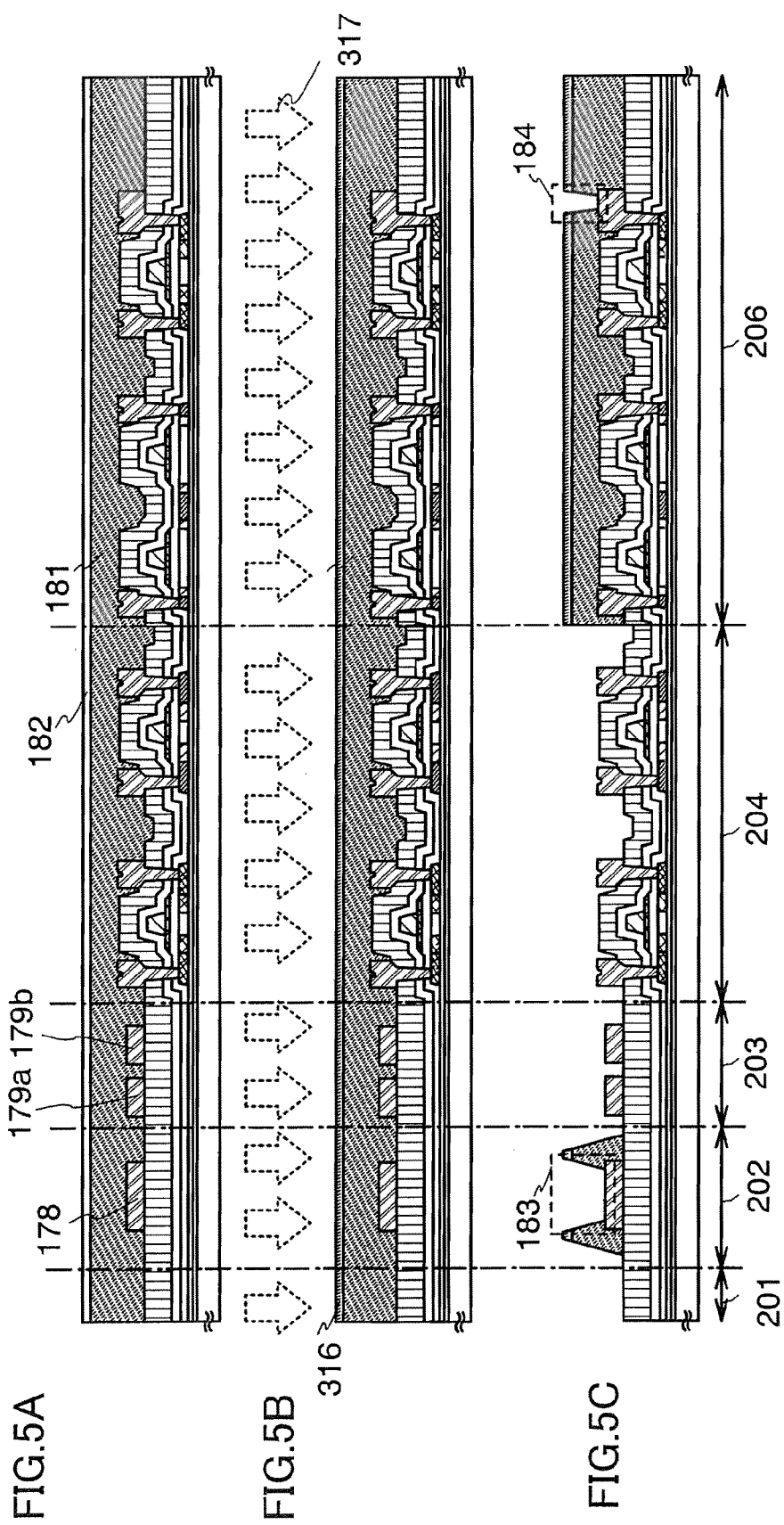

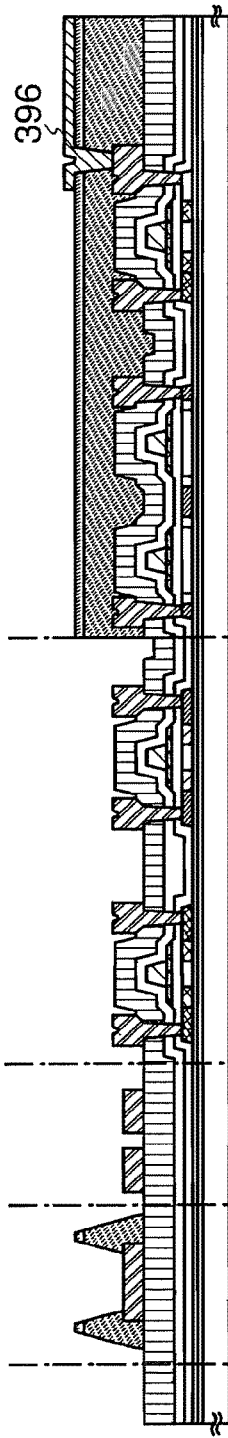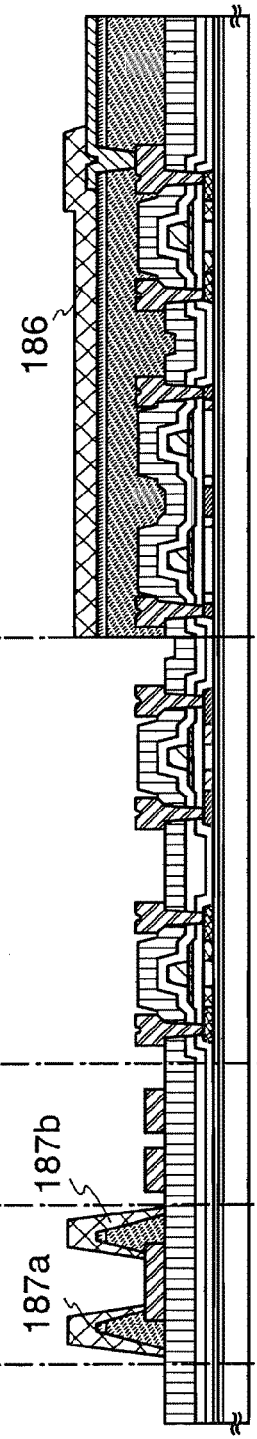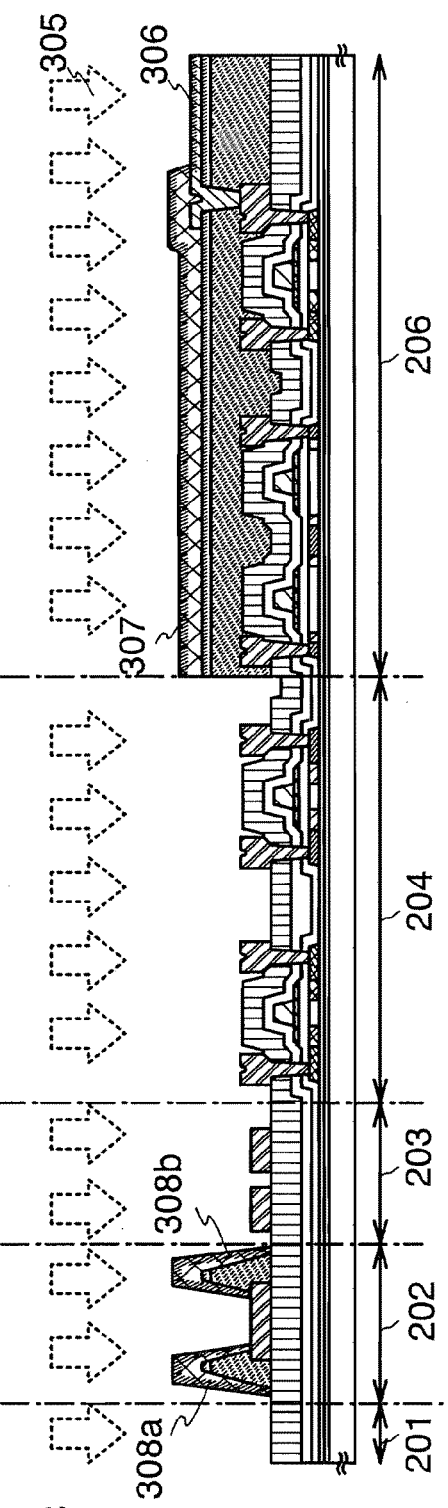

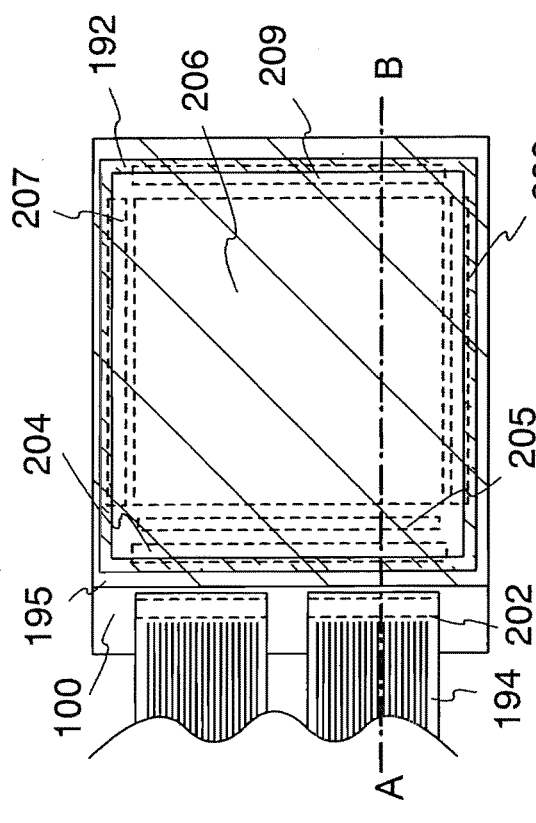
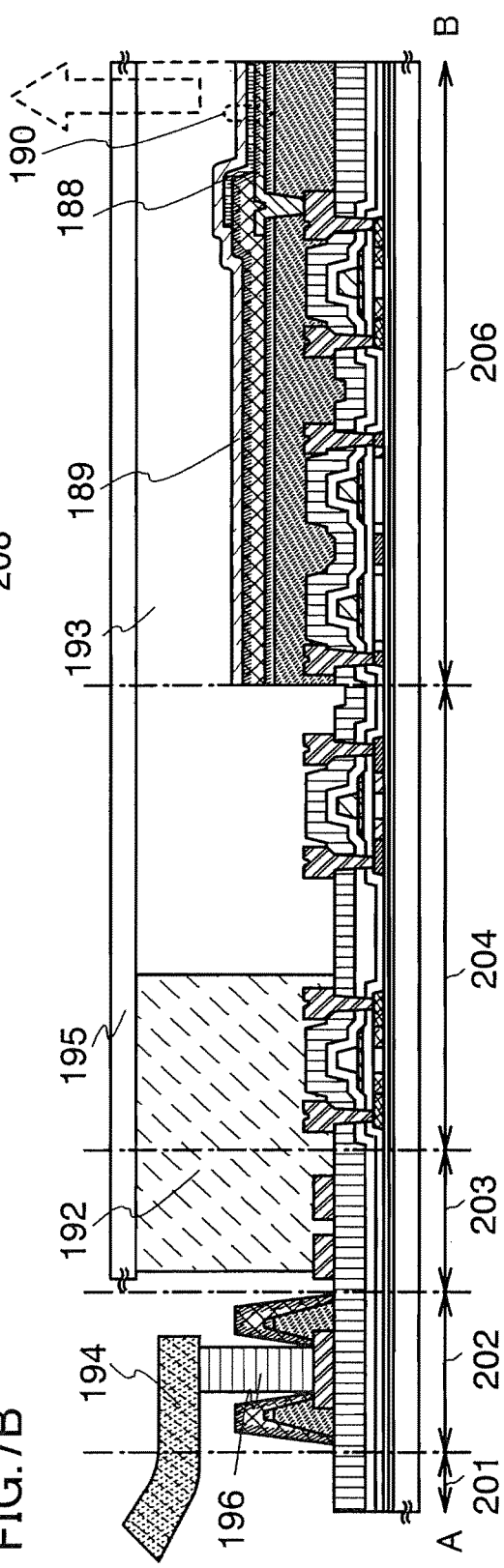
FIG.7A
FIG.7B

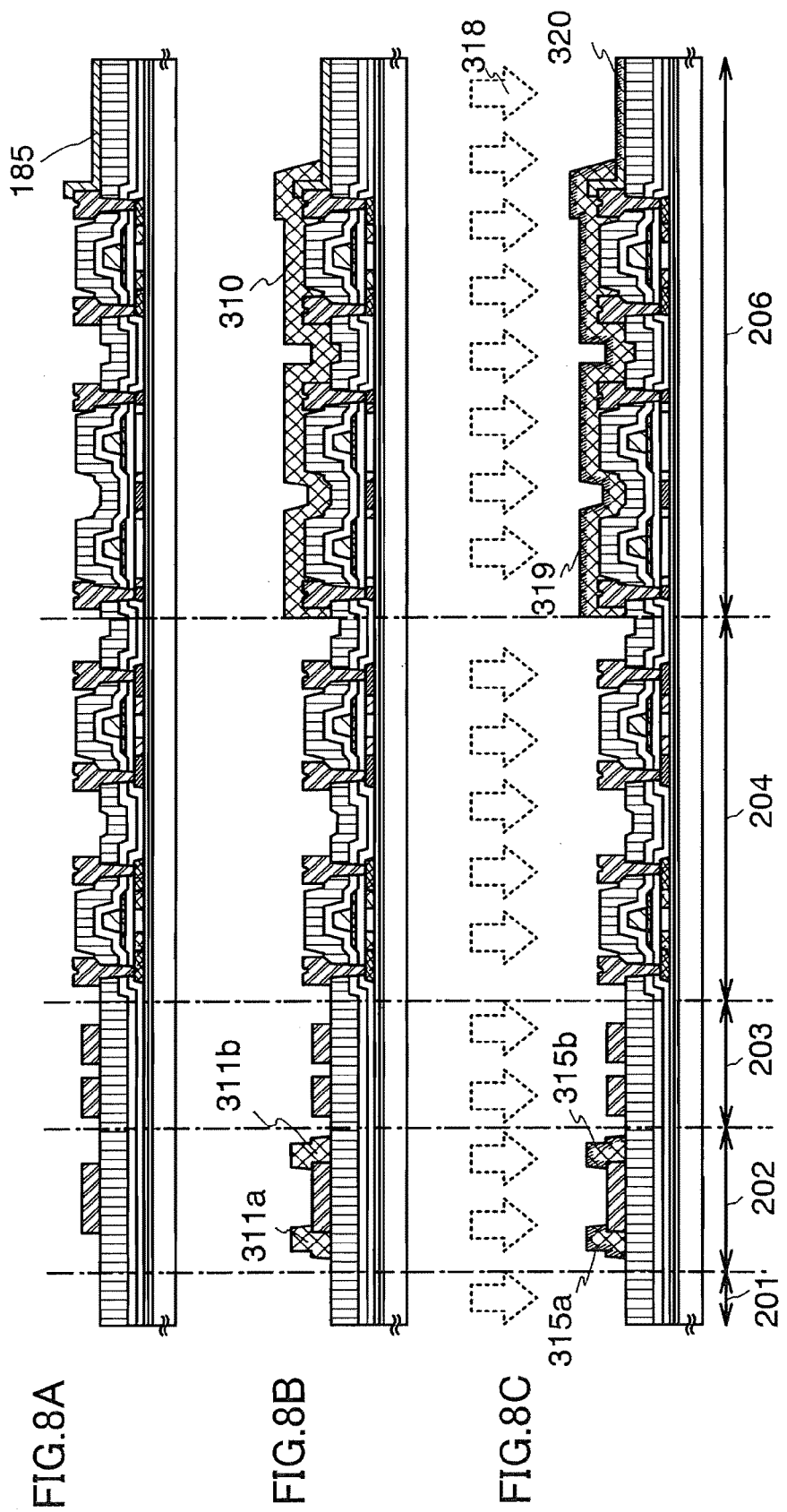

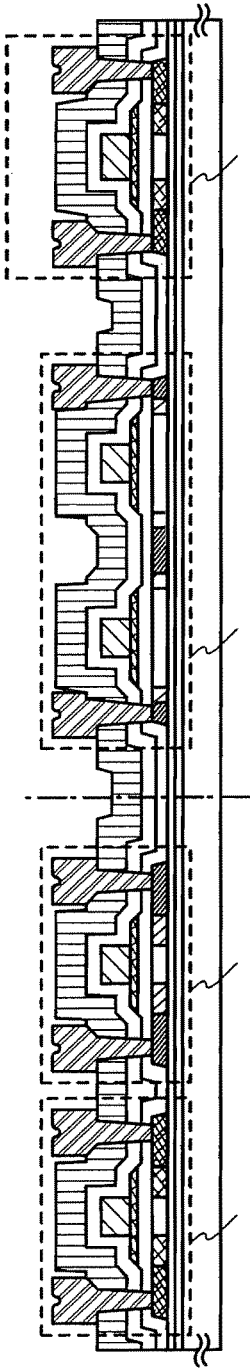
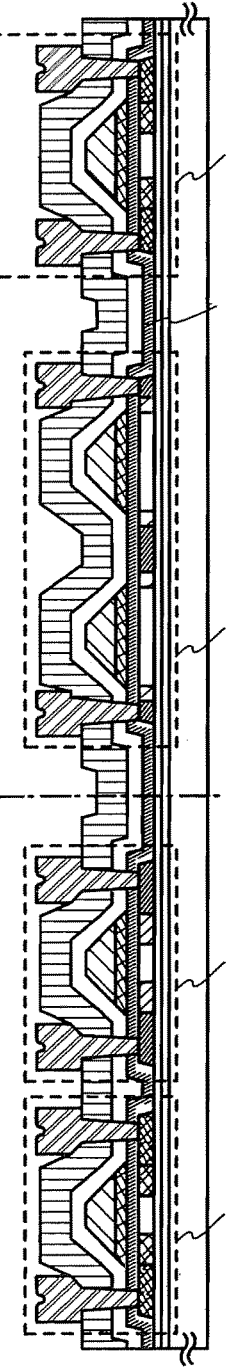
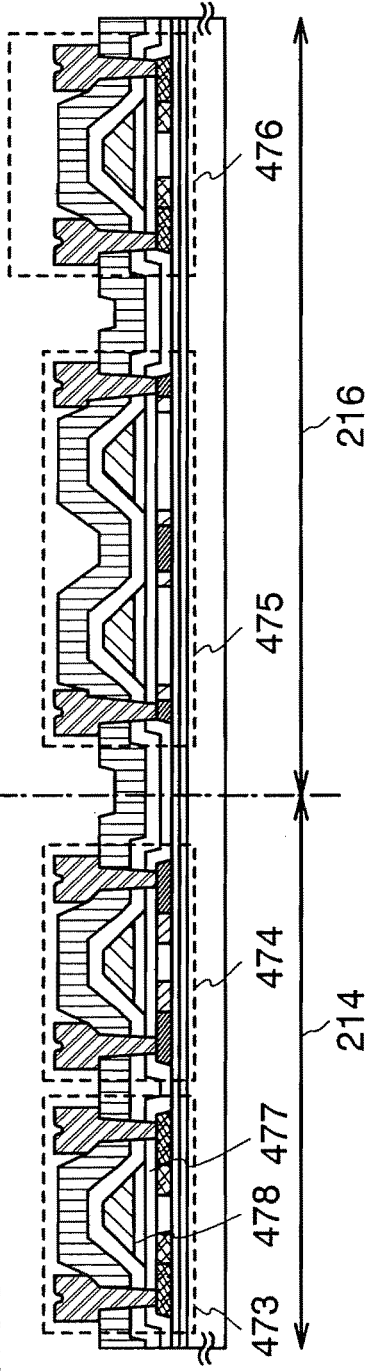
FIG.13A
FIG.13B
FIG.13C

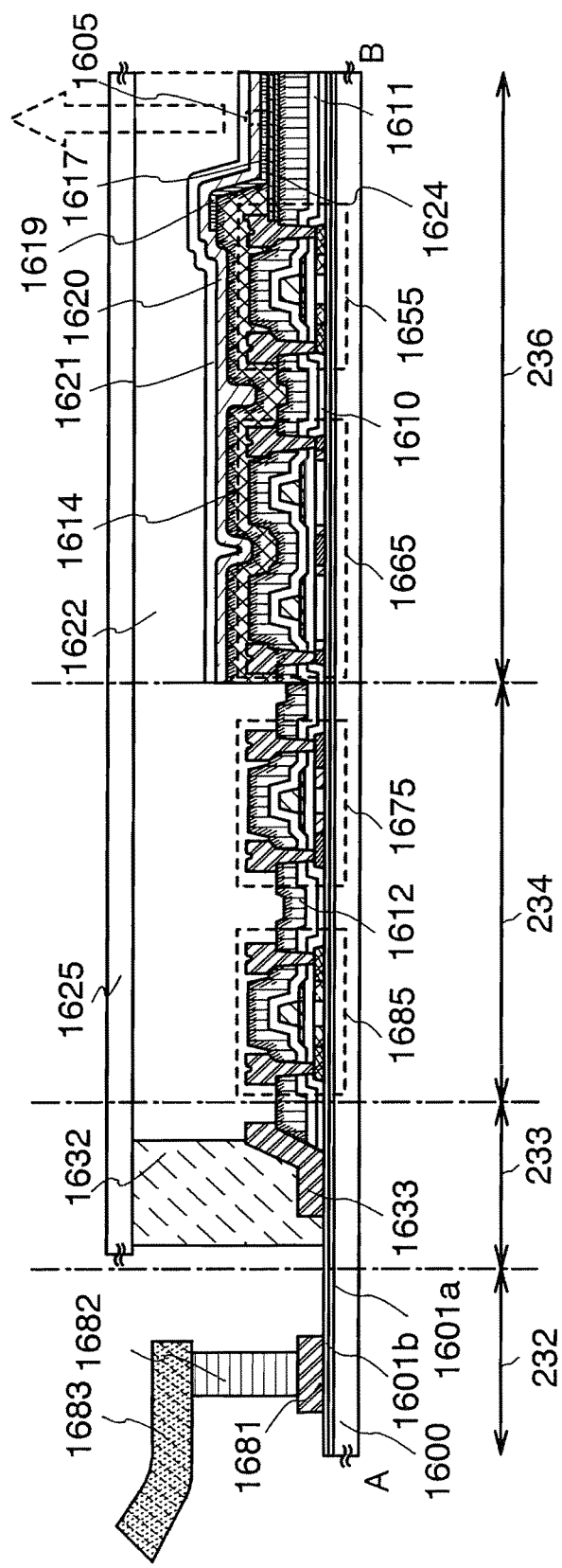

DISPLAY DEVICE AND MANUFACTURING METHOD OF DISPLAY DEVICE

BACKGROUND OF THE INVENTION

1. Field of the Invention

The present invention relates to a display device and a manufacturing method of a display device.

2. Description of the Related Art

In a display device provided with an electroluminescence (hereinafter, also referred to as EL) element, a color light-emitting element that emits color light is used to perform full color display. Forming a light-emitting material of each color over an electrode in a minute pattern is one of important elements to form a color light-emitting element.

The light-emitting element is isolated in every pixel, which is single or plural, by an insulating layer. As the insulating layer like this that isolates between pixels, an inorganic insulating material has been used (for example, see Reference 1: Japanese Patent Application Laid-Open No. 2003-288994).

An electroluminescence element (hereinafter, also referred to as an EL element) has a problem in that luminescence properties such as luminance or evenness of luminescence significantly deteriorate with time, as compared with an early period. The low reliability is a factor in the limited practical application. As one factor of worsening reliability, water or oxygen, which penetrates the EL element from outside, is given.

SUMMARY OF THE INVENTION

It is an object of the present invention to provide a technique for being able to manufacture a display device preventing deterioration of such an EL element and having high reliability with high yields.

In addition, a display device can be manufactured by applying the present invention. As a display device to which the present invention can be applied, a light-emitting display device is given, in which a light-emitting element and a thin film transistor (hereinafter, also referred to as a TFT) are connected, where the light-emitting element includes a layer containing an organic material or an inorganic material exhibiting light emission called electroluminescence, or a mixture of an organic material and an inorganic material interposed between electrodes. The EL element includes an element that at least contains a material that can obtain electroluminescence and that emits light by applying current.

According to one feature of the present invention, a method for manufacturing a display device includes the steps of forming a semiconductor layer; forming a gate insulating layer over the semiconductor layer; forming a gate electrode layer over the gate insulating layer; forming source and drain electrode layers in contact with the semiconductor layer; forming a first electrode layer electrically connected to the source or drain electrode layer; forming an inorganic insulating layer over part of the first electrode layer, the gate electrode layer, the source electrode layer, and the drain electrode layer; subjecting the inorganic insulating layer and the first electrode layer to plasma treatment; forming an electroluminescent layer over the inorganic insulating layer and the first electrode layer which are subjected to plasma treatment; and forming a second electrode layer over the electroluminescent layer.

According to another feature of the present invention, a method for manufacturing a display device includes the steps of forming a semiconductor layer; forming a gate insulating layer over the semiconductor layer; forming a gate electrode layer over the gate insulating layer; forming source and drain electrode layers in contact with the semiconductor layer; forming a first electrode layer electrically connected to the source or drain electrode layer; forming an inorganic insulating film over the first electrode layer, the gate electrode layer, the source electrode layer, and the drain electrode layer; forming an inorganic insulating layer having an opening which reaches the first electrode layer by etching the inorganic insulating film; subjecting the inorganic insulating layer and the first electrode layer to plasma treatment; forming an electroluminescent layer over the inorganic insulating layer and the first electrode layer which are subjected to plasma treatment; and forming a second electrode layer over the electroluminescent layer.

According to another feature of the present invention, a method for manufacturing a display device includes the steps of forming a semiconductor layer; forming a gate insulating layer over the semiconductor layer; forming a gate electrode layer over the gate insulating layer; forming source and drain electrode layers in contact with the semiconductor layer; forming a first electrode layer electrically connected to the source or drain electrode layer; forming a first inorganic insulating layer and a second inorganic insulating layer by being stacked over part of the first electrode layer, the gate electrode layer, the source electrode layer, and the drain electrode layer; subjecting the first inorganic insulating layer, the second inorganic insulating layer, and the first electrode layer to plasma treatment; forming an electroluminescent layer over the first inorganic insulating layer, the second inorganic insulating layer, and the first electrode layer which are subjected to plasma treatment; and forming a second electrode layer over the electroluminescent layer.

According to another feature of the present invention, a method for manufacturing a display device includes the steps of forming a semiconductor layer; forming a gate insulating layer over the semiconductor layer; forming a gate electrode layer over the gate insulating layer; forming source and drain electrode layers in contact with the semiconductor layer; forming a first electrode layer electrically connected to the source or drain electrode layer; forming a first inorganic insulating film and a second inorganic insulating film over the first electrode layer, the gate electrode layer, the source electrode layer, and the drain electrode layer; forming a first inorganic insulating layer and a second inorganic insulating layer having an opening which reaches the first electrode layer by etching the first inorganic insulating film and the second inorganic insulating film; subjecting the first inorganic insulating layer, the second inorganic insulating layer, and the first electrode layer to plasma treatment; forming an electroluminescent layer over the first inorganic insulating layer, the second inorganic insulating layer, and the first electrode layer which are subjected to plasma treatment; and forming a second electrode layer over the electroluminescent layer.

According to another feature of the present invention, a display device includes a semiconductor layer, a gate insulating layer, and a gate electrode layer; source and drain electrode layers in contact with the semiconductor layer; a first electrode layer electrically connected to the source or drain electrode layer; a first inorganic insulating layer over part of the first electrode layer, the gate electrode layer, the source electrode layer, and the drain electrode layer; and a second inorganic insulating layer over the first inorganic insulating layer, where a position of the top end of the first inorganic insulating layer and a position of the bottom end of the second inorganic insulating layer accord with each other.

By applying the present invention, a highly reliable display device can be manufactured. Thus, a high resolution and high performance display device can be manufactured with high yields.

BRIEF DESCRIPTION OF DRAWINGS

In the accompanying drawings:

FIGS. 2A to 2D are views each explaining a manufacturing method of a display device of the present invention;

FIGS. 3A to 3C are views each explaining a manufacturing method of a display device of the present invention;

FIGS. 4A to 4C are views each explaining a manufacturing method of a display device of the present invention;

FIGS. 5A to 5C are views each explaining a manufacturing method of a display device of the present invention;

FIGS. 6A to 6C are views each explaining a manufacturing method of a display device of the present invention;

FIGS. 7A and 7B are views each explaining a display device of the present invention;

FIGS. 8A and 8C are views each explaining a manufacturing method of a display device of the present invention;

FIGS. 13A to 13C are views each explaining a manufacturing method of a display device of the present invention;

FIG. 14 is a view explaining a display device of the present invention;

DETAILED DESCRIPTION OF THE INVENTION

Figure 1A:
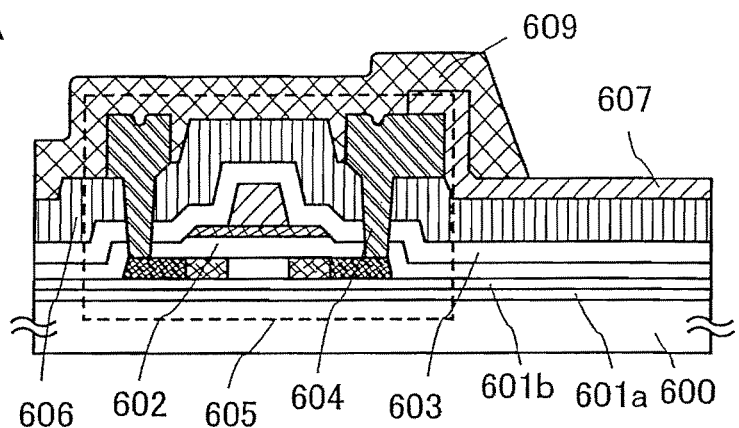
FIGS. 1A to 1C are views each explaining a manufacturing method of a display device of the present invention.

Embodiment modes of the present invention will be explained hereinafter with reference to the accompanying drawings. However, it is to be easily understood that various changes and modifications will be apparent to those skilled in the art. Therefore, unless such changes and modifications depart from the purport and the scope of the present invention, they should be construed as being included therein. Note that, in the structure of the present invention, the same portions or portions having the same function in different drawings are denoted by the same reference numerals and repeated explanations thereof will be omitted.

Embodiment Mode 1

A manufacturing method of a display device in this embodiment mode will be explained with reference to FIGS. 1A to 1C.

Over a substrate 600, base films 601*a* and 601*b*, a thin film transistor 605, a gate insulating layer 602, insulating layers 603 and 606, a first electrode layer 607, and an insulating layer 609 serving as a partition (also referred to as a barrier or the like) are formed (see FIG. 1A). The thin film transistor 605 includes a semiconductor layer having impurity regions each serving as source and drain regions, the gate insulating layer 602, gate electrode layers in a two-layer stacked structure, and source and drain electrode layers 604. The source or drain electrode layer is electrically connected to the impurity region of the semiconductor layer and the first electrode layer 607 by being in contact therewith.

In this embodiment mode, regions of the impurity regions, which overlap with the gate electrode layers with the gate insulating layer interposed therebetween, are denoted as Lov regions. On the other hand, regions of the impurity regions, which do not overlap with the gate electrode layers with the gate insulating layer interposed therebetween, are denoted as Loff regions.

In FIG. 1A, this region is shown by hatching and blank spaces in the impurity regions. This does not refer that the blank spaces are not doped with impurity elements, but makes it easy to understand that the concentration distribution of the impurity element in this region reflects the mask and the doping condition. Note that this is the same in other drawings of this specification.

In this embodiment mode, an inorganic insulating material is used for the insulating layer 609 which is provided in contact with a light-emitting element. An inorganic insulating material can form a dense film; therefore, contaminant such as moisture is not transmitted. Thus, a light-emitting element can be prevented from being deteriorated due to contaminant penetrated from outside of a display device.

As the insulating layer 609, silicon oxide, silicon nitride, silicon oxynitride, silicon nitride oxide, or the like can be used, which may be formed in a single layer or a stacked structure of two layers, three layers, or the like. Note that, in this specification, silicon oxynitride refers to a substance in which the content of oxygen is higher than that of nitrogen, and can also be referred to as silicon oxide containing nitrogen. In the same manner, silicon nitride oxide refers to a substance in which the content of nitrogen is higher than that of oxygen, and can also be referred to as silicon nitride containing oxygen.

In addition, as another material of the insulating layer 609, a material of aluminum nitride, aluminum oxynitride in which the content of oxygen is higher than that of nitrogen, aluminum nitride oxide or aluminum oxide in which the content of nitrogen is higher than that of oxygen, diamond like carbon (DLC), nitrogen-containing carbon, polysilazane, and other substances containing an inorganic insulating material can be used. A material containing siloxane may also be used. Siloxane corresponds to a material containing the Si—O—Si bond. Note that siloxane is composed of a skeleton structure formed by the bond of silicon (Si) and oxygen (O). As a substituent thereof, an organic group containing at least hydrogen (for example, an alkyl group or aromatic hydrocarbon) is used. Alternatively, a fluoro group may also be used as the substituent. Further alternatively, a fluoro group and an organic group containing at least hydrogen may also be used as the substituent.

The insulating layer 609 can be formed by a sputtering method, a PVD (Physical Vapor Deposition) method, a low pressure CVD method (LPCVD method), or a CVD (Chemical Vapor Deposition) method such as a plasma CVD method. Alternatively, a droplet discharging method by which a pattern can be selectively formed, a printing method by which a pattern can be transferred or described (a method, such as a screen printing method or an offset printing method, by which a pattern can be formed), or other methods such as a coating method such as a spin coating method, a dipping method, a dispenser method, or the like can also be used.

An etching process for processing into a desired shape may employ either plasma etching (dry etching) or wet etching. In a case of processing a large area substrate, plasma etching is suitable. As an etching gas, a fluorine based gas such as $CF_4$ or $NF_3$ or a chlorine based gas such as $Cl_2$ or $BCl_3$ is used, to which an inert gas such as He or Ar may be appropriately added. When an etching process by atmospheric pressure discharge is employed, local electric discharge can also be realized, which does not require a mask layer to be formed over the entire surface of the substrate.

The insulating layer 609 covers an end portion of the first electrode layer 607, and an edge portion thereof has a tapered shape. In this specification, in a cross-sectional view of a cross section taken along a face where the insulating layer and the first electrode layer are perpendicular to the substrate surface, an angle between the end portion of the insulating layer and the surface of the first electrode layer is referred to as a taper angle. A taper angle in the edge portion of the insulating layer 609 is preferably larger than 30 degrees (much preferably, 40 degrees or more) and 70 degrees or less (much preferably, 60 degrees or less). In addition, formed using a CVD method or a sputtering method, the insulating layer 609 is formed by reflecting a depression and projection shape in a face to be formed because the insulating layer 609 is formed of an inorganic insulating material. In this case, since a film thickness thereof is not planarized, the face to be formed can be covered with a uniform film thickness; thus, the film thickness can be comparatively thinned. In this embodiment mode, the film thickness of the insulating layer 609 is to be 1 μm or less, preferably 500 nm or less. In this embodiment mode, the film thickness is to be 300 nm.

Serving as a partition of the light-emitting element, the insulating layer 609 is provided so as to surround a vicinity of the first electrode layer 607 which is a pixel electrode. In addition, as an alignment of each pixel, there are a stripe arrangement in which pixels corresponding to red, green, and blue are arranged in stripe, a delta arrangement in which the pixels are arranged so as to be shifted a half pitch per one line, a mosaic arrangement in which sub-pixels corresponding to red, green, and blue are arranged obliquely, and the like. Thus, the insulating layer to be a partition is provided to have a shape having an opening corresponding to each arrangement or in a line, depending on an arrangement of the pixel electrode.

As the first electrode layer 607, indium oxide containing tungsten oxide, indium zinc oxide containing tungsten oxide, indium oxide containing titanium oxide, indium tin oxide containing titanium oxide, or the like can be used. Needless to say, indium tin oxide (ITO), indium zinc oxide (IZO), indium tin oxide added with silicon oxide (ITSO), or the like can also be used.

An example of a composition ratio of a conductive material will be described. In indium oxide containing tungsten oxide, the composition ratio of tungsten oxide may be 1.0 wt % and indium oxide may be 99.0 wt %. In indium zinc oxide containing tungsten oxide, tungsten oxide may be 1.0 wt %, zinc oxide may be 0.5 wt %, and indium oxide may be 98.5 wt %. In indium oxide containing titanium oxide, titanium oxide may be 1.0 to 5.0 wt % and indium oxide may be 99.0 to 95.0 wt %. In indium tin oxide (ITO), tin oxide may be 10.0 wt % and indium oxide may be 90.0 wt %. In indium zinc oxide (IZO), zinc oxide may be 10.7 wt % and indium oxide may be 89.3 wt %. In indium tin oxide containing titanium oxide, titanium oxide may be 5.0 wt %, tin oxide may be 10.0 wt %, and indium oxide may be 85.0 wt %. The above composition ratios are just examples, and a composition ratio thereof may be set appropriately.

In addition, as a metal thin film that can be used for the first electrode layer 607, a conductive film formed of titanium, tungsten, nickel, gold, platinum, silver, aluminum, magnesium, calcium, lithium, and an alloy thereof; or the like can be used.

The first electrode layer 607 can be formed by an evaporation method, a sputtering method, a CVD method, a printing method, a dispenser method, a droplet discharging method, or the like.

In the present invention, the insulating layer to be a partition and the first electrode layer are subjected to plasma treatment. By performing plasma treatment under a nitrogen atmosphere or an oxygen atmosphere, a nitrogen plasma treatment layer or an oxygen plasma treatment layer can be formed by subjecting surfaces and vicinities of the insulating layer and the first electrode layer to nitriding treatment or oxygen treatment. When the insulating layer and the first electrode layer are subjected to oxidation treatment or nitriding treatment (or both oxidation treatment and nitriding treatment may be performed) by using plasma treatment, surfaces (and vicinities) of the insulating layer and the first electrode layer are modified, and an insulating layer and a first electrode layer which are much denser can be obtained. Thus, characteristics or the like of the display device can be improved by suppressing a defect such as a pinhole. Note that the surface vicinity refers to a depth of approximately 0.5 to 1.5 nm from a surface of a silicon oxide layer. For example, by performing plasma treatment under a nitrogen atmosphere, a structure containing nitrogen at the rate of 20 to 50 atomic % in a depth of approximately 1 nm from a surface of the silicon oxide layer is obtained.

In the case where a film is oxidized by plasma treatment, the plasma treatment is performed under an oxygen atmosphere (for example, an atmosphere of oxygen ($O_2$) and a rare gas (including at least one of He, Ne, Ar, Kr, and Xe), an atmosphere of oxygen, hydrogen ($H_2$), and a rare gas, or an atmosphere of dinitrogen monoxide and a rare gas). On the other hand, in the case where a film is nitrided by plasma treatment, the plasma treatment is performed under a nitrogen atmosphere (for example, an atmosphere of nitrogen ($N_2$) and a rare gas (including at least one of He, Ne, Ar, Kr, and Xe), an atmosphere of nitrogen, hydrogen, and a rare gas, or an atmosphere of $NH_3$ and a rare gas). Ar can be used as a rare gas, for example. Alternatively, a gas in which Ar and Kr are mixed may also be used. Therefore, the insulating film formed by plasma treatment includes the rare gas (including at least one of He, Ne, Ar, Kr, and Xe) used for the plasma treatment, and the insulating film includes Ar in the case where Ar is used.

The plasma treatment is performed in the above gas atmosphere with an electron density of $1\times10^{11}$ cm$^{-3}$ or more and a plasma electron temperature of 1.5 eV or less. More specifically, the plasma treatment is performed with an electron density of $1\times10^{11}$ cm$^{-3}$ to $1\times10^{13}$ cm$^{-3}$, and a plasma electron temperature of 0.5 eV to 1.5 eV. Since the plasma electron density is high and the electron temperature around an object (here, the insulating layer 609 and the first electrode layer 607) formed over a substrate is low, damage due to plasma on the object can be prevented. In addition, since the plasma electron density is as high as $1\times10^{11}$ cm$^{-3}$ or more, an oxide film or a nitride film formed by oxidizing or nitriding the object by using the plasma treatment has better uniformity of the thickness and the like and is denser, compared with that of a film formed by a CVD method, a sputtering method, or the like. Moreover, since the plasma electron temperature is as low as 1.5 eV or less, oxidation treatment or nitriding treatment can be performed at lower temperature than a conventional plasma treatment or a thermal oxidation method. For example, even when plasma treatment is performed at a temperature lower than distortion point of a glass substrate by 100° C. or more, the oxidation treatment or the nitriding treatment can be performed sufficiently. As for frequency for generating plasma, a high frequency wave such as a microwave (2.45 GHz) can be used. Note that the above conditions are used for plasma treatment, if not otherwise specified hereinafter.

However, in performing plasma treatment in the present invention, the plasma treatment is performed under such a condition that an adverse effect is not caused on electric characteristics of a thin film transistor that is formed below the insulating layer to be a partition and the first electrode layer of the object.

Figure 1B:
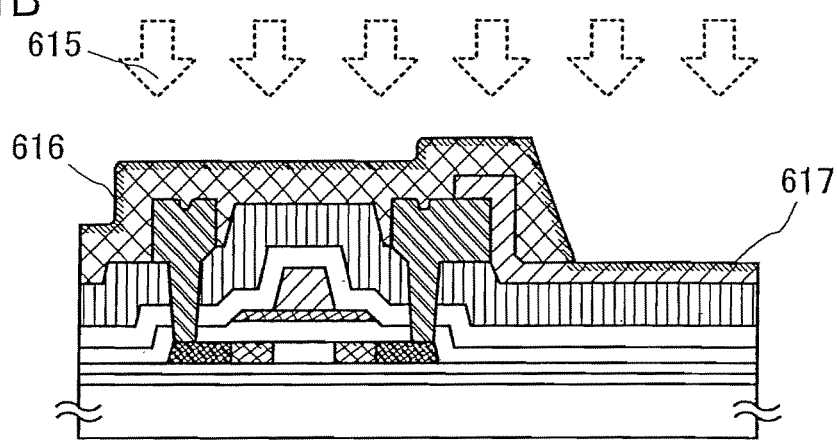
Figure 1C:
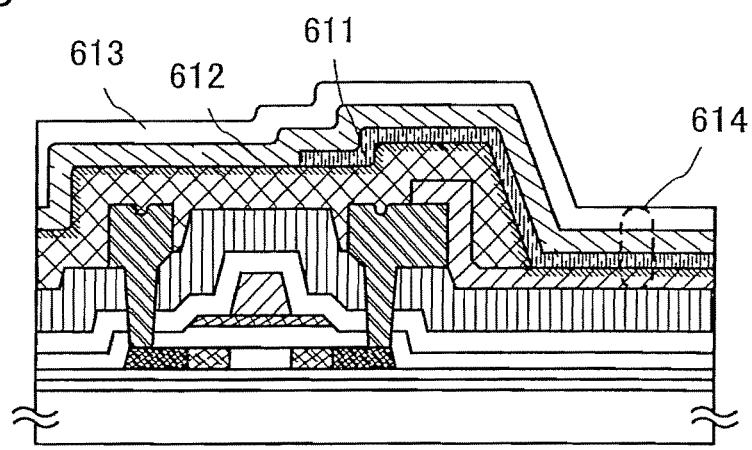
Figure 9:
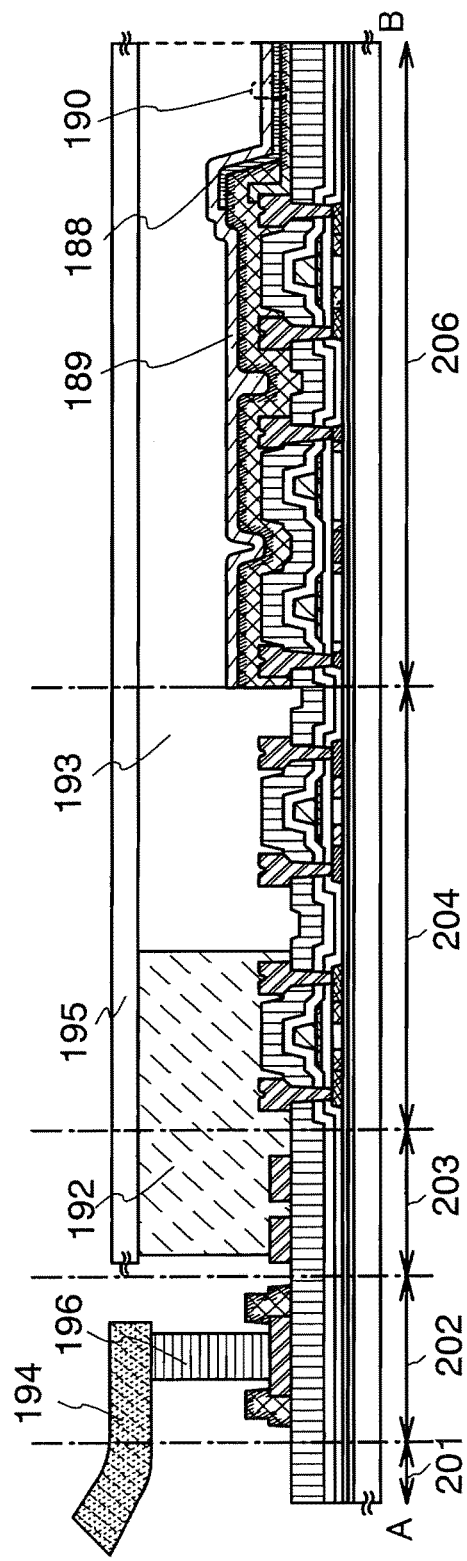
FIG. 9 is a view explaining a display device of the present invention.

In this embodiment mode, the insulating layer 609 and the first electrode layer 607 are subjected to plasma treatment 615, and an insulating layer 616 and a first electrode layer 617, the surfaces of which are subjected to modification treatment, are formed (see FIG. 1B). In this embodiment mode, a silicon oxynitride film is used as the insulating layer 609 and ITSO is used as the first electrode layer 607, which are subjected to plasma treatment under a nitrogen atmosphere. According to this modification treatment, the surfaces of the insulating layer 609 and the first electrode layer 607 are nitrided to be much denser. In FIG. 1B, a diagonal line is hatched at a place where the insulating layer 616 and the first electrode layer 617 are subjected to the modification treatment, so that it becomes apparent that the treatment is performed. However, not being limited to the hatching region, the modification treatment region is changed depending on a condition of the plasma treatment, or the materials or film thicknesses of the insulating layer 609 and the first electrode layer 607, which can be appropriately controlled by selecting the condition.

In this embodiment mode, after forming the silicon oxynitride film, the insulating layer 609 is etched by a parallel plate RIE apparatus. The etching condition of this embodiment mode is as follows: a bias power of 3000 W, a pressure of 27.0 Pa, an etching gas of $CF_4$ (a flow rate of 700 sccm) and $O_2$ (a flow rate of 110 sccm), and an etching time of 210 seconds.

In addition, even after a substrate, an insulating layer, a semiconductor layer, a gate insulating layer, an interlayer insulating layer, other display device, an insulating layer a conductive layer, or the like of a display device, is formed, a surface of the substrate, the insulating layer, the semiconductor layer, the gate insulating layer, or the interlayer insulating layer may be oxidized or nitrided by performing oxidation or nitriding with plasma treatment. When a semiconductor layer or an insulating layer is oxidized or nitrided by using plasma treatment, a surface of the semiconductor layer or the insulating layer is modified, and a semiconductor layer or an insulating layer which is much denser can be obtained, compared with that formed by a CVD method or a sputtering method. Thus, characteristics or the like of the display device can be improved, suppressing a defect such as a pinhole. Alternatively, a conductive layer such as a gate electrode layer, a source wiring layer, or a drain wiring layer can also be subjected to the plasma treatment as described above, and a surface thereof can be nitrided or oxidized by being subjected to nitriding treatment or oxidation treatment.

Over the insulating layer 616 and the first electrode layer 617 subjected to the modification treatment by the plasma treatment 615, an electroluminescent layer 611 and a second electrode layer 612 are formed, and a protective film 613 is formed. Thus, a light-emitting element 614 that is electrically connected to the thin film transistor 605 is formed over the substrate 600 (see FIG. 1C).

By applying the present invention, a highly reliable display device can be manufactured. Thus, a high resolution and high performance display device can be manufactured with high yields.

Embodiment Mode 2

A manufacturing method of a display device in this embodiment mode will be explained in detail with reference to FIGS. 27A to 27C. This embodiment mode shows an example in which a structure of an insulating layer to be a partition is different from the one in Embodiment Mode 1. Thus, repeated explanations of the same portions or portions having the same function will be omitted.

Figure 27A:
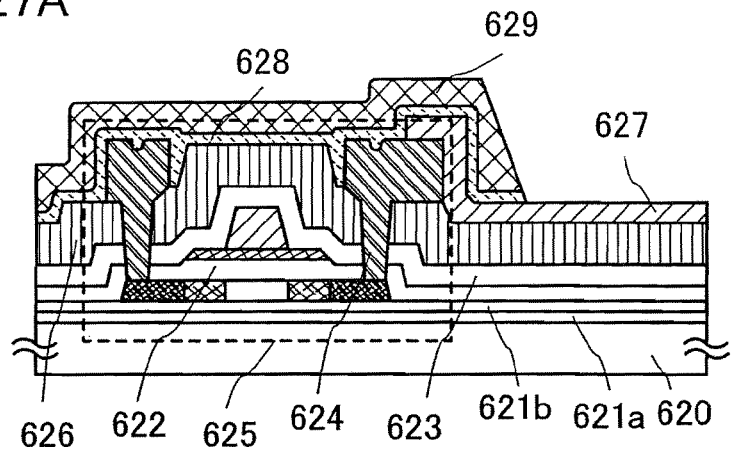
FIGS. 27A to 27C are views each explaining a manufacturing method of a display device of the present invention.

Over a substrate 620, a base film 621a, a base film 621b, a thin film transistor 625, a gate insulating layer 622, insulating layers 623 and 626, a first electrode layer 627, a first insulating layer 628 and a second insulating layer 629 each serving as a partition (also referred to as a barrier or the like) are formed (see FIG. 27A). The thin film transistor 625 includes a semiconductor layer having impurity regions each serving as source and drain regions, the gate insulating layer 622, gate electrode layers in a two-layer stacked structure, and source and drain electrode layers 624. The source or drain electrode layer is electrically connected to the impurity region of the semiconductor layer and the first electrode layer 627 by being in contact therewith.

In this embodiment mode, where an insulating layer serving as a partition has a stacked structure of the first insulating layer and the second insulating layer, an inorganic insulating material is used for the first insulating layer 628 and the second insulating layer 629 which are provided in contact with a light-emitting element. An inorganic insulating material can form a dense film; therefore, contaminant such as moisture is not transmitted. Thus, a light-emitting element can be prevented from being deteriorated due to contaminant penetrated from outside of a display device.

As the first insulating layer 628 and the second insulating layer 629, silicon oxide, silicon nitride, silicon oxynitride, silicon nitride oxide, or the like can be used. In addition, as another material of the first insulating layer 628 and the second insulating layer 629, a material of aluminum nitride, aluminum oxynitride in which the content of oxygen is higher than that of nitrogen, aluminum nitride oxide or aluminum oxide in which the content of nitrogen is higher than that of oxygen, diamond like carbon (DLC), nitrogen-containing carbon, polysilazane, and other substances containing an inorganic insulating material can be used. A material containing siloxane may also be used.

The first insulating layer 628 and the second insulating layer 629 can be formed by a sputtering method, a PVD (Physical Vapor Deposition) method, a low pressure CVD method (LPCVD method), or a CVD (Chemical Vapor Deposition) method such as a plasma CVD method. Alternatively, a droplet discharging method by which a pattern can be selectively formed, a printing method by which a pattern can be transferred or described (a method, such as a screen printing method or an offset printing method, by which a pattern can be formed), or other methods such as a coating method such as a spin coating method, a dipping method, a dispenser method, or the like can also be used.

An etching process for processing into a desired shape may employ either plasma etching (dry etching) or wet etching. In a case of processing a large area substrate, plasma etching is suitable. As an etching gas, a fluorine based gas such as $CF_4$ or $NF_3$ or a chlorine based gas such as $Cl_2$ or $BCl_3$ is used, to which an inert gas such as He or Ar may be appropriately added. When an etching process by atmospheric pressure discharge is employed, local electric discharge can also be realized, which does not require a mask layer to be formed over the entire surface of the substrate.

The first insulating layer 628 and the second insulating layer 629 cover an end portion of the first electrode layer 627, and an edge portion thereof has a tapered shape. In this embodiment mode, the first insulating layer 628 and the second insulating layer 629 are formed by stacking a first insulating film and a second insulating film, which are formed by being processed into desired shapes by being etched with a mask. A top surface of the first insulating layer 628 and a bottom surface of the second insulating layer 629 are coextensive, and edge portions of the first insulating layer 628 and the second insulating layer 629 are continuously formed. In this embodiment mode, the first insulating layer 628 and the second insulating layer 629 have the same taper angle; however, the taper angles may be different. The taper angles in the edge portions of the first insulating layer 628 and the second insulating layer 629 are preferably larger than 30 degrees (much preferably, 40 degrees or more) and 70 degrees or less (much preferably, 60 degrees or less). In addition, formed using a CVD method or a sputtering method, the first insulating layer 628 and the second insulating layer 629 are formed by reflecting a depression and projection shape in a face to be formed because the first insulating layer 628 and the second insulating layer 629 are formed of an inorganic insulating material. In this case, since a film thickness thereof is not planarized, the face to be formed can be covered with a uniform film thickness; thus, the film thickness can be comparatively thinned. In this embodiment mode, the film thicknesses of the first insulating layer 628 and the second insulating layer 629 are to be 1 μm or less, preferably 500 nm or less, respectively.

A shape of an insulating layer serving as a partition that includes the first insulating layer 628 and the second insulating layer 629 can be controlled by appropriately setting an etching condition. However, in the case of stacking the insulating layers formed of different materials as in this embodiment mode, the shape can also be controlled by a selective ratio during the etching of the materials. Thus, in consideration of the selective ratio during the etching of the materials used for the first insulating layer 628 and the second insulating layer 629, the tapered shapes in the edge portions can also be freely controlled by using the materials.

As the first electrode layer 627, indium oxide containing tungsten oxide, indium zinc oxide containing tungsten oxide, indium oxide containing titanium oxide, indium tin oxide containing titanium oxide, or the like can be used. Needless to say, indium tin oxide (ITO), indium zinc oxide (IZO), indium tin oxide added with silicon oxide (ITSO), or the like can also be used.

In addition, as a metal thin film that can be used for the first electrode layer 627, a conductive film formed of titanium, tungsten, nickel, gold, platinum, silver, aluminum, magnesium, calcium, lithium, and an alloy thereof; or the like can be used.

The first electrode layer 627 can be formed by an evaporation method, a sputtering method, a CVD method, a printing method, a dispenser method, a droplet discharging method, or the like.

In the present invention, the insulating layers each to be a partition and the first electrode layer are subjected to plasma treatment. By performing plasma treatment under a nitrogen atmosphere or an oxygen atmosphere, a nitrogen plasma treatment layer or an oxygen plasma treatment layer can be formed by subjecting surfaces and vicinities of the insulating layers and the first electrode layer to nitriding treatment or oxygen treatment. When the insulating layers and the first electrode layer are subjected to oxidation treatment or nitriding treatment (or both oxidation treatment and nitriding treatment may be performed) by using plasma treatment, surfaces of the insulating layers and the first electrode layer are modified, and insulating layers and a first electrode layer which are much denser can be obtained. Thus, characteristics or the like of the display device can be improved by suppressing a defect such as a pinhole.

In the case where a film is oxidized by plasma treatment, the plasma treatment is performed under an oxygen atmosphere (for example, an atmosphere of oxygen ($O_2$) and a rare gas (including at least one of He, Ne, Ar, Kr, and Xe), an atmosphere of oxygen, hydrogen ($H_2$), and a rare gas, or an atmosphere of dinitrogen monoxide and a rare gas). On the other hand, in the case where a film is nitrided by plasma treatment, the plasma treatment is performed under a nitrogen atmosphere (for example, an atmosphere of nitrogen ($N_2$) and a rare gas (including at least one of He, Ne, Ar, Kr, and Xe), an atmosphere of nitrogen, hydrogen, and a rare gas, or an atmosphere of $NH_3$ and a rare gas). Ar can be used as a rare gas, for example. Alternatively, a gas in which Ar and Kr are mixed may also be used. Therefore, the insulating film formed by plasma treatment includes the rare gas (including at least one of He, Ne, Ar, Kr, and Xe) used for the plasma treatment, and the insulating film includes Ar in the case where Ar is used.

The plasma treatment is performed in the above gas atmosphere with an electron density of $1\times10^{11}$ cm$^{-3}$ or more and a plasma electron temperature of 1.5 eV or less. More specifically, the plasma treatment is performed with an electron density of $1\times10^{11}$ cm$^{-3}$ to $1\times10^{13}$ cm$^{-3}$, and a plasma electron temperature of 0.5 eV to 1.5 eV. Since the plasma electron density is high and the electron temperature around an object (here, the first insulating layer 628, the second insulating layer 629, and the first electrode layer 627) formed over a substrate is low, damage due to plasma on the object can be prevented. In addition, since the plasma electron density is as high as $1\times10^{11}$ cm$^{-3}$ or more, an oxide film or a nitride film formed by oxidizing or nitriding the object by using the plasma treatment has better uniformity of the thickness and the like and is denser, compared with that of a film formed by a CVD method, a sputtering method, or the like. Moreover, since the plasma electron temperature is as low as 1.5 eV or less, oxidation treatment or nitriding treatment can be performed at lower temperature than a conventional plasma treatment or a thermal oxidation method. For example, even when plasma treatment is performed at a temperature lower than distortion point of a glass substrate by 100° C. or more, the oxidation treatment or the nitriding treatment can be performed sufficiently. As for frequency for generating plasma, a high frequency wave such as a microwave (2.45 GHz) can be used. Note that the above conditions are used for plasma treatment, if not otherwise specified hereinafter.

However, in performing plasma treatment in the present invention, the plasma treatment is performed under such a condition that an adverse effect is not caused on electric characteristics of a thin film transistor that is formed below the insulating layers each to be a partition and the first electrode layer of the object.

Figure 27B:
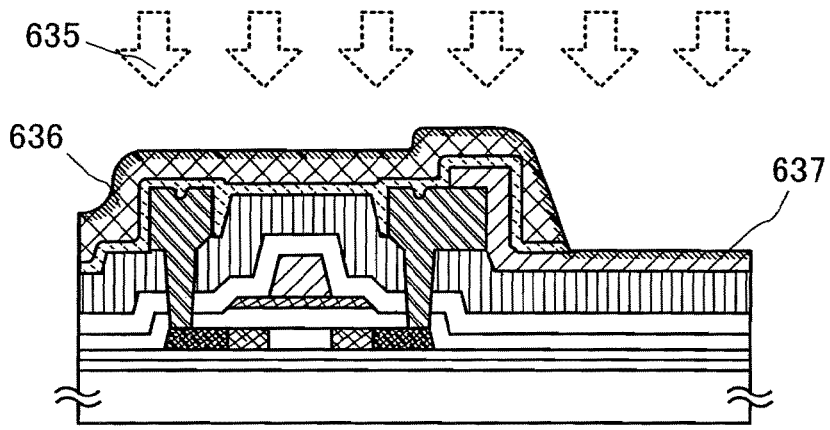
Figure 27C:
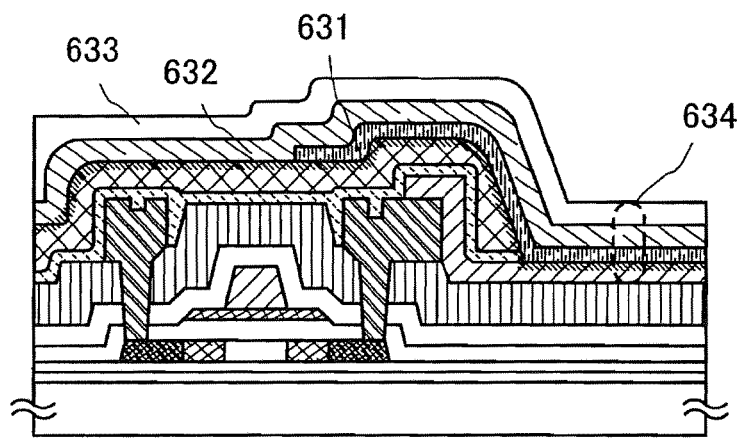

In this embodiment mode, the first insulating layer 628, the second insulating layer 629, and the first electrode layer 627 are subjected to plasma treatment 635, and a second insulating layer 636 and a first electrode layer 637, the surfaces of which are subjected to modification treatment, are formed (see FIG. 27B). In this embodiment mode, a silicon nitride film is used as the first insulating layer 628, a silicon nitride oxide film is used as the second insulating layer 629, and ITSO is used as the first electrode layer 627, which are subjected to plasma treatment under a nitrogen atmosphere. According to this modification treatment, the surfaces of the first insulating layer 628, the second insulating layer 629, and the first electrode layer 627 are nitrided to be much denser. In FIG. 27B, a diagonal line is hatched at a place where the second insulating layer 636 and the first electrode layer 637 are subjected to the modification treatment, so that it becomes apparent that the treatment is performed. However, not being limited to the hatching region, the modification treatment region is changed depending on a condition of the plasma treatment, or the materials or film thicknesses of the first insulating layer 628, the second insulating layer 629, and the first electrode layer 627, which can be appropriately controlled by selecting the condition.

In this embodiment mode, a silicon nitride film as the first insulating layer and a silicon nitride oxide layer as the second insulating layer are formed by being stacked, and a desired shape is processed by etching with a mask. The etching of this embodiment mode is performed by a parallel plate RIE apparatus, and the etching condition is as follows: an RF power of 400 W, a pressure of 39 Pa, and an etching gas of CF$_4$ (a flow rate of 50 sccm), O$_2$ (a flow rate of 35 sccm), and He (a flow rate of 50 sccm).

In this embodiment mode, an end portion of the second insulating layer 629 has rapid steps by etching process. According to the plasma treatment 635, the rapid steps on the end portion of the second insulating layer 629 can have a smooth end portion (such a rounded shape) having a curvature like the second insulating layer 636. By smoothing the end portion of the second insulating layer, coverage of an electroluminescent layer and a second electrode layer that are stacked can be improved. Thus, not only the surfaces are densified but also the shape is formed according to modification by plasma treatment.

In addition, even after a substrate, an insulating layer, a semiconductor layer, a gate insulating layer, an interlayer insulating layer, other display device, an insulating layer of a display device, a conductive layer, or the like is formed, a surface of the substrate, the insulating layer, the semiconductor layer, the gate insulating layer, or the interlayer insulating layer may be oxidized or nitrided by performing oxidation or nitriding with plasma treatment. When a semiconductor layer or an insulating layer is oxidized or nitrided by using plasma treatment, a surface of the semiconductor layer or the insulating layer is modified, and a semiconductor layer or an insulating layer which is much denser can be obtained, compared with that formed by a CVD method or a sputtering method. Thus, characteristics or the like of the display device can be improved, suppressing a defect such as a pinhole. Alternatively, a conductive layer such as a gate electrode layer, a source wiring layer, or a drain wiring layer can also be subjected to the plasma treatment as described above, and a surface thereof can be nitrided or oxidized by being subjected to nitriding treatment or oxidation treatment.

Over the second insulating layer 636 and the first electrode layer 637 that are subjected to the modification treatment and formed into a shape by the plasma treatment 635, an electroluminescent layer 631 and a second electrode layer 632 are formed, and a protective film 633 is formed. Thus, a light-emitting element 634 that is electrically connected to the thin film transistor 625 is formed over the substrate 620 (see FIG. 27C).

By applying the present invention, a highly reliable display device can be manufactured. Thus, a high resolution and high performance display device can be manufactured with high yields.

Embodiment Mode 3

A manufacturing method of a display device in this embodiment mode will be explained in detail with reference to FIGS. 2A to 2D, FIGS. 3A to 3C, FIGS. 4A to 4C, FIGS. 5A to 5C, FIGS. 6A to 6C, FIGS. 7A and 7B, FIGS. 8A to 8C, FIG. 9, FIG. 10, FIGS. 16A to 16C, and FIGS. 17A and 17B.

Figure 16A:
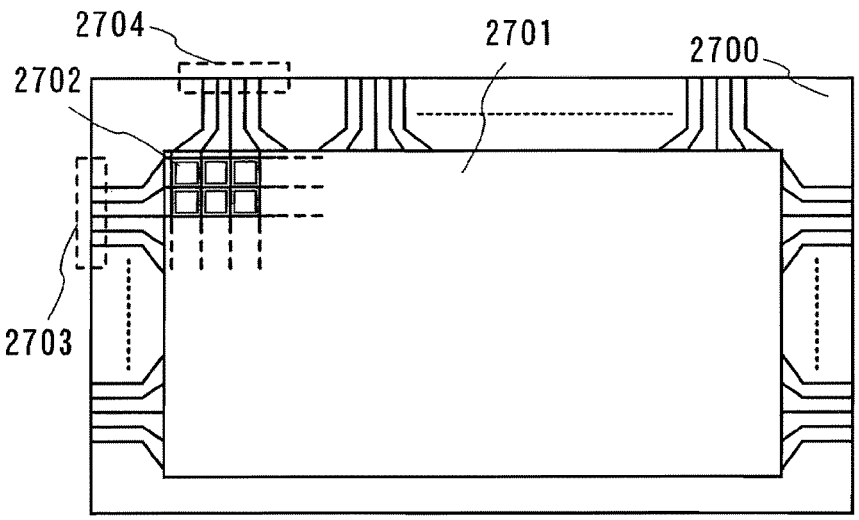
FIGS. 16A to 16C are each a top view of a display device of the present invention.

FIG. 16A is a top view showing a structure of a display panel according to the present invention, which includes a pixel portion 2701 in which pixels 2702 are arranged in matrix, a scanning line input terminal 2703, and a signal line input terminal 2704 over a substrate 2700 having an insulating surface. The number of pixels may be set depending on various standards, for example, 1024×768×3 (RGB) in a case of a full color display using RGB which is XGA, 1600×1200×3 (RGB) in a case of a full color display using RGB which is UXGA, and 1920×1080×3 (RGB) in a case of a full color display using RGB with the use for a full spec high vision display.

The pixels 2702 are arranged in matrix by intersecting a scanning line extending from the scanning line input terminal 2703 and a signal line extending from the signal line input terminal 2704. Each of the pixels 2702 is provided with a switching element and a pixel electrode layer connected thereto. A typical example of the switching element is a TFT. A gate electrode layer side of the TFT is connected to the scanning line, and a source or drain side of the TFT is connected to the signal line; thus, each pixel can be controlled independently by a signal inputted from the outside.

Figure 17A:
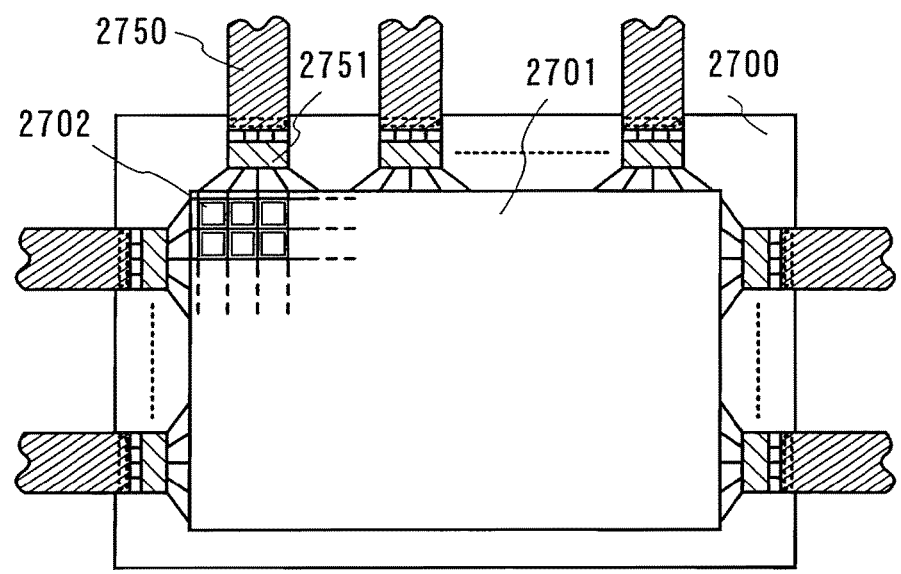
FIGS. 17A and 17B are each a top view of a display device of the present invention.
Figure 17B:
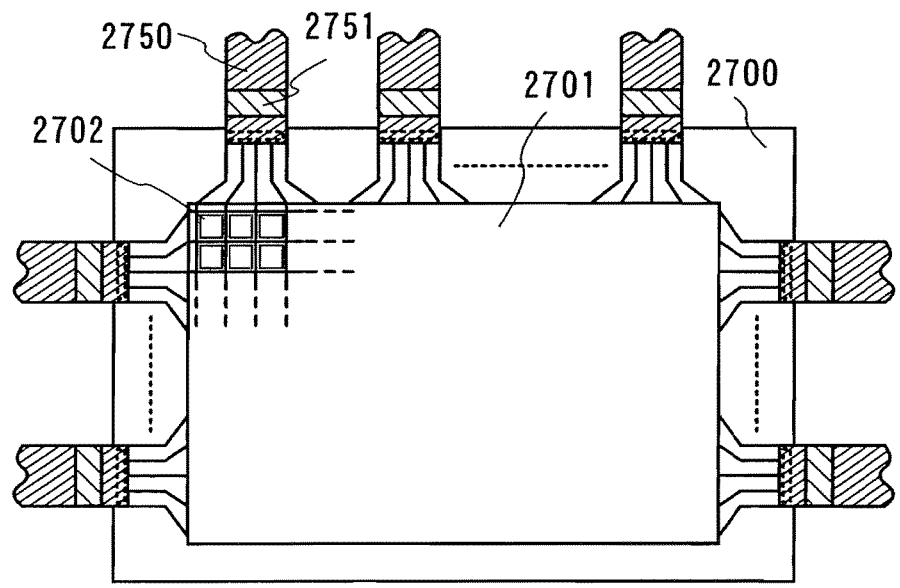

FIG. 16A shows a structure of a display panel in which a signal to be inputted to the scanning line and the signal line is controlled by an external driver circuit; however, a driver IC 2751 may also be mounted on the substrate 2700 by a COG (Chip On Glass) method as shown in FIG. 17A. Further, as another mode, a TAB (Tape Automated Bonding) method as shown in FIG. 17B may also be employed. A driver IC may be formed on a single crystal semiconductor substrate or a glass substrate by using a TFT. In FIGS. 17A and 17B, the driver IC 2751 is connected to an FPC (Flexible Printed Circuit) 2750.

Figure 16B:
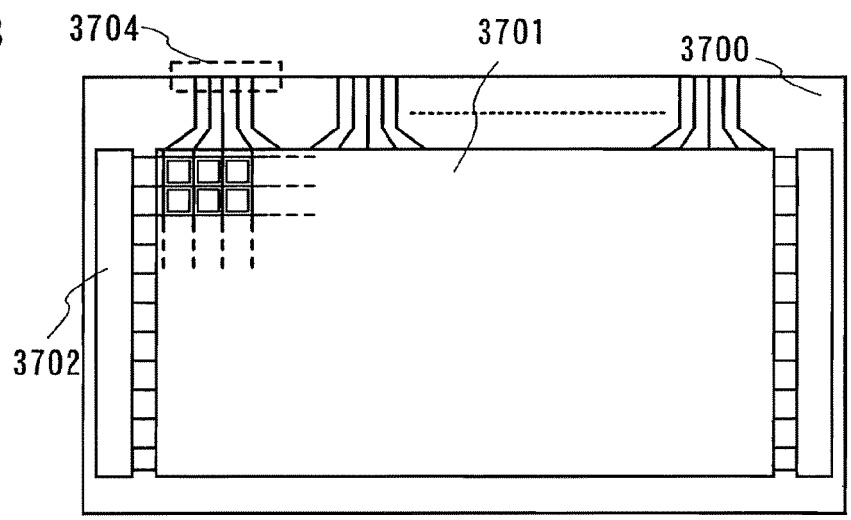
Figure 16C:
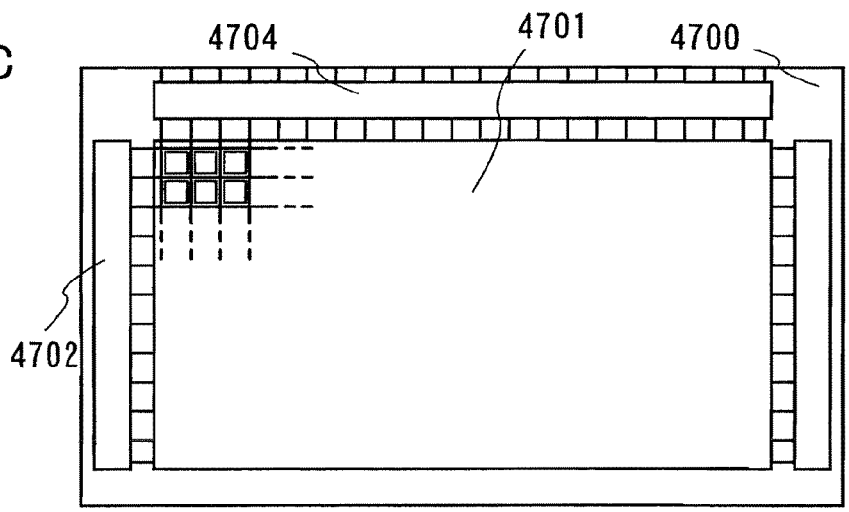

In addition, in a case of forming a TFT provided in a pixel by using a crystalline semiconductor, a scanning line driver circuit 3702 may be formed over a substrate 3700 as shown in FIG. 16B. In FIG. 16B, a pixel portion 3701 is controlled by an external driver circuit, to which a signal line input terminal 3704 is connected, similarly to FIG. 16A. In a case of forming a TFT provided in a pixel by using a polycrystalline (microcrystalline) semiconductor, a single crystal semiconductor, or the like with high mobility, a pixel portion 4701, a scanning line driver circuit 4702, and a signal line driver circuit 4704 can be formed to be integrated over a substrate 4700 as shown in FIG. 16C.

As shown in FIG. 2A, over a substrate 100 having an insulating surface, as a base film, a base film 101a is formed by using a silicon nitride oxide film to be 10 to 200 nm thick (preferably, 50 to 150 nm thick) and a base film 101b is stacked thereover by using a silicon oxynitride film to be 50 to 200 nm thick (preferably, 100 to 150 nm thick) by a sputtering method, a PVD method (Physical Vapor Deposition) method, a CVD (Chemical Vapor Deposition) method such as a low pressure CVD method (LPCVD method) or a plasma CVD method, or the like. Alternatively, acrylic acid, methacrylic acid, or a derivative thereof, a heat-resistant high-molecular material such as polyimide, aromatic polyamide, or polybenzimidazole, or a siloxane resin may be used. Note that siloxane resin corresponds to a resin including the Si—O—Si bond. Siloxane is composed of a skeleton structure formed by the bond of silicon (Si) and oxygen (O). As a substituent, an organic group containing at least hydrogen (such as an alkyl group or aromatic hydrocarbon) is used. Alternatively, a fluoro group may be used as the substituent. Further alternatively, a fluoro group and an organic group containing at least hydrogen may be used as the substituent. Moreover, the following resin material may also be used: a vinyl resin such as poly(vinyl alcohol) or poly(vinyl butyral), an epoxy resin, a phenol resin, a novolac resin, an acrylic resin, a melamine resin, an urethane resin, or the like. Further, an organic material such as benzocyclobutene, parylene, fluorinated arylene ether, or polyimide; a composite material containing a water-soluble homopolymer and a water-soluble copolymer; or the like may be used. Furthermore, an oxazole resin can also be used, for example, a photosensitive polybenzoxazole or the like can be used. A photosensitive polybenzoxazole has a low dielectric constant (a dielectric constant of 2.9 at 1 MHz and a normal temperature), high heat resistance (TGA: Thermal Gravity Analysis, thermal decomposition temperature of 550° C. with the rise in temperature at 5° C./min), and a low moisture absorbing rate (0.3% in 24 hours at a normal temperature).

As a method, a droplet discharging method, a printing method (a method for forming a pattern, such as screen printing or offset printing), a coating method such as a spin coating method, a dipping method, a dispenser method, or the like can also be used. In this embodiment mode, the base film 101a and the base film 101b are formed by a plasma CVD method. The substrate 100 may be a glass substrate, a quartz substrate, a silicon substrate, a metal substrate, or a stainless steel substrate having a surface covered with an insulating film. In addition, a plastic substrate having heat resistance, which can resist a processing temperature of this embodiment mode, or a flexible substrate such as a film may also be used. As a plastic substrate, a substrate formed of PET (polyethylene terephthalate), PEN (polyethylene naphthalate), or PES (polyether sulfone) may be used, and as a flexible substrate, a synthetic resin such as acrylic can be used. Since a display device manufactured in this embodiment mode has a structure where light from a light-emitting element is extracted through the substrate 100, the substrate 100 is required to have a light-transmitting property.

As the base film, silicon oxide, silicon nitride, silicon oxynitride, silicon nitride oxide, or the like can be used in a single layer structure or a stacked structure of two or three layers. In this embodiment mode, over the substrate, a silicon nitride oxide film is formed to be 50 nm thick using $SiH_4$, $NH_3$, $N_2O$, $N_2$, and $H_2$ as a reaction gas, and a silicon oxynitride film is formed to be 100 nm thick using $SiH_4$ and $N_2O$ as a reaction gas. In addition, the silicon nitride oxide film may be formed to be 140 nm thick and the silicon oxynitride film to be stacked may be formed to be 100 nm thick.

Next, a semiconductor film is formed over the base film. The semiconductor film may be formed by various means (such as a sputtering method, an LPCVD method, and a plasma CVD method) to be 25 to 200 nm thick (preferably, 30 to 150 nm thick). In this embodiment mode, it is preferable to use a crystalline semiconductor film formed by crystallizing an amorphous semiconductor film by laser irradiation.

A material for forming the semiconductor film can be an amorphous semiconductor (hereinafter also referred to as "AS") formed by an evaporation method or a sputtering method by using a semiconductor material gas typified by silane or germane, a polycrystalline semiconductor formed by crystallizing the amorphous semiconductor by using light energy or thermal energy, a semi-amorphous semiconductor (also referred to as microcrystal and hereinafter also referred to as "SAS"), or the like.

An SAS is a semiconductor having an intermediate structure between amorphous and crystalline (including single crystal and polycrystalline) structures and a third state which is stable in free energy. In addition, an SAS includes a crystalline region with a short-distance order and lattice distortion. An SAS is formed by glow discharge decomposition (plasma CVD) of a gas containing silicon. As the gas containing silicon, $SiH_4$ can be used, and in addition, $Si_2H_6$, $SiH_2Cl_2$, $SiHCl_3$, $SiCl_4$, $SiF_4$, or the like can also be used. In addition, $F_2$ and $GeF_4$ may be mixed. The gas containing silicon may be diluted with $H_2$, or $H_2$ and one or more kinds of rare gas elements of He, Ar, Kr, and Ne. Moreover, when a rare gas element such as helium, argon, krypton, or neon is contained to further increase the lattice distortion, stability can be enhanced, and a favorable SAS can be obtained. Further, as the semiconductor film, an SAS layer formed by using a hydrogen-based gas may be stacked over an SAS layer formed by using a fluorine-based gas.

As an amorphous semiconductor, hydrogenated amorphous silicon may be typically used while polysilicon or the like may be typically used as a crystalline semiconductor. Polysilicon (polycrystalline silicon) includes so-called high temperature polysilicon formed by using polysilicon as a main material, which is formed at a processing temperature of 800° C. or more; so-called low temperature polysilicon formed by using polysilicon as a main material, which is formed at a processing temperature of 600° C. or less; polysilicon crystallized by adding an element which promotes crystallization; and the like. It is needless to say that a semi-amorphous semiconductor or a semiconductor containing a crystal phase in part of a semiconductor film may also be used as described above.

In a case of using a crystalline semiconductor film for the semiconductor film, the crystalline semiconductor film may be formed by various methods (such as a laser crystallization method, a thermal crystallization method, and a thermal crystallization method using an element such as nickel which promotes crystallization). In addition, a microcrystalline semiconductor that is an SAS may be crystallized by laser irradiation to enhance crystallinity. In a case where an element which promotes crystallization is not used, before irradiating the amorphous semiconductor film with laser light, the amorphous semiconductor film is heated for one hour in a nitrogen atmosphere at 500° C. to discharge hydrogen so that a hydrogen concentration in the amorphous semiconductor film becomes $1\times10^{20}$ atoms/cm$^3$ or less. This is because, if the amorphous semiconductor film contains much hydrogen, the amorphous semiconductor film may be broken by laser light irradiation. Heat treatment for crystallization may be performed by using a heating furnace, laser irradiation, irradiation of light emitted from a lamp (also referred to as a lamp annealing), or the like. As a heating method, an RTA method such as a GRTA (Gas Rapid Thermal Anneal) method or an LRTA (Lamp Rapid Thermal Anneal) method may be used. The GRTA is heat treatment using a high temperature gas, and the LRTA is heat treatment using lamp light.

Then, in the step of forming a crystalline semiconductor layer by crystallizing an amorphous semiconductor layer, an element (also referred to as a catalyst element or a metal element) which promotes crystallization may be added to the amorphous semiconductor layer and crystallization may be performed by heat treatment (3 minutes to 24 hours at temperatures of 550 to 750° C.). One or more kinds of iron (Fe), nickel (Ni), cobalt (Co), ruthenium (Ru), rhodium (Rh), palladium (Pd), osmium (Os), iridium (Ir), platinum (Pt), copper (Cu), and gold (Au) can be used as a metal element which promotes crystallization of silicon.

A method for introducing a metal element into the amorphous semiconductor film is not particularly limited as long as it is a method for introducing the metal element over a surface of or inside the amorphous semiconductor film. For example, a sputtering method, a CVD method, a plasma treatment method (including a plasma CVD method), an adsorption method, or a method of coating a solution of metal salt can be used. Among them, a method of using a solution is simple and advantageous in that the concentration of the metal element can be easily controlled. At this time, it is desirable to form an oxide film by UV light irradiation in an oxygen atmosphere, a thermal oxidation method, treatment with ozone water containing hydroxyl radical or hydrogen peroxide, or the like to improve wettability of the surface of the amorphous semiconductor film so as to diffuse an aqueous solution over the entire surface of the amorphous semiconductor film.

In order to remove or reduce the element which promotes crystallization from the crystalline semiconductor layer, a semiconductor layer containing an impurity element is formed in contact with the crystalline semiconductor layer and used as a gettering sink. The impurity element may be an impurity element imparting n-type conductivity, an impurity element imparting p-type conductivity, a rare gas element, or the like. For example, one or more kinds of elements of phosphorus (P), nitrogen (N), arsenic (As), antimony (Sb), bismuth (Bi), boron (B), helium (He), neon (Ne), argon (Ar), krypton (Kr), and xenon (Xe) can be used. A semiconductor layer containing a rare gas element is formed in a crystalline semiconductor layer containing an element which promotes crystallization, and thermal treatment is performed (3 minutes to 24 hours at 550 to 750° C.). The element which promotes crystallization contained in the crystalline semiconductor layer moves into the semiconductor layer containing a rare gas element. The element which promotes crystallization contained in the crystalline semiconductor layer is removed or reduced. Thereafter, the semiconductor layer containing a rare gas element which is a gettering sink is removed.

By scanning a laser and the semiconductor film relatively, laser irradiation can be performed. In addition, in the laser irradiation, a marker can also be formed to overlap beams with high precision and control positions for starting and finishing laser irradiation. The marker may be formed over the substrate at the same time when an amorphous semiconductor film is formed.

In the case of laser irradiation, a continuous wave laser beam (CW laser beam) or a pulsed wave laser beam (pulsed laser beam) can be used. As the laser beam that can be used here, a laser beam oscillated from one or more of a gas laser such as an Ar laser, a Kr laser, and an excimer laser; a single crystal of a YAG laser, a YVO$_4$ laser, forsterite (Mg$_2$SiO$_4$), a YAlO$_3$ laser, and a GdVO$_4$ laser or a polycrystal (ceramic) of YAG, Y$_2$O$_3$, YVO$_4$, YAlO$_3$, and GdVO$_4$ doped with one or more kinds of Nd, Yb, Cr, Ti, Ho, Er, Tm, and Ta as a dopant; a glass laser; a ruby laser; an alexandrite laser; a Ti: sapphire laser; a copper vapor laser; and a gold vapor laser can be used. By emitting a laser beam of second to fourth wave of a fundamental wave in addition to a fundamental harmonic of the above laser beams, a crystal having a large grain size can be obtained. For example, a second harmonic (532 nm) or a third harmonic (355 nm) of Nd:YVO$_4$ laser (fundamental, 1064 nm) can be used. This laser can be emitted by CW or pulsed oscillation. In the case of CW, the laser requires power density of approximately from 0.01 to 100 MW/cm$^2$ (preferably, approximately from 0.1 to 10 MW/cm$^2$). The laser is emitted at a scanning rate of approximately 10 to 2000 cm/sec.

Note that, a laser using, as a medium, single crystal of YAG, YVO$_4$, forsterite (Mg$_2$SiO$_4$), YAlO$_3$, or GdVO$_4$ or polycrystal (ceramic) of YAG, Y$_2$O$_3$, YVO$_4$, YAlO$_3$, or GdVO$_4$ doped with one or more kinds of Nd, Yb, Cr, Ti, Ho, Er, Tm, and Ta as a dopant; an Ar ion laser; or a Ti:sapphire laser can be continuously oscillated. Further, pulse oscillation thereof can be performed with an oscillation frequency of 10 MHz or more by performing Q switch operation, mode synchronization, or the like. When a laser beam is oscillated with a repetition rate of 10 MHz or more, a semiconductor film is irradiated with a next pulse during the semiconductor film is melted by the laser beam and then is solidified. Thus, differing from a case of using a pulse laser with a low repetition rate, a solid-liquid interface can be continuously moved in the semiconductor film so that crystal grains, which continuously grow toward a scanning direction, can be obtained.

When ceramic (polycrystal) is used as a medium, the medium can be formed to have a free shape for short time at low cost. In a case of using a single crystal, a columnar medium with several mm in diameter and several tens of mm in length is usually used. However, in the case of using the ceramic, a medium bigger than the case of using the single crystal can be formed.

A concentration of a dopant such as Nd or Yb in a medium, which directly contributes to light emission, cannot be changed largely in both cases of the single crystal and the polycrystal; therefore, there is a limit in improvement in output of a laser by increasing the concentration to some extent. However, in the case of the ceramic, the size of a medium can be significantly increased as compared with the case of the single crystal; therefore, drastic improvement in output of a laser can be expected.

Further, in the case of the ceramic, a medium having a shape of a parallelepiped or a rectangular parallelepiped can be formed easily. In a case of using a medium having such a shape, when oscillated light is made travel in zigzag inside of the medium, a long path of the oscillated light can be obtained. Therefore, amplitude is increased and a laser beam can be oscillated at high output. Moreover, a cross-sectional shape of a laser beam emitted from a medium having such a shape is a quadrangular shape; therefore, as compared with a laser beam with a circular shape, the laser beam with the quadrangular shape in cross section have an advantage to be shaped into a linear beam. By shaping a laser beam emitted in the above manner using an optical system, a linear beam with 1 mm or less in length of a short side and several mm to several m in length of a long side can be easily obtained. Further, when a medium is uniformly irradiated with excited light, a linear beam is emitted with a uniform energy distribution in a long side direction. Furthermore, it is preferable that a semiconductor film be irradiated with laser at an incident angle θ (0<θ<90°; therefore, an interference of the laser can be prevented.

By irradiating the semiconductor film with this linear beam, the entire surface of the semiconductor film can be far uniformly annealed. When the linear beam is required to be uniform to the opposite ends, slits are provided at the opposite ends to shield light of energy attenuation portions or other measures are required to be taken.

The semiconductor film obtained in this manner is annealed with the linear beam having uniform intensity, and a display device is manufactured by using the semiconductor film. Then, the characteristic of the display device can be favorable and uniform.

The semiconductor film may be irradiated with laser light in an inert gas atmosphere such as a rare gas or nitrogen as well. Accordingly, roughness of the surface of the semiconductor film can be prevented by laser irradiation, and variation of a threshold voltage due to variation of interface state density can be prevented.

An amorphous semiconductor film may be crystallized by a combination of heat treatment and laser light irradiation, or one of heat treatment and laser light irradiation may be performed plural times.

In this embodiment mode, a crystalline semiconductor film is formed by forming an amorphous semiconductor film over the base film 101*b* and crystallizing the amorphous semiconductor film. As the amorphous semiconductor film, amorphous silicon formed by using a reaction gas of $SiH_4$ and $H_2$ is used. In this embodiment mode, the base film 101*a* and the base film 101*b*, and the amorphous semiconductor film are continuously formed by changing a reaction gas without breaking vacuum in the same chamber at the same temperature of 330° C.

After removing an oxide film formed over the amorphous semiconductor film, an oxide film is formed to be 1 to 5 nm thick by UV light irradiation in an oxygen atmosphere, a thermal oxidization method, treatment with ozone water containing hydroxyl radical or hydrogen peroxide solution, or the like. In this embodiment mode, Ni is used as an element which promotes crystallization. An aqueous solution containing 10 ppm of nickel acetate is coated by a spin coating method.

In this embodiment mode, after performing heat treatment by an RTA method at 750° C. for three minutes, the oxide film formed over the semiconductor film is removed and laser irradiation is performed. The amorphous semiconductor film is crystallized by the above crystallization treatment to form the crystalline semiconductor film.

In a case of performing crystallization by using a metal element, a gettering step is performed to reduce or remove the metal element. In this embodiment mode, the metal element is captured by using an amorphous semiconductor film as a gettering sink. First, an oxide film is formed over the crystalline semiconductor film by UV light irradiation in an oxygen atmosphere, a thermal oxidation method, treatment with ozone water containing hydroxyl radical or hydrogen peroxide, or the like. The oxide film is desirably made thick by heat treatment. Next, an amorphous semiconductor film is formed to be 50 nm thick by a plasma CVD method (with a condition of this embodiment mode as 350 W, 35 Pa, deposition gas: $SiH_4$ (a flow rate of 5 sccm) and Ar (a flow rate of 1000 sccm)).

Thereafter, heat treatment is performed at 744° C. for three minutes by an RTA method to reduce or remove the metal element. Heat treatment may also be performed in a nitrogen atmosphere. Then, the amorphous semiconductor film as a gettering sink and an oxide film formed over the amorphous semiconductor film are removed by hydrofluoric acid or the like, thereby obtaining a crystalline semiconductor film 102 in which the metal element is reduced or removed (see FIG. 2A). In this embodiment mode, the amorphous semiconductor film as a gettering sink is removed by using TMAH (Tetramethyl Ammonium Hydroxide).

The semiconductor film obtained as described above may be doped with a slight amount of impurity elements (boron or phosphorus) for controlling a threshold voltage of a thin film transistor. This doping of impurity elements may be performed to the amorphous semiconductor film before the crystallization step. When the amorphous semiconductor film is doped with impurity elements, the impurities can also be activated by subsequent heat treatment for crystallization. In addition, a defect or the like caused in doping can be improved as well.

Next, the crystalline semiconductor film 102 is processed into a desired shape. In this embodiment mode, after removing the oxide film formed over the crystalline semiconductor film 102, an oxide film is newly formed. Then, the oxide film is etched into a desired shape; therefore, semiconductor layers 103, 104, 105, and 106 are formed.

An etching process may employ either plasma etching (dry etching) or wet etching. In a case of processing a large area substrate, plasma etching is suitable. As an etching gas, a fluorine based gas such as $CF_4$ or $NF_3$ or a chlorine based gas such as $Cl_2$ or $BCl_3$ is used, to which an inert gas such as He or Ar may be appropriately added. When an etching process by atmospheric pressure discharge is employed, local electric discharge can also be realized, which does not require a mask layer to be formed over the entire surface of the substrate.

In the present invention, a conductive layer for forming a wiring layer or an electrode layer, a mask layer for forming a predetermined pattern, or the like may be formed by a method capable of selectively forming a pattern, such as a droplet-discharge method. In the droplet discharging (eject) method (also referred to as an inkjet method according to the system thereof), a droplet of a composition prepared for a specific purpose is selectively discharged (ejected) to form a predetermined pattern (a conductive layer, an insulating layer, or the like). At that time, treatment for controlling wettability or adhesion may be performed in a region to be formed. In addition, a method for transferring or describing a pattern, for example, a printing method (a method for forming a pattern such as screen printing or offset printing), dispenser method or the like can also be used.

In this embodiment mode, a resin material such as an epoxy resin, an acrylic resin, a phenol resin, a novolac resin, a melamine resin, or a urethane resin is used as a mask to be used. In addition, an organic material such as benzocyclobutene, parylene, fluorinated arylene ether, or polyimide having a light transmitting property; a compound material formed by polymerization of siloxane-based polymers or the like; a composition material containing a water-soluble homopolymer and a water-soluble copolymer; or the like can also be used. Alternatively, a commercially available resist material including a photosensitive agent may also be used. For example, it is possible to use a typical positive resist, that is, a novolac resin and a naphthoquinonediazide compound that is a photosensitive agent; or a negative resist, that is, a base resin, diphenylsilanediol, and an acid generating agent. When a droplet discharging method is used, the surface tension and the viscosity of a material are appropriately adjusted by controlling the solvent concentration, adding a surfactant, or the like.

The oxide film over the semiconductor layer is removed, and a gate insulating layer 107 covering the semiconductor layer 103, the semiconductor layer 104, the semiconductor layer 105, and the semiconductor layer 106 is formed. The gate insulating layer 107 is formed of an insulating film containing silicon in a thickness of 10 to 150 nm by a plasma CVD method, a sputtering method, or the like. The gate insulating layer 107 may be formed by using a material such as an oxide material or nitride material of silicon, typified by silicon nitride, silicon oxide, silicon oxynitride, and silicon nitride oxide, and may have a stacked layer structure or a single layer structure. In addition, the insulating layer may be a stacked layer of three layers including a silicon nitride film, a silicon oxide film, and a silicon nitride film; a single layer of a silicon oxynitride film; or a two-layer stacked layer. Further, a thin silicon oxide film may be formed between the semiconductor layer and the gate insulating layer, in a thickness of 1 to 100 nm, preferably 1 to 10 nm, and much preferably 2 to 5 nm. As a method for forming a thin silicon oxide film, the surface of the semiconductor region is oxidized by a GRTA method, an LRTA method, or the like to form a thermal oxide film, thereby forming a silicon oxide film in a thin thickness. Note that a rare gas element such as argon may be contained in a reaction gas and be mixed into an insulating film to be formed in order to form a dense insulating film having little gate leak current at a low film formation temperature. In this embodiment mode, a silicon oxynitride film is formed to be 110 nm thick as the gate insulating layer 107.

In addition, after a substrate, an insulating layer as a base film, a semiconductor layer, a gate insulating layer, an interlayer insulating layer, or the like is formed, a surface of the substrate, the insulating layer as a base film, the semiconductor layer, the gate insulating layer, or the interlayer insulating layer may be oxidized or nitrided by performing oxidation or nitriding with plasma treatment. When a semiconductor layer or an insulating layer is oxidized or nitrided by using plasma treatment, a surface of the semiconductor layer or the insulating layer is modified, and a semiconductor layer or an insulating layer which is much denser can be obtained, compared with that formed by a CVD method or a sputtering method. Thus, characteristics or the like of the display device can be improved, suppressing a defect such as a pinhole. Alternatively, a gate electrode layer, a source electrode layer, a drain electrode layer, a wiring layer or the like can also be subjected to the plasma treatment as described above, and a surface thereof can be nitrided or oxidized by being subjected to nitriding treatment or oxidation treatment. Such plasma treatment may be performed in the same manner as Embodiment Mode 1.

Then, a first conductive film 108 having a thickness of 20 to 100 nm and a second conductive film 109 having a thickness of 100 to 400 nm, each of which serves as a gate electrode layer, are stacked over the gate insulating layer 107 (see FIG. 2B). The first conductive film 108 and the second conductive film 109 can be formed by various methods such as a sputtering method, an evaporation method, a CVD method, and the like. The first conductive film 108 and the second conductive film 109 may be formed of an element of tantalum (Ta), tungsten (W), titanium (Ti), molybdenum (Mo), aluminum (Al), copper (Cu), chromium (Cr), and neodymium (Nd), or an alloy material or compound material having the element as its main component. A semiconductor film typified by a polycrystalline silicon film that is doped with an impurity element such as phosphorus or an AgPdCu alloy may also be used as the first conductive film 108 and the second conductive film 109. The conductive film is not limited to the two-layer structure, and for example, may have a three-layer structure where a tungsten film of 50 nm thick as a first conductive film, an aluminum-silicon alloy (Al—Si) film of 500 nm thick as a second conductive film, and a titanium nitride film of 30 nm thick as a third conductive film are sequentially stacked. In a case of the three-layer structure, tungsten nitride may be used instead of tungsten as the first conductive film; an aluminum-titanium alloy (Al—Ti) film may be used instead of an aluminum-silicon (Al—Si) alloy film as the second conductive film; or a titanium film may be used instead of a titanium nitride film as the third conductive film as well. Moreover, a single-layer structure may also be used. In this embodiment mode, tantalum nitride (TaN) of 30 nm thick is formed as the first conductive film 108 and tungsten (W) of 370 nm thick is formed as the second conductive film 109.

Next, resist masks 110a, 110b, 110d, 110e, and 110f are formed by a photolithography method, and the first conductive film 108 and the second conductive film 109 are processed into a desired shape to form first gate electrode layers 121 122, 124, 125, and 126, and conductive layers 111, 112, 114, 115, and 116 (see FIG. 2C). The first gate electrode layers 121, 122, 124, 125, and 126, and the conductive layers 111, 112, 114, 115, and 116 can be etched to have a desired taper shape by appropriately adjusting an etching condition (the amount of electric power applied to a coil-shaped electrode, the amount of electric power applied to an electrode on a substrate side, an electrode temperature on a substrate side, and the like) by an ICP (Inductively Coupled Plasma) etching method. In addition, an angle and the like of the taper shape can also be controlled by the shapes of the resist masks 110a, 110b, 110d, 110e and 110f. As an etching gas, a chlorine based gas typified by $Cl_2$, $BCl_3$, $SiCl_4$, $CCl_4$, or the like, a fluorine based gas typified by $CF_4$, $SF_6$, $NF_3$, or the like, or $O_2$ can be appropriately used. In this embodiment mode, the second conductive film 109 is etched using an etching gas containing $CF_4$, $Cl_2$, and $O_2$, and then, the first conductive film 108 is continuously etched using an etching gas containing $CF_4$ and $Cl_2$.

Then, the conductive layers 111, 112, 114, 115, and 116 are processed into a desired shape using the resist masks 110a, 110b, 110d, 110e, and 110f. At this time, the conductive layers are etched with an etching condition of high selection ratio of the second conductive film 109 which forms the conductive layers with respect to the first conductive film 108 which forms the first gate electrode layers. By this etching, the conductive layers 111, 112, 114, 115, and 116 are etched to form second gate electrode layers 131, 132, 134, 135, and 136. In this embodiment mode, the second gate electrode layers also have a taper shape, in which a taper angle is larger than that of the first gate electrode layers 121, 122, 124, 125, and 126. Note that the taper angle is an angle of the side surface with respect to the surface of the first gate electrode layer, the second gate electrode layer, and the conductive layer. Thus, when the taper angle is increased to 90°, the conductive layer has a perpendicular side surface. In this embodiment mode, the second gate electrode layers are formed by using an etching gas of $Cl_2$, $SF_6$, and $O_2$.

In this embodiment mode, each of the first gate electrode layers, the conductive layers, and the second gate electrode layers is formed to have a taper shape; thus, both of the two gate electrode layers have taper shapes. However, the present invention is not limited thereto, and one of the gate electrode layers may have a taper shape while the other has a perpendicular side surface by anisotropic etching. As described in this embodiment mode, the taper angles may be different or the same between the stacked gate electrode layers. With a taper shape, coverage of a film to be stacked thereover is improved and a defect is reduced; thus, reliability is enhanced.

Through the above steps, a gate electrode layer 117 formed of the first gate electrode layer 121 and the second gate electrode layer 131 and a gate electrode layer 118 formed of the first gate electrode layer 122 and the second gate electrode layer 132 can be formed in a peripheral driver circuit region 204; and a gate electrode layer 127 formed of the first gate electrode layer 124 and the second gate electrode layer 134, a gate electrode layer 128 formed of the first gate electrode layer 125 and the second gate electrode layer 135, and a gate electrode layer 129 formed of the first gate electrode layer 126 and the second gate electrode layer 136 can be formed in a pixel region 206 (see FIG. 2D). In this embodiment mode, the gate electrode layers are formed by dry etching; however, wet etching may also be employed.

The gate insulating layer 107 may be etched to some extent and reduced in thickness (so-called film decrease) by the etching step in forming the gate electrode layers.

By forming a width of the gate electrode layer to be narrow, a thin film transistor capable of high speed operation can be formed in forming the gate electrode layers. Two methods for forming a width of the gate electrode layer in a channel direction to be narrow will be shown below.

A first method is to form a mask for a gate electrode layer and then slim the mask in a width direction by etching, ashing, or the like to form a mask with a narrower width. By using the mask formed with a narrower width in advance, the gate electrode layer can also be formed in a shape with a narrower width.

A second method is to form a normal mask and then form a gate electrode layer using the mask. Then, the obtained gate electrode layer is narrowed in a width direction by conducting a side etching. Thus, a gate electrode layer with a narrower width can be finally formed. Through the above steps, a thin film transistor with a short channel length can be formed, which can realize a thin film transistor capable of high speed operation.

The gate insulating layer 107 may be etched to some extent and reduced in thickness (so-called film decrease) by the etching step in forming the gate electrode layers. In this embodiment mode, nitriding treatment or oxidation treatment is performed by plasma treatment 301 to densify a surface of the gate insulating layer 107 (see FIG. 3A). The plasma treatment may be performed in the same manner as Embodiment Mode 1.

An impurity element 151 imparting n-type conductivity is added using the first gate electrode layers 121, 122, 124, 125, and 126, and the second gate electrode layers 131, 132, 134, 135, and 136 as masks to form first n-type impurity regions 140a, 140b, 141a, 141b, 142a, 142b, 142c, 143a, and 143b (see FIG. 3B). In this embodiment mode, doping is performed by using phosphine ($PH_3$) as a doping gas containing an impurity element (in the doping gas, $PH_3$ is diluted with hydrogen ($H_2$), and the ratio of $PH_3$ in the gas is 5%) with a gas flow rate of 80 sccm, a beam current of 54 μA/cm, an acceleration voltage of 50 kV, and a dose amount of $7.0\times10^{13}$ ions/cm². In this embodiment mode, phosphorus (P) is used as the impurity element imparting n-type conductivity.

In this embodiment mode, regions of the impurity regions, which overlap with the gate electrode layers with the gate insulating layer interposed therebetween, are denoted as Lov regions. In addition, regions of the impurity regions, which do not overlap with the gate electrode layers with the gate insulating layer interposed therebetween, are denoted as Loff regions. In FIGS. 3A to 3C, these regions are shown by hatching and blank spaces in the impurity regions. This does not mean that the blank spaces are not doped with impurity elements, but makes it easy to understand that the concentration distribution of the impurity element in these regions reflects the mask and the doping condition. Note that this is the same in other drawings of this specification.

Next, as shown in FIG. 3C, masks 153a, 153b, 153c, and 153d which cover the semiconductor layer 103, part of the semiconductor layer 105, and the semiconductor layer 106 are formed. By using the masks 153a, 153b, 153c, and 153d, and the second gate electrode layer 132 as masks, an impurity element 152 imparting n-type conductivity is added to form second n-type impurity regions 144a and 144b, third n-type impurity regions 145a and 145b, second n-type impurity regions 147a, 147b and 147c, and third n-type impurity regions 148a, 148b, 148c, and 148d. In this embodiment mode, doping is performed by using $PH_3$ as a doping gas containing an impurity element (in the doping gas, $PH_3$ is diluted with hydrogen ($H_2$), and the ratio of $PH_3$ in the gas is 5%) with a gas flow rate of 80 sccm, a beam current of 540 μA/cm, an acceleration voltage of 70 kV, and a dose amount of $5.0\times10^{15}$ ions/cm².

The third n-type impurity regions 145a and 145b contain the impurity element imparting n-type conductivity in the concentration of approximately $1\times10^{17}$ to $5\times10^{18}$/cm³ in the third n-type impurity regions 148a, 148b, 148c, and 148d. The second n-type impurity regions 144a, 144b, 147a, 147b, and 147c contains the impurity element imparting n-type conductivity in the concentration of approximately $5\times10^{19}$ to $5\times10^{20}$/cm³. The third n-type impurity regions 145a and 145b are formed to contain the impurity element imparting n-type conductivity in almost the same concentration as the third n-type impurity regions 148a, 148b, 148c, and 148d, or a little higher concentration. Moreover, a channel forming region 146 is formed in the semiconductor layer 104, and channel forming regions 149a and 149b are formed in the semiconductor layer 105.

Adding of the impurity element imparting n-type conductivity may be performed once or plural times to form each impurity region. By controlling a doping condition in adding the impurity element, it can be selected whether forming the impurity region different in concentration by performing an addition step once or forming the impurity region by performing an addition step plural times.

The second n-type impurity regions 144a, 144b, 147a, 147b, and 147c are high concentration n-type impurity regions serving as source and drain regions. On the other hand, the third n-type impurity regions 145a, 145b, 148a, 148b, 148c, and 148d are low concentration impurity regions serving as LDD (Lightly Doped Drain) regions. The n-type impurity regions 145a and 145b overlapped with the first gate electrode layer 122 with the gate insulating layer 107 interposed therebetween are Lov regions which can relieve an electric field around a drain and suppress deterioration of an on current due to hot carriers. Consequently, a thin film transistor capable of high speed operation can be formed. On the other hand, the third n-type impurity regions 148a, 148b, 148c, and 148d are formed in Loff regions which are not overlapped with the gate electrode layers 127 and 128, and can relieve an electric field around a drain and suppress deterioration due to hot carrier injection as well as reduce an off current. Consequently, a semiconductor device with high reliability and low power consumption can be manufactured.

Then, as shown in FIG. 4A, the masks 153a, 153b, 153c, and 153d are removed, and masks 155a and 155b, which cover the semiconductor layers 104 and 105, are formed. An impurity element imparting p-type conductivity (in this embodiment mode, boron (B) is used) is added as an impurity element imparting one conductivity type to the semiconductor layers 103 and 106 to form impurity regions. In this embodiment mode, an impurity element 154 imparting p-type conductivity is added to the semiconductor layer 103 provided with the first gate electrode layer 121 and the second gate electrode layer 131 and the semiconductor layer 106 provided with the first gate electrode layer 126 and the second gate electrode layer 136, and first p-type impurity regions 161a, 161b, 164a, and 164b, second p-type impurity regions 160a, 160b, 163a, and 163b are formed (see FIG. 4A). In addition, the region of the semiconductor layer 103 or 106 where the impurity element 154 is not added becomes a channel forming region 162 or 165. Note that the semiconductor layers 104 and 105 are protected from the impurity element 154 by the mask 155a or 155b.

The second p-type impurity regions 160a, 160b, 163a, and 163b, which are formed by adding the impurity element 154 imparting p-type conductivity to the regions of the semiconductors 103 and 106 not covered with the first gate electrode layers 121, 126, 131, and 136, become high-concentration p-type impurity regions. On the other hand, the first p-type impurity regions 161a, 161b, 164a, and 164b, which are formed by adding the impurity element 154 imparting p-type conductivity to the semiconductor layers 103 and 106 by penetrating through the regions of the first gate electrode layers 121 and 126 not covered with the second gate electrode layers 131 and 136, become low-concentration p-type impurity regions.

Adding of the impurity element 154 imparting p-type conductivity may be performed plural times or just once to the semiconductor layers 103 and 106 to form each impurity region. This embodiment mode shows the case where the first p-type impurity regions 161a, 161b, 164a, and 164b have the lower concentration of the impurity element imparting p-type conductivity than that of the second p-type impurity regions 160a, 160b, 163a, and 163b. However, there is also a case where the impurity regions below the first gate electrode layers 121 and 126 have the higher impurity concentration than that of the impurity regions not covered with the first gate electrode layers 121 and 126. Thus, there is also a case where the first p-type impurity regions 161a, 161b, 164a, and 164b have the higher concentration of the impurity element imparting p-type conductivity than that of the second p-type impurity regions 160a, 160b, 163a, and 163b, or almost the same concentration as the second p-type impurity regions.

In this embodiment mode, in order to use boron (B) as an impurity element, diborane ($B_2H_6$) is used as a doping gas containing the impurity element (in the doping gas, $B_2H_6$ is diluted with hydrogen ($H_2$), and the rate of $B_2H_6$ in the gas is 15%), and doping is performed with a gas flow rate of 70 sccm, a beam current of 180 μA/cm, an acceleration voltage of 80 kV, and a dose amount to be added of $2.0 \times 10^{15}$ ions/cm$^2$. Here, the impurity element imparting p-type conductivity is added so as to be contained in the second p-type impurity regions 160a, 160b, 163a, and 163b in a concentration of approximately $1 \times 10^{20}$ to $5 \times 10^{21}$/cm$^3$. In addition, the impurity element imparting p-type conductivity is added so as to be contained in the first p-type impurity regions 161a, 161b, 164a, and 164b in a concentration of approximately $5 \times 10^{18}$ to $5 \times 10^{19}$/cm$^3$. In this embodiment mode, the first p-type impurity regions 161a, 161b, 164a, and 164b are formed in a self-alignment manner by reflecting the shapes of the first gate electrode layers 121, 126, the second gate electrode layers 131, and 136 to contain the impurity element in a lower concentration than that of the second p-type impurity regions 160a, 160b, 163a, and 163b.

The second p-type impurity regions 160a, 160b, 163a, and 163b are high-concentration p-type impurity regions and serve as sources and drains. On the other hand, the first p-type impurity regions 161a, 161b, 164a, and 164b are low-concentration p-type impurity regions, which serves as LDD (Lightly Doped Drain) regions. The first p-type impurity regions 161a, 161b, 164a, and 164b overlapped with the first gate electrode layers 121 and 126 with the gate insulating layer 107 interposed therebetween are Lov regions, which can relieve an electric field around a drain.

The masks 155a and 155b are removed by $O_2$ ashing or using a resist stripping solution.

In order to activate the impurity element, heat treatment, strong light irradiation, or laser light irradiation may be performed. At the same time as the activation, plasma damage to the gate insulating layer and plasma damage to an interface between the gate insulating layer and the semiconductor layer can be recovered.

Next, a first interlayer insulating layer which covers the gate electrode layers and the gate insulating layer is formed. In this embodiment mode, a stacked structure of insulating films 167 and 168 is employed (see FIG. 4B). A silicon nitride oxide film is formed as the insulating film 167 to be 200 nm thick, and a silicon oxynitride film is formed as the insulating film 168 to be 800 nm thick to form a stacked structure. In addition, a three-layer stacked structure may be employed by forming a silicon oxynitride film to be 50 nm thick, a silicon nitride oxide film to be 140 nm thick, and a silicon oxynitride film to be 800 nm thick to cover the gate electrode layers and the gate insulating layer. In this embodiment mode, the insulating films 167 and 168 are continuously formed by a plasma CVD method similarly to the base films. The insulating films 167 and 168 can be formed using a silicon nitride film, a silicon nitride oxide film, a silicon oxynitride film, a silicon oxide film, or the like by a sputtering method or a plasma CVD method, and other insulating films containing silicon may be used in a single layer or a stacked structure of three layer or more.

As well as the gate insulating layer, the insulating films 167 and 168 may also be subjected to plasma treatment to nitride or oxide (or both nitride and oxide) surfaces thereof. The surfaces of the insulating films 167 and 168 can be densified by plasma treatment. The plasma treatment may be performed in the same manner as Embodiment Mode 1.

Further, heat treatment is performed in a nitrogen atmosphere at temperatures of 300 to 550° C. for 1 to 12 hours, and the semiconductor layers are hydrogenated. Preferably, this step is performed at temperatures of 400 to 500° C. Through this step, dangling bonds in the semiconductor layers are terminated by hydrogen contained in the insulating film 167 that is an interlayer insulating layer. In this embodiment mode, heat treatment is performed at 410° C.

In addition, the insulating films 167 and 168 can also be formed of a material of aluminum nitride (AlN), aluminum oxynitride (AlON), aluminum nitride oxide containing more nitrogen than oxygen (AlNO), aluminum oxide, diamond-like carbon (DLC), nitrogen-containing carbon (CN), polysilazane, and other substances containing an inorganic insulating material. A material containing siloxane may also be used. Moreover, an organic insulating material, and as an organic material, polyimide, acrylic, polyamide, polyimide amide, resist, or benzocyclobutene can be used. Further, an oxazole resin can also be used, for example, a photosensitive polybenzoxazole or the like can be used. A photosensitive polybenzoxazole has a low dielectric constant (a dielectric constant of 2.9 at 1 MHz and a normal temperature), high heat resistance (TGA: Thermal Gravity Analysis, thermal decomposition temperature of 550° C. with the rise in temperature at 5° C./min), and a low moisture absorbing rate (0.3% in 24 hours at a normal temperature). A coated film with a favorable planarity formed by a coating method may also be used.

Then, contact holes (openings), which reach the semiconductor layers, are formed in the insulating films 167 and 168, and the gate insulating layer 107 using a resist mask. Etching may be performed once or plural times according to a selection ratio of a material to be used. The insulating film 168, the insulating film 167, and the gate insulating layer 107 are removed, and opening reaching the second p-type impurity regions 160a, 160b, 163a and 163b and the second n-type impurity regions 144a, 144b, 147a and 147b as source regions or drain regions are formed. Etching may be either wet etching or dry etching, or may be performed by combining both of them. As an etching gas, $CHF_3$, $C_2F_6$, $C_2F_4$, $C_4F_8$, $C_5F_8$, or the like can be appropriately used, in addition to a chlorine based gas typified by $Cl_2$, $BCl_3$, $SiCl_4$, $CCl_4$, or the like, a fluorine based gas typified by $CF_4$, $SF_6$, $NF_3$, or the like, or $O_2$. In addition, an inert gas may be added to an etching gas to be used. As an inert element to be added, one or more kinds of elements of He, Ne, Ar, Kr, and Xe can be used.

A conductive film is formed so as to cover the openings, and the conductive film is etched to form source or drain electrode layers 169a, 169b, 170a, 170b, 171a, 171b, 172a, and 172b, each of which is electrically connected to part of each source region or drain region. The source or drain electrode layer can be formed by forming a conductive film by a PVD method, a CVD method, an evaporation method, or the like, and then, etching the conductive film into a desired shape. In addition, a conductive film can be selectively formed in a predetermined position by a droplet discharging method, a printing method, a dispenser method, an electroplating method, or the like. Moreover, a reflow method or a damascene method may also be used. As a material for the source or drain electrode layer, an element such as Ag, Au, Cu, Ni, Pt, Pd, Ir, Rh, W, Al, Ta, Mo, Cd, Zn, Fe, Ti, Si, Ge, Zr, or Ba, or an alloy or nitride thereof can be used. A stacked structure of these materials may also be employed. In this embodiment mode, titanium (Ti) is formed to be 100 nm thick, an aluminum-silicon (Al—Si) alloy is formed to be 700 nm thick, and titanium (Ti) is formed to be 200 nm thick, and then, the stacked film is processed into a desired shape.

Through the above steps, an active matrix substrate can be manufactured, in which a thin film transistor 173 which is a p-channel thin film transistor having a p-type impurity region in a Lov region and a thin film transistor 174 which is an n-channel thin film transistor having an n-type impurity region in a Lov region are provided in the peripheral driver circuit region 204; and a thin film transistor 175 which is a multi-channel type n-channel thin film transistor having an n-type impurity region in a Loff region and a thin film transistor 176 which is a p-channel thin film transistor having a p-type impurity region in a Lov region are provided in the pixel region 206 (see FIG. 4C).

The active matrix substrate can be used for a light-emitting device having a light-emitting element, a liquid crystal display device having a liquid crystal, and other display devices. In addition, the active matrix substrate can be used for various processors typified by a CPU (Central Processing Unit) or a semiconductor device such as a card incorporating an ID chip.

A structure of the thin film transistors in the pixel portion is not limited to this embodiment mode, and a single gate structure where one channel forming region is formed, a double gate structure where two channel forming regions are formed, or a triple gate structure where three channel forming regions are formed may be employed. In addition, the thin film transistors in the peripheral driver circuit region may also employ a single gate structure, a double gate structure, or a triple gate structure.

Next, insulating films 181 and 182 are formed as a second interlayer insulating layer (see FIG. 5A). FIGS. 5A to 5C each show a manufacturing step of the display device, in which a separation region 201 for separation by scribing, an external terminal connection region 202 that is a portion where an FPC is attached, a wiring region 203 that is a lead wiring region for the peripheral region, the peripheral driver circuit region 204, and the pixel region 206 are provided. Wirings 179a and 179b are provided in the wiring region 203, and a terminal electrode layer 178 connected to an external terminal is provided in the external terminal connection region 202.

The insulating films 181 and 182 can be formed by using a material of silicon oxide, silicone nitride, silicon oxynitride, silicon nitride oxide, aluminum nitride (AlN), aluminum oxide containing nitrogen (also referred to as aluminum oxynitride) (AlON), aluminum nitride oxide containing oxygen (also referred to as aluminum nitride oxide) (AlNO), aluminum oxide, diamond like carbon (DLC), nitrogen-containing carbon (CN), PSG (phosphorus glass), BPSG (boron phosphorus glass), an alumina film, and other substances containing an inorganic insulating material. In addition, a siloxane resin may also be used. Moreover, an organic insulating material may be used, and either a photosensitive or non-photosensitive organic insulating material may be used. For example, polyimide, acrylic, polyamide, polyimide amide, resist, benzocyclobutene, polysilazane, or a Low-k material having a low dielectric constant can be used. Furthermore, an oxazole resin can also be used, for example, a photosensitive polybenzoxazole or the like can be used. A photosensitive polybenzoxazole has a low dielectric constant (a dielectric constant of 2.9 at 1 MHz and a normal temperature), high heat resistance (TGA: Thermal Gravity Analysis, thermal decomposition temperature of 550° C. with the rise in temperature at 5° C./min), and a low moisture absorbing rate (0.3% in 24 hours at a normal temperature).

An interlayer insulating layer provided for planarization is required to be high heat resistance, a high insulating property, and high planarity. Thus, the insulating film 181 is preferably formed by using a coating method typified by a spin coating method. In this embodiment mode, the insulating film 181 is formed of a coated film using a siloxane resin material while the insulating film 182 is formed of a silicon nitride oxide film by a CVD method.

Besides, the insulating films 181 and 182 can be formed by using a dipping method, a spray coating method, a doctor knife, a roll coater, a curtain coater, a knife coater, a CVD method, an evaporation method, or the like. The insulating films 181 and 182 may also be formed by a droplet discharging method. In a case of using a droplet discharging method, a material solution can be saved. In addition, a method capable of transferring or describing a pattern like a droplet discharging method, for example, a printing method (a method for forming a pattern such as screen printing or offset printing), a dispenser method and the like can also be used.

In this embodiment mode, nitriding treatment or oxidation treatment is performed by plasma treatment 317 to have a dense surface of the gate insulating layer 107 and to form an insulating film 316 (see FIG. 5B). The plasma treatment may be performed in the same manner as Embodiment Mode 1.

Then, as shown in FIG. 5C, an opening is formed in the insulating films 181 that is the interlayer insulating layer and the insulating film 316. The insulating films 181 and 316 are required to be etched widely in a connection region 205 (see FIG. 7A), the peripheral driver circuit region 204, the wiring region 203, the external terminal connection region 202, the separation region 201, and the like. Note that the connection region 205 is a region shown in a top view of FIG. 7A, where wiring layers manufactured in the same step as the source or drain electrode layers and a second electrode layer that subsequently becomes an upper electrode layer of a light-emitting element are electrically connected to each other. The connection region 205 is omitted and not shown in FIGS. 5A to 5C. Thus, it is necessary to provide an opening also in the insulating films 181 and 316 even in the connection region 205. However, in the pixel region 206, an opening area is much smaller and minute compared with an opening area in the peripheral driver circuit region 204 and the like. Therefore, by performing both a photolithography step for forming the opening in the pixel region and a photolithography step for forming the opening in the connection region, a margin of an etching condition can be widened. Consequently, a yield can be improved. Moreover, by a wide margin of the etching condition, the contact hole formed in the pixel region can be formed with high precision.

Specifically, a large area opening is formed in the insulating films 181 and 316 provided in the connection region 205, the peripheral driver circuit region 204, the wiring region 203, the external terminal connection region 202, and the separation region 201. Therefore, a mask is formed to cover at least the insulating films 181 and 316 in the pixel region 206. Etching can be performed by using a parallel plate RIE apparatus or an ICP etching apparatus. Note that etching time may be determined so that the wiring layers and the insulating film 168 are over-etched. Under the condition where the wiring layers and the insulating film 168 are over-etched, variation in thickness in the substrate and variation in etching rate can be reduced. In this manner, an opening is each formed in the connection region 205, the peripheral driver circuit region 204, the wiring region 203, the external terminal connection region 202, and the separation region 201. An opening 183 is formed in the external terminal connection region 202 to expose the terminal electrode layer 178.

Thereafter, a minute opening, that is, a contact hole is formed in the insulating films 181 and 316 in the pixel region 206. At this time, a mask for forming an opening in the pixel region 206 provided with a minute opening in a predetermined position is formed. As such a mask, for example, a resist mask can be used.

Next, the insulating films 181 and 316 are etched by using a parallel plate RIE apparatus. Note that etching time may be determined so that the wiring layers and the insulating film 168 are over-etched. Under the condition where the wiring layers and the insulating film 168 are over-etched, variation in thickness in the substrate and variation in etching rate can be reduced.

In addition, an ICP apparatus may also be used as the etching apparatus. Through the above steps, an opening 184 that reaches the source or drain electrode layer 172b is formed in the pixel region 206 (see FIG. 5C).

The etching for forming the opening may also be performed plural times at the same position. For example, since the opening of the connection region 205 has a large area, an amount of etching is large. Such an opening with a large area may also be formed by performing etching plural times. In addition, in a case of forming a deeper opening compared with other opening, etching may be performed plural times, similarly.

Moreover, in this embodiment mode, although an example of forming the openings in the insulating films 181 and 316 by performing etchings separately plural times is shown, the openings may also be formed by performing one etching step. In this case, etching is performed using an ICP apparatus with an ICP power of 7000 W, a bias power of 1000 W, pressure of 0.8 Pascal (Pa), and 240 sccm of $CF_4$ and 160 sccm $O_2$ as an etching gas. The bias power is preferably 1000 to 4000 W. Since the openings can be formed by one etching step, there is an advantage that a step can be simplified.

Next, a first electrode layer 396 (also referred to as a pixel electrode layer) is formed so as to be in contact with the source or drain electrode layer 172b. The first electrode layer 396 serves as an anode or a cathode. The first electrode layer 396 is preferably formed of a film containing as its main component an element of Ti, Ni, W, Cr, Pt, Zn, Sn, In, and Mo; an alloy material or a compound material containing the element as its main component such as TiN, $TiSi_xN_y$, $WSi_x$, $WN_x$, $WSi_xN_y$, or NbN; or a stacked film thereof with a total film thickness of 100 to 800 nm.

In this embodiment mode, a light-emitting element is used as a display element, and the first electrode layer 396 has a light-transmitting property because light from the light-emitting element is extracted from the first electrode layer 396 side. The first electrode layer 396 is formed by forming a transparent conductive film to be etched in a desired shape (see FIG. 6A). In this embodiment mode, the insulating film 316 also serves as an etching stopper in forming the first electrode layer 396 by etching.

In the present invention, the first electrode layer 396 that is a light-transmitting electrode layer may be specifically formed by using a transparent conductive film formed of a light-transmitting conductive material, and indium oxide containing tungsten oxide, indium zinc oxide containing tungsten oxide, indium oxide containing titanium oxide, indium tin oxide containing titanium oxide, or the like can be used. Needless to say, indium tin oxide (ITO), indium zinc oxide (IZO), indium tin oxide added with silicon oxide (ITSO), or the like can also be used.

An example of a composition ratio of each light-transmitting conductive material will be described. In indium oxide containing tungsten oxide, preferably, the composition ratio of tungsten oxide is 1.0 wt % and indium oxide is 99.0 wt %. In indium zinc oxide containing tungsten oxide, preferably, tungsten oxide is 1.0 wt %, zinc oxide is 0.5 wt %, and indium oxide is 98.5 wt %. In indium oxide containing titanium oxide, preferably, titanium oxide is 1.0 to 5.0 wt % and indium oxide is 99.0 to 95.0 wt %. In indium tin oxide (ITO), preferably, tin oxide is 10.0 wt % and indium oxide is 90.0 wt %. In indium zinc oxide (IZO), preferably, zinc oxide is 10.7 wt % and indium oxide is 89.3 wt %. Moreover, in indium tin oxide containing titanium oxide, preferably, titanium oxide is 5.0 wt %, tin oxide is 10.0 wt %, and indium oxide is 85.0 wt %. The composition ratios as described above are just examples, and a composition ratio may be set appropriately.

In addition, even in a case of a non-light-transmitting material such as a metal film, when the thickness is made thin (preferably, approximately 5 to 30 nm) so as to be able to transmit light, light can be emitted from the first electrode layer 396. As a metal thin film that can be used for the first electrode layer 396, a conductive film formed of titanium, tungsten, nickel, gold, platinum, silver, aluminum, magnesium, calcium, lithium, and an alloy thereof; or the like can be used.

The first electrode layer 396 can be formed by an evaporation method, a sputtering method, a CVD method, a printing method, a dispenser method, a droplet discharging method, or the like. In this embodiment mode, the first electrode layer 396 is formed of indium zinc oxide containing tungsten oxide by a sputtering method. The first electrode layer 396 is preferably formed with a total film thickness of 100 to 800 nm. In this embodiment mode, the film thickness is to be 125 nm.

The surface of the first electrode layer 396 may be polished by a CMP method or by cleaning with a poly(vinyl alcohol) based porous body to be planarized. After polishing by a CMP method, the surface of the first electrode layer 396 may be subjected to ultraviolet ray irradiation, oxygen plasma treatment, or the like.

Heat treatment may be performed after forming the first electrode layer 396. By the heat treatment, moisture contained in the first electrode layer 396 is discharged. Thus, degasification or the like is not caused in the first electrode layer 396; therefore, even when a light-emitting material which is easily deteriorated by moisture is formed over the first electrode layer, the light-emitting material is not deteriorated; thus, a highly reliable display device can be manufactured.

Then, an insulating layer 186 (also referred to as a partition, a barrier, or the like) is formed to cover an edge portion of the first electrode layer 396 and the source or drain electrode layer (see FIG. 6B). In addition, in the same step, insulating layers 187a and 187b are formed in the external terminal connection region 202.

When the selection ratio between the first electrode layer 396 and the insulating layer 186 is high, the first electrode layer 396 serves as an etching stopper when forming the insulating layer 186 serving as a partition covering part of the first electrode layer 396 by etching into a desired shape.

In this embodiment mode, an inorganic insulating material is used for the insulating layer 186 which is provided in contact with a light-emitting element. An inorganic insulating material can form a dense film; therefore, contaminant such as moisture is not transmitted. Thus, a light-emitting element can be prevented from being deteriorated due to contaminant penetrated from outside of a display device.

As the insulating layer 186, silicon oxide, silicon nitride, silicon oxynitride, silicon nitride oxide, or the like can be used, which may be formed in a single layer or a stacked structure of two layers, three layers, or the like. In addition, as another material of the insulating layer 186, a material of aluminum nitride, aluminum oxynitride in which the content of oxygen is higher than that of nitrogen, aluminum nitride oxide or aluminum oxide in which the content of nitrogen is higher than that of oxygen, diamond like carbon (DLC), nitrogen-containing carbon, polysilazane, and other substances containing an inorganic insulating material can be used. A material containing siloxane may also be used.

The insulating layer 186 can be formed by a sputtering method, a PVD (Physical Vapor Deposition) method, a low pressure CVD method (LPCVD method), or a CVD (Chemical Vapor Deposition) method such as a plasma CVD method. Alternatively, a droplet discharging method by which a pattern can be selectively formed, a printing method by which a pattern can be transferred or described (a method, such as a screen printing method or an offset printing method, by which a pattern can be formed), or other methods such as a coating method such as a spin coating method, a dipping method, or the like can also be used.

An etching process for processing into a desired shape may employ either plasma etching (dry etching) or wet etching. In a case of processing a large area substrate, plasma etching is suitable. As an etching gas, a fluorine based gas such as $CF_4$ or $NF_3$ or a chlorine based gas such as $Cl_2$ or $BCl_3$ is used, to which an inert gas such as He or Ar may be appropriately added. When an etching process by atmospheric pressure discharge is employed, local electric discharge can also be realized, which does not require a mask layer to be formed over the entire surface of the substrate.

The insulating layer 186 covers an end portion of the first electrode layer 396, and an edge portion thereof has a tapered shape. The taper angles in the edge portions of the insulating layer 186 are preferably larger than 30 degrees (much preferably, 40 degrees or more) and 70 degrees or less (much preferably, 60 degrees or less). In addition, formed using a CVD method or a sputtering method, the insulating layer 186 is formed by reflecting a depression and projection shape in a face to be formed because the insulating layer 186 is formed of an inorganic insulating material. In this case, since a film thickness thereof is not planarized, the face to be formed can be covered with a uniform film thickness; thus, the film thickness can be comparatively thinned. In this embodiment mode, the film thickness of the insulating layer 186 is to be 1 μm or less, preferably 500 nm or less. In this embodiment mode, the film thickness of the insulating layer 186 is to be 300 nm.

In the present invention, the insulating layer to be a partition and the first electrode layer are subjected to plasma treatment. By performing plasma treatment under a nitrogen atmosphere or an oxygen atmosphere, surfaces of the insulating layer and the first electrode layer are nitrided or oxidized. When the insulating layer and the first electrode layer are oxidized or nitrided (or may be both oxidized and nitrided) by using plasma treatment, surfaces of the insulating layer and the first electrode layer are modified, and an insulating layer and a first electrode layer which are much denser can be obtained. Thus, characteristics or the like of the display device can be improved by suppressing a defect such as a pinhole.

The plasma treatment may be performed in the same manner as Embodiment Mode 1. However, in performing plasma treatment in the present invention, the plasma treatment is performed under such a condition that an adverse effect is not caused on electric characteristics of a thin film transistor that is formed below the insulating layer to be a partition and the first electrode layer of the object.

In this embodiment mode, the insulating layer 186 and the first electrode layer 396 are subjected to plasma treatment 305, and an insulating layer 307 and a first electrode layer 306, the surfaces of which are subjected to modification treatment, are formed (see FIG. 6C). Note that the surfaces of the insulating layers 187a and 187b are also modified by the same plasma treatment step; thus, insulating layers 308a and 308b are obtained. In this embodiment mode, a silicon oxide nitride film is used as the insulating layer 307 and ITSO is used as the first electrode layer 306, which are subjected to plasma treatment under a nitrogen atmosphere. According to this modification treatment, the surfaces of the insulating layer 186 and the first electrode layer 396 are nitrided to be much denser. In FIG. 6C, a diagonal line is hatched at a place where the insulating layer 307 and the first electrode layer 306 are subjected to the modification treatment, so that it becomes apparent that the treatment is performed. However, not being limited to the hatching region, the modification treatment region is changed depending on a condition of the plasma treatment, or the materials or film thicknesses of the insulating layer 186 and the first electrode layer 396, which can be appropriately controlled by selecting the condition.

In the connection region 205 shown in FIG. 7A, a wiring layer formed by the same material and through the same step as the second electrode layer is electrically connected to a wiring layer formed by the same material and through the same step as the gate electrode layer. For this connection, an opening is formed to expose the wiring layer formed by the same material and through the same step as the gate electrode layer. A step around the opening is covered with the insulating layer 186 to be a gentle sloping; thus, the coverage of a second electrode layer 189 to be stacked thereover can be improved.

In addition, in order to further improve reliability, it is preferable to perform degasification of the substrate by vacuum heating before forming an electroluminescent layer 188. For example, before performing evaporation of an organic compound material, it is desirable to perform heat treatment for removing a gas contained in the substrate in a reduced pressure atmosphere or an inert gas atmosphere at temperatures of 200 to 400° C., preferably 250 to 350° C. Moreover, it is preferable to form the electroluminescent layer 188 by a vacuum evaporation method or a droplet discharging method under a reduced pressure without exposing the substrate to an atmosphere. By this heat treatment, moisture contained in or attached to a conductive film to be the first electrode layer or an insulating layer (partition) can be discharged. This heat treatment can be combined with a prior heating step as long as the substrate can be transferred in a vacuum chamber without breaking the vacuum, and only the prior heat treatment may be required to be performed once after forming an insulating layer (partition). Here, by forming the interlayer insulating film and the insulating layer (partition) using a highly heat resistant substance, a heat treatment step for improving the reliability can be sufficiently performed.

The electroluminescent layer 188 is formed over the first electrode layer 396. Although only one pixel is shown in FIGS. 7A and 7B, an electroluminescent layer corresponding to each color of R (red), G (green) and B (blue) is separately formed in this embodiment mode. The electroluminescent layer 188 may be manufactured as will be described later. By mixing an organic compound and an inorganic compound, layers having functions of a high carrier injecting property and a high carrier transporting property, which cannot be obtained when only one of an organic compound and an inorganic compound is used, are provided over the first electrode layer 396.

Materials (a low-molecular material, a high-molecular material, or the like), which show light-emission of red (R), green (G), and blue (B), can also be formed by a droplet discharging method.

Next, the second electrode layer 189 formed of a conductive film is provided over the electroluminescent layer 188. As the second electrode layer 189, a material having a low work function (Al, Ag, Li, Ca, Mg, or In; an alloy or a compound thereof such as MgAg, MgIn, AlLi, or $CaF_2$; or calcium nitride) may be used. In this manner, a light-emitting element 190 formed of the first electrode layer 396, the electroluminescent layer 188, and the second electrode layer 189 is formed (see FIG. 7B).

In the display device of this embodiment mode shown in FIGS. 7A and 7B, light emitted from the light-emitting element 190 is transmitted and emitted from the first electrode layer 396 side in a direction indicated by an arrow in FIG. 7B.

In this embodiment mode, an insulating layer may be provided over the second electrode layer 189 as a passivation film (protective film). It is effective to provide a passivation film so as to cover the second electrode layer 189 in this manner. The passivation film can be formed by using an insulating film containing silicon nitride, silicon oxide, silicon oxynitride, silicon nitride oxide, aluminum nitride, aluminum oxynitride, aluminum nitride oxide containing more nitrogen than oxygen, aluminum oxide, diamond-like carbon (DLC), and a nitrogen-containing carbon film, and a single layer or a stacked layer of the insulating films can be used. Moreover, a siloxane resin may also be used.

At this time, it is preferable to form the passivation film by using a film with favorable coverage, for which a carbon film, particularly a DLC film is preferably used. A DLC film can be formed in temperatures from a room temperature to 100° C. or less; therefore, the DLC film can be easily formed above the electroluminescent layer 188 with low heat resistance. A DLC film can be formed by a plasma CVD method (typically, an RF plasma CVD method, a microwave CVD method, an electron cyclotron resonance (ECR) CVD method, a hot filament CVD method, or the like), a combustion method, a sputtering method, an ion beam evaporation method, a laser evaporation method, or the like. As a reaction gas for film formation, a hydrogen gas and a carbon hydride-based gas (for example, $CH_4$, $C_2H_2$, $C_6H_6$, or the like) are used to be ionized by glow discharge, and the ions are accelerated to impact against a cathode to which a negative self-bias voltage is applied, to form a film. In addition, a CN film may be formed by using a $C_2H_4$ gas and a $N_2$ gas as a reaction gas. A DLC film has high blocking effect with respect to oxygen; therefore, oxidization of the electroluminescent layer 188 can be suppressed. Therefore, a problem that the electroluminescent layer 188 is oxidized during a subsequent sealing step can be prevented.

By firmly fixing the substrate 100 over which the light-emitting element 190 is formed as described above and a sealing substrate 195 with a sealing material 192, the light-emitting element is sealed (see FIGS. 7A and 7B). As the sealing material 192, typically, a visible light curable resin, an ultraviolet ray curable resin, or a thermosetting resin is preferably used. For example, an epoxy resin such as a bisphenol-A liquid resin, a bisphenol-A solid resin, a bromine-containing epoxy resin, a bisphenol-F resin, a bisphenol-AD resin, a bisphenol resin, a cresol resin, a novolac resin, a cycloaliphatic epoxy resin, an Epi-Bis type epoxy resin, a glycidyl ester resin, a glycidyl amine-based resin, a heterocyclic epoxy resin, or a modified epoxy resin can be used. Note that a region surrounded by a sealing material may be filled with a filler 193, and nitrogen or the like may be charged by sealing in a nitrogen atmosphere. Since a bottom emission type is employed in this embodiment mode, the filler 193 is not required to transmit light. However, in a case of extracting light through the filler 193, the filler is required to transmit light. Typically, a visible light curable, ultraviolet ray curable, or thermosetting epoxy resin may be used. Through the above steps, a display device having a display function using a light-emitting element of this embodiment mode is completed. Moreover, the filler may be dropped in a liquid state to be filled in the display device. By using a substance having hygroscopicity such as a drying agent as the filling material, further moisture absorbing effect is obtained and deterioration of elements can be prevented.

A drying agent is provided in an EL display panel to prevent deterioration of the element due to moisture. In this embodiment mode, a drying agent is provided in a concave portion that is formed so as to surround the pixel region in the sealing substrate so as not to hinder a thin design. In addition, a drying agent is also formed in a region corresponding to a gate wiring layer so that a moisture absorbing area becomes wide; thus, moisture can be effectively absorbed. Moreover, a drying agent is formed over a gate wiring layer which does not emit light from itself; therefore, light extraction efficiency is not reduced, either.

A light-emitting element is sealed by a glass substrate in this embodiment mode. However, sealing treatment is treatment for protecting a light-emitting element from moisture, and any of a method for mechanically sealing the light-emitting element by a cover material, a method for sealing the light-emitting element with a thermosetting resin or an ultraviolet ray curable resin, and a method for sealing the light-emitting element by a thin film having a high barrier property such as metal oxide or metal nitride is used. As the cover material, glass, ceramics, a plastic, or metal can be used, but a material which transmits light is required to be used in a case where light is emitted to a cover material side. The cover material and the substrate over which the light-emitting element is formed are attached to each other with a sealing material such as a thermosetting resin or an ultraviolet ray curable resin, and a sealed space is formed by curing the resin using heat treatment or ultraviolet ray irradiation treatment. It is also effective to provide a hygroscopic material typified by barium oxide in this sealed space. This hygroscopic material may be provided over and in contact with the sealing material, or over the partition or in the periphery of the light-emitting element so as not to shield light from the light-emitting element. Further, the space between the cover material and the substrate over which the light-emitting element is formed can be filled with a thermosetting resin or an ultraviolet ray curable resin. In this case, it is effective to add a hygroscopic material typified by barium oxide in the thermosetting resin or the ultraviolet ray curable resin.

Figure 12:
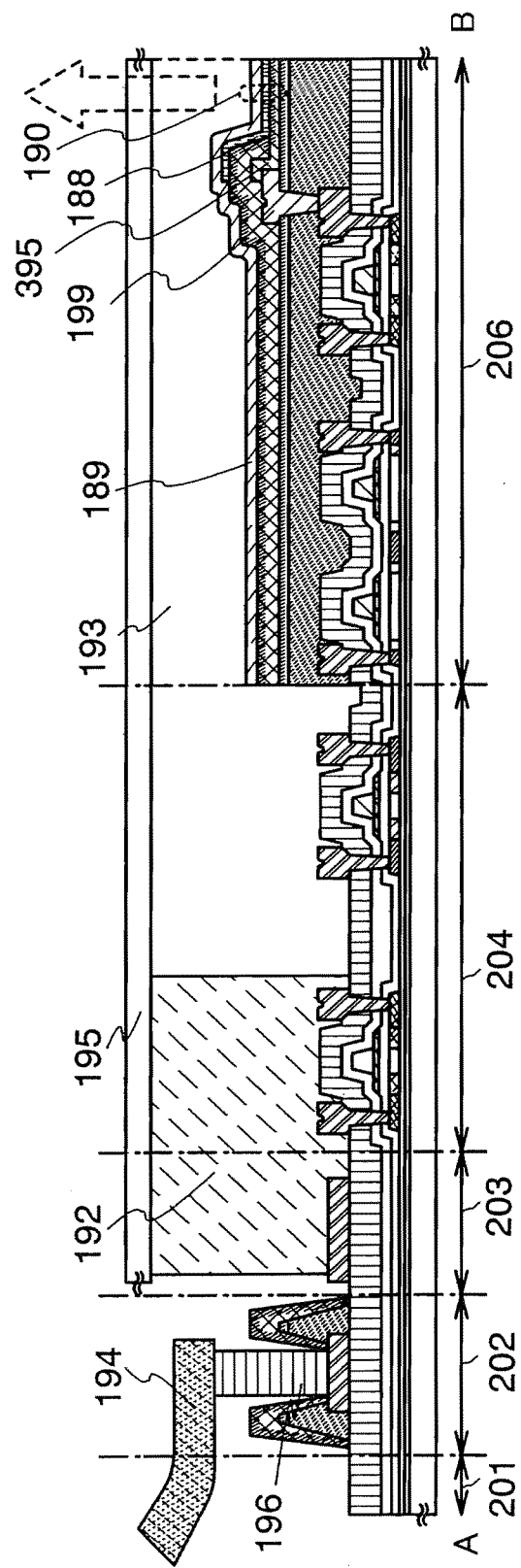
FIG. 12 is a view explaining a display device of the present invention.

FIG. 12 shows an example in which, in the display device shown in FIGS. 7A and 7B manufactured in this embodiment mode, the source or drain electrode layer and the first electrode layer are not directly in contact with each other to be electrically connected, but connected to each other with a wiring layer interposed therebetween. In a display device in FIG. 12, a source or drain electrode layer of a thin film transistor for driving a light-emitting element and a first electrode layer 395 are electrically connected to each other with a wiring layer 199 interposed therebetween. In FIG. 12, part of the first electrode layer 395 is stacked over the wiring layer 199 to be connected; however, the first electrode layer 395 may be formed first, and then, the wiring layer 199 may be formed over the first electrode layer 395 to be in contact.

In this embodiment mode, the terminal electrode layer 178 is connected to an FPC 194 through an anisotropic conductive layer 196 in the external terminal connection region 202, and electrically connected to the outside. In addition, as shown in FIG. 7A that is a top view of the display device, the display device manufactured in this embodiment mode includes a peripheral driver circuit region 207 and a peripheral driver circuit region 208 having a scanning line driver circuit in addition to peripheral driver circuit regions 204 and 209 having a signal line driver circuit.

The circuits as described above are formed in this embodiment mode; however, the present invention is not limited thereto. An IC chip may be mounted by the above COG method or TAB method as the peripheral driver circuit. In addition, each of the gate line driver circuit and the source line driver circuit may be provided in a single number or a plurality of numbers.

In a display device of the present invention, a driving method for image display is not particularly limited, and for example, a dot sequential driving method, a line sequential driving method, an area sequential driving method, or the like may be used. Typically, the line sequential driving method may be used, and a time division gray scale driving method and an area gray scale driving method may also be appropriately used. In addition, a video signal inputted to the source line of the display device may be an analog signal or a digital signal. The driver circuit and the like may be appropriately designed according to the video signal.

Further, in a display device using a digital video signal, a video signal that is inputted into a pixel has a constant voltage (CV) or has a constant current (CC). As for a video signal with a constant voltage (CV), a voltage that is applied to a light-emitting element is constant (CVCV), or a current that is flowed through a light-emitting element is constant (CVCC). In addition, as for a video signal with a constant current (CC), a voltage that is applied to a light-emitting element is constant (CCCV), or a current that is flowed through a light-emitting element is constant (CCCC).

This embodiment mode can be implemented by being arbitrarily combined with each of Embodiment Modes 1 and 2.

By applying the present invention, a highly reliable display device can be manufactured. Thus, a high resolution and high performance display device can be manufactured with high yields.

Embodiment Mode 4

Another embodiment mode of the present invention will be explained with reference to FIGS. 8A to 8C, FIG. 9, and FIG. 10. This embodiment mode shows an example in which a second interlayer insulating layer (the insulating films 181 and 182) is not formed in the display device manufactured in Embodiment Mode 3. Thus, repeated explanations of the same portions or portions having the same functions will be omitted.

As shown in Embodiment Mode 3, over a substrate 100, thin film transistors 173, 174, 175, and 176, and insulating films 167 and 168 are formed. In each of the thin film transistors, a source or drain electrode layer connected to a source region or drain region of a semiconductor layer is formed. A first electrode layer 185 is formed to be in contact with a source or drain electrode layer 172b in the thin film transistor 176 provided in a pixel region 206 (see FIG. 8A).

The first electrode layer 185 serves as a pixel electrode, and may be formed by the same material and through the same step as the first electrode layer 395 in Embodiment Mode 1. In this embodiment mode also, a light transmitting material is used to extract light through the first electrode layer 185 in the same manner as Embodiment Mode 1. In this embodiment mode, ITSO as a transparent conductive film is used for the first electrode layer 185 and etched into a desired shape.

In this embodiment mode, an inorganic insulating material is used for an insulating layer 310 which is provided in contact with a light-emitting element. An inorganic insulating material can form a dense film; therefore, contaminant such as moisture is not transmitted. Thus, a light-emitting element can be prevented from being deteriorated due to contaminant penetrated from outside of a display device. In the same step of forming the insulating layer 310, insulating layers 311a and 311b are also formed.

As the insulating layer 310, silicon oxide, silicon nitride, silicon oxynitride, silicon nitride oxide, or the like can be used, which may be formed in a single layer or a stacked structure of two layers, three layers, or the like. In addition, as another material of the insulating layer 310, a material of aluminum nitride, aluminum oxynitride in which the content of oxygen is higher than that of nitrogen, aluminum nitride oxide or aluminum oxide in which the content of nitrogen is higher that that of oxygen, diamond like carbon (DLC), nitrogen-containing carbon, polysilazane, and other substances containing an inorganic insulating material can be used. A material containing siloxane may also be used.

The insulating layer 310 can be formed by a sputtering method, a PVD (Physical Vapor Deposition) method, a low pressure CVD method (LPCVD method), or a CVD (Chemical Vapor Deposition) method such as a plasma CVD method. Alternatively, a droplet discharging method by which a pattern can be selectively formed, a printing method by which a pattern can be transferred or described (a method, such as a screen printing method or an offset printing method, by which a pattern can be formed), a dispenser method, or other methods such as a coating method such as a spin coating method, a dipping method, or the like can also be used.

An etching process for processing into a desired shape may employ either plasma etching (dry etching) or wet etching. In a case of processing a large area substrate, plasma etching is suitable. As an etching gas, a fluorine based gas such as $CF_4$ or $NF_3$ or a chlorine based gas such as $Cl_2$ or $BCl_3$ is used, to which an inert gas such as He or Ar may be appropriately added. When an etching process by atmospheric pressure discharge is employed, local electric discharge can also be realized, which does not require a mask layer to be formed over the entire surface of the substrate.

The insulating layer 310 covers an end portion of the first electrode layer 185, and an edge portion thereof has a tapered shape. The taper angles in the edge portions of the insulating layer 310 are preferably larger than 30 degrees (much preferably, 40 degrees or more) and 70 degrees or less (much preferably, 60 degrees or less). In addition, formed using a CVD method or a sputtering method, the insulating layer 310 is formed by reflecting a depression and projection shape in a face to be formed because the insulating layer 310 is formed of an inorganic insulating material. In this case, since a film thickness thereof is not planarized, the face to be formed can be covered with a uniform film thickness; thus, the film thickness can be comparatively thinned. In this embodiment mode, the film thickness of the insulating layer 310 is to be 1 μm or less, preferably 500 nm or less. In this embodiment mode, the film thickness is to be 300 nm.

In the present invention, the insulating layer to be a partition and the first electrode layer are subjected to plasma treatment. By performing plasma treatment under a nitrogen atmosphere or an oxygen atmosphere, surfaces of the insulating layer and the first electrode layer are nitrided or oxidized. When the insulating layer and the first electrode layer are oxidized or nitrided (or may be both oxidized and nitrided) by using plasma treatment, surfaces of the insulating layer and the first electrode layer are modified, and an insulating layer and a first electrode layer which are much denser can be obtained. Thus, characteristics or the like of the display device can be improved by suppressing a defect such as a pinhole.

The plasma treatment may be performed in the same manner as Embodiment Mode 1. However, in performing plasma treatment in the present invention, the plasma treatment is performed under such a condition that an adverse effect is not caused on electric characteristics of a thin film transistor that is formed below the insulating layer to be a partition and the first electrode layer of the object.

In this embodiment mode, the insulating layer 310 and the first electrode layer 185 are subjected to plasma treatment 318, and an insulating layer 319 and a first electrode layer 320, the surfaces of which are subjected to modification treatment, are formed (see FIG. 8C). Note that the surfaces of the insulating layers 311a and 311b are also modified by the same plasma treatment step; thus, insulating layers 315a and 315b are obtained. In this embodiment mode, a silicon oxide nitride film is used as the insulating layer 310 and ITSO is used as the first electrode layer 185, which are subjected to plasma treatment under a nitrogen atmosphere. According to this modification treatment, the surfaces of the insulating layer 310 and the first electrode layer 185 are nitrided to be much denser. In FIG. 8C, a diagonal line is hatched at a place where the insulating layer 319 and the first electrode layer 320 are subjected to the modification treatment, so that it becomes apparent that the treatment is performed. However, not being limited to the hatching region, the modification treatment region is changed depending on a condition of the plasma treatment, or the materials or film thicknesses of the insulating layer 310 and the first electrode layer 185, which can be appropriately controlled by selecting the condition.

An electroluminescent layer 188 is formed over the first electrode layer, a second electrode layer 189 is formed thereover, and a light-emitting element 190 is formed. A terminal electrode layer 178 is attached to an FPC 194 through an anisotropic conductive layer 196 in an external terminal connection region 202. A passivation film is formed so as to cover the second electrode layer 189. The substrate 100 is attached to a sealing substrate 195 with a sealing material 192, and the inside of the display device is filled with a filler 193 (see FIG. 9).

Figure 10:
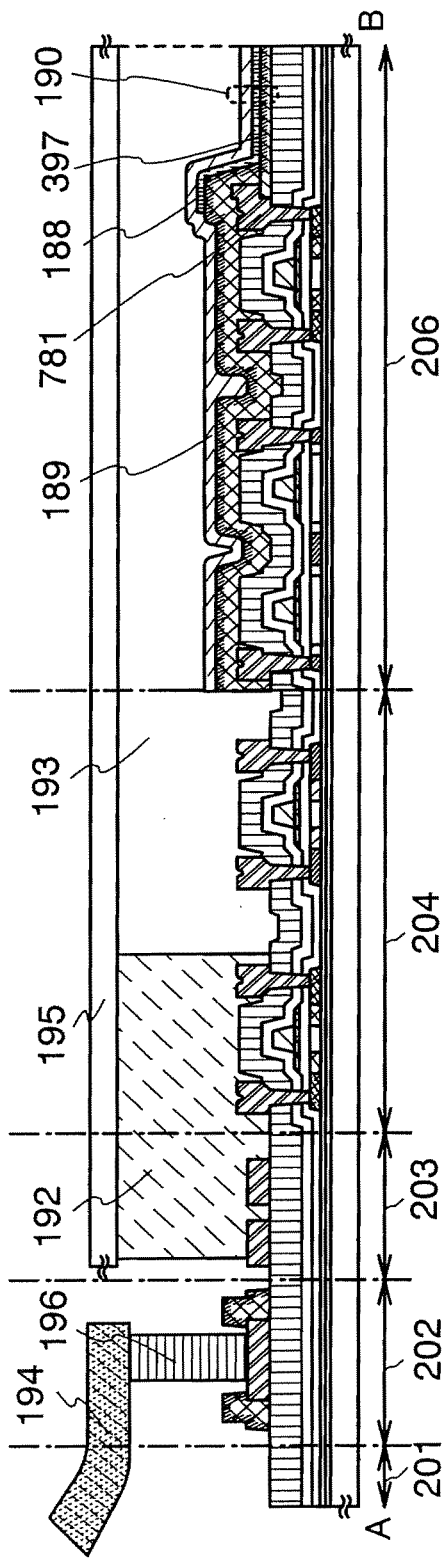
FIG. 10 is a view explaining a display device of the present invention.

In a display device shown in FIG. 10, a first electrode layer 397 corresponding to the first electrode layer 320 is selectively formed over the insulating film 168 before forming a source or drain electrode layer 781 corresponding to the source or drain electrode layer 172b connected to the thin film transistor 176. In this case, the source or drain electrode layer 781 and the first electrode layer 397 are connected to each other so that the source or drain electrode layer 781 is stacked over the first electrode layer 397 in this embodiment mode. When the first electrode layer 397 is formed before the source or drain electrode layer 781, the first electrode layer 397 can be formed over a flat formation region, and coverage is favorable. Moreover, there is an advantage that the first electrode layer 397 can be formed with favorable planarity because polishing treatment such as CMP can be sufficiently performed.

By applying the present invention, a highly reliable display device can be manufactured. Thus, a high resolution and high performance display device can be manufactured with high yields.

Embodiment Mode 5

Although a display device having a light-emitting element can be formed by applying the present invention, light emitted from the light-emitting element is emitted in any type of bottom emission, top emission, and dual emission. This embodiment mode will explain examples of a bottom emission type and a top emission type with reference to FIG. 14 and FIG. 15.

Figure 15:
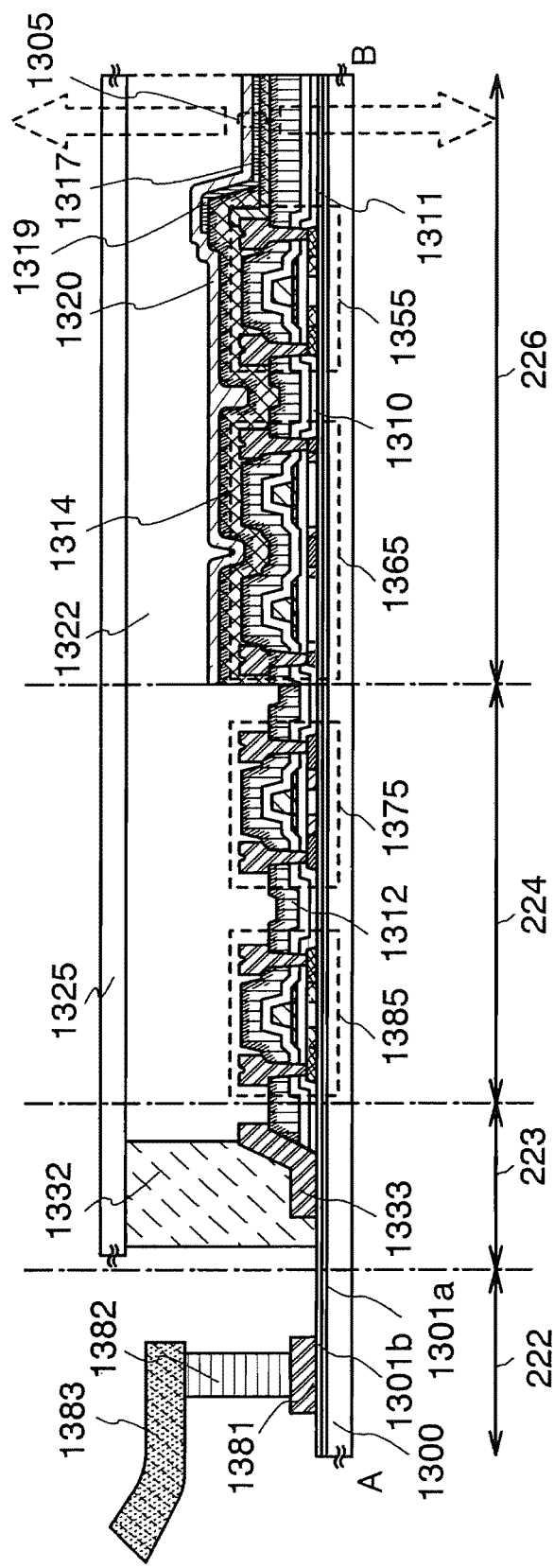
FIG. 15 is a view explaining a display device of the present invention.

FIG. 15 shows a display device, which includes an element substrate 1300, thin film transistors 1355, 1365, 1375 and 1385, a first electrode layer 1317, an electroluminescent layer 1319, a second electrode layer 1320, a filler 1322, a sealing material 1332, insulating films 1301a and 1301b, a gate insulating layer 1310, insulating films 1311 and 1312, an insulating layer 1314, a sealing substrate 1325, a wiring layer 1333, a terminal electrode layer 1381, an anisotropic conductive layer 1382, and an FPC 1383. The display device also includes an external terminal connection region 222, a sealing region 223, a peripheral driver circuit region 224, and a pixel region 226. The filler 1322 can be formed by a droplet discharging method by being made into a state of a liquid composition. The element substrate 1300 over which the filler is formed by a droplet discharging method and the sealing substrate 1325 are attached to each other to seal the peripheral driver circuit region 224, the pixel region 226, and the like.

In the display device shown in FIG. 15, the surfaces of the insulating layer 1314 and the first electrode layer 1317 are nitrided or oxidized by plasma treatment, and the surfaces of the insulating layer 1314 and the first electrode layer 1317 are densified by this modification treatment. Further, the insulating film 1312 is also subjected to plasma treatment, and the surface of the insulating film 1312 is modified and densified by being nitrided or oxidized. In the sealing region 223, end portions of the gate insulating layer 1310, the insulating films 1311 and 1312 are etched into a taper shape, which are formed so that the wiring layer 1333 is covered. In performing plasma treatment to the insulating film 1312, coverage of the wiring layer 1333 can also be improved when the insulating film 1312 is processed so that the end portion has a curvature. Thus, by forming the wiring layer 1333 to the densified insulating film 1312 with excellent coverage, an effect of interrupting contaminant such as moisture to penetrate a display device is further enhanced.

The display device in FIG. 15 is a dual emission type, in which light is emitted from both the element substrate 1300 side and the sealing substrate 1325 side in directions indicated by arrows. Thus, a light-transmitting electrode layer is used for both the first electrode layer 1317 and the second electrode layer 1320.

In this embodiment mode, the first electrode layer 1317 and the second electrode layer 1320, each of which is a light-transmitting electrode layer, may be specifically formed by using a transparent conductive film formed of a light-transmitting conductive material, and indium oxide containing tungsten oxide, indium zinc oxide containing tungsten oxide, indium oxide containing titanium oxide, indium tin oxide containing titanium oxide, or the like can be used. Needless to say, indium tin oxide (ITO), indium zinc oxide (IZO), indium tin oxide added with silicon oxide (ITSO), or the like can be used.

An example of a composition ratio of each light-transmitting conductive material will be described. In indium oxide containing tungsten oxide, preferably, the composition ratio of tungsten oxide is 1.0 wt % and indium oxide is 99.0 wt %. In indium zinc oxide containing tungsten oxide, preferably, tungsten oxide is 1.0 wt %, zinc oxide is 0.5 wt %, and indium oxide is 98.5 wt %. In indium oxide containing titanium oxide, preferably, titanium oxide is 1.0 to 5.0 wt % and indium oxide is 99.0 to 95.0 wt %. In indium tin oxide (ITO), preferably, tin oxide is 10.0 wt % and indium oxide is 90.0 wt %. In indium zinc oxide (IZO), preferably, zinc oxide is 10.7 wt % and indium oxide is 89.3 wt %. Moreover, in indium tin oxide containing titanium oxide, in indium tin oxide containing titanium oxide, preferably, titanium oxide is 5.0 wt %, tin oxide is 10.0 wt %, and indium oxide is 85.0 wt %. The composition ratios as described above are just examples, and a composition ratio may be set appropriately.

In addition, even in a case of a non-light-transmitting material such as a metal film, when the thickness is made thin (preferably, approximately 5 to 30 nm) so as to be able to transmit light, light can be emitted from the first electrode layer 1317 and the second electrode layer 1320. As a metal thin film that can be used for the first electrode layer 1317 and the second electrode layer 1320, a conductive film formed of titanium, tungsten, nickel, gold, platinum, silver, aluminum, magnesium, calcium, lithium, and an alloy thereof; or the like can be used.

As described above, in the display device in FIG. 15, light emitted from a light-emitting element 1305 passes through both the first electrode layer 1317 and the second electrode layer 1320 to have a structure where light is emitted from both sides.

A display device in FIG. 14 has a structure of a top emission type in which light is emitted in a direction indicated by an arrow. FIG. 14 shows a display device, which includes an element substrate 1600, thin film transistors 1655, 1665, 1675 and 1685, a wiring layer 1624, a first electrode layer 1617, an electroluminescent layer 1619, a second electrode layer 1620, a protective film 1621, a filler 1622, a sealing material 1632, insulating films 1601a and 1601b, a gate insulating layer 1610, insulating films 1611 and 1612, an insulating layer 1614, a sealing substrate 1625, a wiring layer 1633, a terminal electrode layer 1681, an anisotropic conductive layer 1682, and an FPC 1683.

In the display device shown in FIG. 14, the surfaces of the insulating layer 1614 and the first electrode layer 1617 are nitrided or oxidized by plasma treatment, and the surfaces of the insulating layer 1614 and the first electrode layer 1617 are densified by this modification treatment. Further, the insulating film 1612 is also subjected to plasma treatment, and the surface of the insulating film 1612 is modified and densified by being nitrided or oxidized. In a sealing region 233, end portions of the gate insulating layer 1610, the insulating films 1611 and 1612 are etched into a taper shape, which are formed so that the wiring layer 1633 is covered. In performing plasma treatment to the insulating film 1612, coverage of the wiring layer 1633 can also be improved when the insulating film 1612 is processed so that the end portion has a curvature. Thus, by forming the wiring layer 1633 to the densified insulating film 1612 with excellent coverage, an effect of interrupting contaminant such as moisture to penetrate a display device is further enhanced.

In the display device in FIG. 14 and FIG. 15, the insulating layer stacked over the terminal electrode layer 1681 is removed by etching. In such a case of a structure where a permeable insulating layer is not provided at the periphery of a terminal electrode layer, reliability is improved. In addition, the display device also includes an external terminal connection region 232, the sealing region 233, a peripheral driver circuit region 234, and a pixel region 236. In this case, in the above dual emission display device shown in FIG. 15, the wiring layer 1624 which is a reflective metal layer is formed below the first electrode layer 1317, and the first electrode layer 1617 which is a transparent conductive film is formed over the wiring layer 1624. As the wiring layer 1624, a conductive film formed of titanium, tungsten, nickel, gold, platinum, silver, copper, tantalum, molybdenum, aluminum, magnesium, calcium, lithium, and an alloy thereof; or the like may be used as long as the material has reflectiveness. Preferably, a substance having high reflectiveness in a visible light region is used, and a TiN film is used in this embodiment mode.

The first electrode layer 1617 and the second electrode layer 1620 may be specifically formed by using a transparent conductive film formed of a light-transmitting conductive material, and indium oxide containing tungsten oxide, indium zinc oxide containing tungsten oxide, indium oxide containing titanium oxide, indium tin oxide containing titanium oxide, or the like can be used. Needless to say, indium tin oxide (ITO), indium zinc oxide (IZO), indium tin oxide added with silicon oxide (ITSO), or the like can be used.

In addition, even in a case of a non-light-transmitting material such as a metal film, when the thickness is made thin (preferably, approximately 5 to 30 nm) so as to be able to transmit light, light can be emitted from the second electrode layer 1620. As a metal thin film that can be used for the second electrode layer 1620, a conductive film formed of titanium, tungsten, nickel, gold, platinum, silver, aluminum, magnesium, calcium, lithium, and an alloy thereof; or the like can be used.

Structures of the light-emitting element 1305 and a light-emitting element 1605 applicable to this embodiment mode will be explained in detail with reference to FIGS. 18A to 18D.

FIGS. 18A to 18D each show an example of an element structure of a light-emitting element that can be used for the present invention, which is a light-emitting element where an electroluminescent layer 860, which is formed by mixing an organic compound and an inorganic compound, is sandwiched between a first electrode layer 870 and a second electrode layer 850. As shown in the figure, the electroluminescent layer 860 includes a first layer 804, a second layer 803, and a third layer 802, and there is a great feature especially in the first layer 804 and the third layer 802.

First, the first layer 804 is a layer which has a function of transporting holes to the second layer 803, and includes at least a first organic compound and a first inorganic compound having an electron-accepting property with respect to the first organic compound. What is important is that the first organic compound and the first inorganic compound are not only simply mixed but also the first inorganic compound has an electron-accepting property with respect to the first organic compound. This structure generates many hole-carriers in the first organic compound which has originally almost no inherent carriers, and an electron-injecting and an electron-transporting property which are highly excellent can be obtained.

Therefore, as for the first layer 804, not only advantageous effect that is considered to be obtained by mixing an inorganic compound (such as improvement in heat resistance) but also excellent conductivity (in particular, a hole-injecting property and a hole-transporting property in the first layer 804) can also be obtained. This excellent conductivity is advantageous effect that cannot be obtained in a conventional hole-transporting layer in which an organic compound and an inorganic compound that do not electronically interact with each other are simply mixed. This advantageous effect can make a drive voltage lower than conventionally. In addition, since the first layer 804 can be made thick without causing increase in a drive voltage, short circuit of the element due to a dust or the like can be suppressed.

However, it is preferable to use a hole-transporting organic compound as the first organic compound because hole-carriers are generated in the first organic compound as described above. Examples of the hole-transporting organic compound include, but are not limited to, phthalocyanine (abbreviation: $H_2Pc$), copper phthalocyanine (abbreviation: CuPc), vanadyl phthalocyanine (abbreviation: VOPc), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 1,3,5-tris[N,N-di(m-tolyl)amino]benzene (abbreviation: m-MTDAB), N,N'-diphenyl-N,N'-bis(3-methylphenyl)-1,1'-biphenyl-4,4'-diamine (abbreviation: TPD), 4,4'-bis[N-(1-naphthyl)-N-phenylamino]biphenyl (abbreviation: NPB), 4,4'-bis{N-[4-di(m-tolyl)amino]phenyl-N-phenylamino}biphenyl (abbreviation: DNTPD), 4,4',4"-tris(N-carbazolyl)triphenylamine (abbreviation: TCTA), and the like. In addition, among the compounds described above, an aromatic amine compound typified by TDATA, MTDATA, m-MTDAB, TPD, NPB, DNTPD, and TCTA can easily generate hole-carriers, and are suitable compound groups for the first organic compound.

On the other hand, the first inorganic compound may be any material as long as the material can easily accept electrons from the first organic compound, and various kinds of metal oxides and metal nitrides can be used. Any of transition metal oxides that belong to Groups 4 to 12 of the periodic table is preferable because an electron-accepting property is easily provided. Specifically, for example, titanium oxide, zirconium oxide, vanadium oxide, molybdenum oxide, tungsten oxide, rhenium oxide, ruthenium oxide, zinc oxide, and the like can be given. In addition, among the metal oxides described above, any of transition metal oxides that belong to Groups 4 to 8 of the periodic table mostly has a high electron-accepting property, which is a preferable group. In particular, vanadium oxide, molybdenum oxide, tungsten oxide, and rhenium oxide are preferable because they can be formed by vacuum evaporation and can be easily used.

Note that the first layer 804 may be formed by stacking a plurality of layers each including a combination of the organic compound and the inorganic compound as described above, or may further include another organic compound or inorganic compound.

Next, the third layer 802 will be explained. The third layer 802 is a layer which has a function of transporting electrons to the second layer 803, and includes at least a third organic compound and a third inorganic compound having an electron-donating property with respect to the third organic compound. What is important is that the third organic compound and the third inorganic compound are not only simply mixed but also the third inorganic compound has an electron-denoting property with respect to the third organic compound. This structure generates many electron-carriers in the third organic compound which has originally almost no inherent carriers, and an electron-injecting and an electron-transporting property which are highly excellent can be obtained.

Therefore, as for the third layer 802, not only advantageous effect that is considered to be obtained by mixing an inorganic compound (such as improvement in heat resistance) but also excellent conductivity (in particular, an electron-injecting property and an electron-transporting property in the third layer 802) can also be obtained. This excellent conductivity is advantageous effect that cannot be obtained in a conventional electron-transporting layer in which an organic compound and an inorganic compound that do not electronically interact with each other are simply mixed. This advantageous effect can make a drive voltage lower than conventionally. In addition, since the third layer 802 can be made thick without causing increase in a drive voltage, short circuit of the element due to a dust or the like can be suppressed.

However, it is preferable to use an electron-transporting organic compound as the third organic compound because electron-carriers are generated in the third organic compound as described above. Examples of the electron-transporting organic compound include, but are not limited to, tris(8-quinolinolato)aluminum (abbreviation: $Alq_3$), tris(4-methyl-8-quinolinolato)aluminum (abbreviation: $Almq_3$), bis(10-hydroxybenzo[h]-quinolinato)beryllium (abbreviation: $BeBq_2$), bis(2-methyl-8-quinolinolato)(4-phenylphenolato)aluminum (abbreviation: BAlq), bis[2-(2'-hydroxyphenyl)

benzoxazolato]zinc (abbreviation: $Zn(BOX)_2$), bis [2-(2'-hydroxyphenyl)benzothiazolato]zinc (abbreviation: $Zn(BTZ)_2$), bathophenanthroline (abbreviation: BPhen), bathocuproin (abbreviation: BCP), 2-(4-biphenylyl)-5-(4-tert-butylphenyl)-1,3,4-oxadiazole (abbreviation: PBD), 1,3-bis[5-(4-tert-butylphenyl)-1,3,4-oxadiazol-2-yl]benzene (abbreviation: OXD-7), 2,2',2"-(1,3,5-benzenetriyl)-tris(1-phenyl-1H-benzimidazole) (abbreviation: TPBI), 3-(4-biphenylyl)-4-phenyl-5-(4-tert-butylphenyl)-1,2,4-triazole (abbreviation: TAZ), 3-(4-biphenylyl)-4-(4-ethylphenyl)-5-(4-tert-butylphenyl)-1,2,4-triazole (abbreviation: p-EtTAZ), and the like. In addition, among the compounds mentioned above, chelate metal complexes having a chelate ligand including an aromatic ring typified by $Alq_3$, $Almq_3$, $BeBq_2$, BAlq, $Zn(BOX)_2$, and $Zn(BTZ)_2$, organic compounds having a phenanthroline skeleton typified by BPhen and BCP, and organic compounds having an oxadiazole skeleton typified by PBD and OXD-7 can easily generate electron-carriers, and are suitable compound groups for the third organic compound.

On the other hand, the third inorganic compound may be any material as long as the material can easily donate electrons to the third organic compound, and various kinds of a metal oxide and a metal nitride can be used. An alkali metal oxide, an alkaline-earth metal oxide, a rare-earth metal oxide, an alkali metal nitride, an alkaline-earth metal nitride, and a rare-earth metal nitride are preferable because an electron-donating property is easily provided. Specifically, for example, lithium oxide, strontium oxide, barium oxide, erbium oxide, lithium nitride, magnesium nitride, calcium nitride, yttrium nitride, lanthanum nitride, and the like can be given. In particular, lithium oxide, barium oxide, lithium nitride, magnesium nitride, and calcium nitride are preferable because they can be formed by vacuum evaporation and can be easily used.

Note that the third layer 802 may be formed by stacking a plurality of layers each including a combination of the organic compound and the inorganic compound as described above, or may further include another organic compound or inorganic compound.

Then, the second layer 803 will be explained. The second layer 803 is a layer which has a function of emitting light, and includes a second organic compound that has a light-emitting property. A second inorganic compound may also be included. The second layer 803 can be formed by using various light-emitting organic compounds and inorganic compounds. However, since it is believed to be hard to flow a current through the second layer 803 as compared with the first layer 804 or the third layer 802, the thickness of the second layer 803 is preferably approximately 10 to 100 nm.

The second organic compound is not particularly limited as long as it is a light-emitting organic compound, and examples of the second organic compound include, for example, 9,10-di(2-naphthyl)anthracene (abbreviation: DNA), 9,10-di(2-naphthyl)-2-tert-butylanthracene (abbreviation: t-BuDNA), 4,4'-bis(2,2-diphenylvinyl)biphenyl (abbreviation: DPVBi), coumarin 30, coumarin 6, coumarin 545, coumarin 545T, perylene, rubrene, periflanthene, 2,5,8,11-tetra(tert-butyl) perylene (abbreviation: TBP), 9,10-diphenylanthracene (abbreviation: DPA), 5,12-diphenyltetracene, 4-(dicyanomethylene)-2-methyl-[p-(dimethylamino)styryl]-4H-pyran (abbreviation: DCM1), 4-(dicyanomethylene)-2-methyl-6-[2-(julolidine-9-yl)ethenyl]-4H-pyran (abbreviation: DCM2), 4-(dicyanomethylene)-2,6-bis[p-(dimethylamino) styryl]-4H-pyran (abbreviation: BisDCM), and the like. In addition, it is also possible to use a compound capable of emitting phosphorescence such as bis[2-(4',6'-difluorophenyl)pyridinato-$N,C^{2'}$]iridium(picolinate) (abbreviation: FIrpic), bis{2-[3',5'-bis(trifluoromethyl)phenyl]pyridinato-$N,C^{2'}$}iridium(picolinate) (abbreviation: $Ir(CF_3ppy)_2(pic)$), tris(2-phenylpyridinato-$N,C^{2'}$)iridium (abbreviation: $Ir(ppy)_3$), bis(2-phenylpyridinato-$N,C^{2'}$)iridium(acetylacetonate) (abbreviation: $Ir(ppy)_2(acac)$), bis[2-(2'-thienyl)pyridinato-$N,C^{3'}$]iridium(acetylacetonate) (abbreviation: $Ir(thp)_2(acac)$), bis(2-phenylquinolinato-$N,C^{2'}$)iridium(acetylacetonate) (abbreviation: $Ir(pq)_2(acac)$), or bis[2-(2'-benzothienyl) pyridinato-$N,C^{3'}$]iridium(acetylacetonate) (abbreviation: $Ir(btp)_2(acac)$).

Further, a triplet excitation light-emitting material containing a metal complex or the like may be used for the second layer 803 in addition to a singlet excitation light-emitting material. For example, among pixels emitting red, green, and blue light, a pixel emitting red light whose luminance is reduced by half in a relatively short time is formed by using a triplet excitation light-emitting material and the other pixels are formed by using a singlet excitation light-emitting material. A triplet excitation light-emitting material has a feature of favorable light-emitting efficiency and less power consumption to obtain the same luminance. In other words, when a triplet excitation light-emitting material is used for a red pixel, only small amount of current needs to be applied to a light-emitting element; thus, reliability can be improved. A pixel emitting red light and a pixel emitting green light may be formed by using a triplet excitation light-emitting material and a pixel emitting blue light may be formed by using a singlet excitation light-emitting material to achieve low power consumption as well. Low power consumption can be further achieved by forming a light-emitting element emitting green light that has high visibility for human eyes by using a triplet excitation light-emitting material.

The second layer 803 may include not only the second organic compound as described above, which produces light-emission, but also another organic compound may also be added thereto. Examples of organic compounds that can be added include, but are not limited to, TDATA, MTDATA, m-MTDAB, TPD, NPB, DNTPD, TCTA, $Alq_3$, $Almq_3$, $BeBq_2$, BAlq, $Zn(BOX)_2$, $Zn(BTZ)_2$, BPhen, BCP, PBD, OXD-7, TPBI, TAZ, p-EtTAZ, DNA, t-BuDNA, and DPVBi, which are mentioned above, and further, 4,4'-bis(N-carbazolyl)biphenyl (abbreviation: CBP), 1,3,5-tris[4-(N-carbazolyl)phenyl]benzene (abbreviation: TCPB), and the like. It is preferable that the organic compound, which is added in addition to the second organic compound, has larger excitation energy than that of the second organic compound and be added by the larger amount than the second organic compound in order to make the second organic compound emit light efficiently (which makes it possible to prevent concentration quenching of the second organic compound). Alternatively, as another function, the added organic compound may emit light along with the second organic compound (which makes it possible to emit white light or the like).

The second layer 803 may have a structure to perform color display by providing each pixel with a light-emitting layer having a different emission wavelength range. Typically, a light-emitting layer corresponding to each color of R (red), G (green), and B (blue) is formed. Also in this case, color purity can be improved and a pixel portion can be prevented from having a mirror surface (reflection) by providing the light-emission side of the pixel with a filter which transmits light of an emission wavelength range of the light. By providing a filter, a circularly polarizing plate or the like that has been conventionally required can be omitted, and further, the loss of light emitted from the light-emitting layer can be eliminated. Further, change in a color tone, which occurs when a pixel portion (display screen) is obliquely seen, can be reduced.

Either a low-molecular organic light-emitting material or a high-molecular organic light-emitting material may be used for a material of the second layer 803. A high-molecular organic light-emitting material is physically stronger as compared with a low-molecular material and is superior in durability of the element. In addition, a high-molecular organic light-emitting material can be formed by coating; therefore, the element can be relatively easily manufactured.

The emission color is determined depending on a material forming the light-emitting layer; therefore, a light-emitting element which exhibits desired light-emission can be formed by selecting an appropriate material for the light-emitting layer. As a high-molecular electroluminescent material which can be used for forming a light-emitting layer, a polyparaphenylene-vinylene-based material, a polyparaphenylene-based material, a polythiophene-based material, or a polyfluorene-based material can be used.

As the polyparaphenylene-vinylene-based material, a derivative of poly(paraphenylenevinylene) [PPV] such as poly(2,5-dialkoxy-1,4-phenylenevinylene) [RO-PPV], poly (2-(2'-ethyl-hexoxy)-5-methoxy-1,4-phenylenevinylene) [MEH-PPV], or poly(2-(dialkoxyphenyl)-1,4-phenylenevi-nylene) [ROPh-PPV] can be given. As the polyparaphenylene-based material, a derivative of polyparaphenylene [PPP] such as poly(2,5-dialkoxy-1,4-phenylene) [RO-PPP] or poly(2,5-dihexoxy-1,4-phenylene) can be given. As the polythiophene-based material, a derivative of polythiophene [PT] such as poly(3-alkylthiophene) [PAT], poly(3-hexylthiophen) [PHT], poly(3-cyclohexylthiophen) [PCHT], poly (3-cyclohexyl-4-methylthiophene) [PCHMT], poly(3,4-dicyclohexylthiophene) [PDCHT], poly[3-(4-octylphenyl)-thiophene] [POPT], or poly[3-(4-octylphenyl)-2,2 bithiophene] [PTOPT] can be given. As the polyfluorene-based material, a derivative of polyfluorene [PF] such as poly(9,9-dialkylfluorene) [PDAF] or poly(9,9-dioctylfluo-rene) [PDOF] can be given.

The second inorganic compound may be any inorganic compound as long as light-emission of the second organic compound is not easily quenched by the inorganic compound, and various kinds of metal oxides and metal nitrides can be used. In particular, a metal oxide having a metal that belongs to Group 13 or 14 of the periodic table is preferable because light-emission of the second organic compound is not easily quenched, and specifically, aluminum oxide, gallium oxide, silicon oxide, and germanium oxide are preferable. However, the second inorganic compound is not limited thereto.

Note that the second layer 803 may be formed by stacking a plurality of layers each including a combination of the organic compound and the inorganic compound as described above, or may further include another organic compound or inorganic compound. A layer structure of the light-emitting layer can be changed, and an electrode layer for injecting electrons may be provided or a light-emitting material may be dispersed, instead of providing no specific electron-injecting region or light-emitting region. Such a change can be permitted unless it departs from the spirit of the present invention.

A light-emitting element formed by using the above materials emits light by being forwardly biased. A pixel of a display device which is formed by using a light-emitting element can be driven by a simple matrix (passive matrix) mode or an active matrix mode. In any case, each pixel emits light by applying a forward bias thereto at a specific timing; however, the pixel is in a non-emitting state for a certain period. Reliability of a light-emitting element can be improved by applying a reverse bias in the non-emitting time. In a light-emitting element, there is a deterioration mode in which emission intensity is decreased under constant driving conditions or a deterioration mode in which a non-light-emitting region is enlarged in the pixel and luminance is apparently decreased. However, progression of deterioration can be slowed down by alternating current driving where bias is applied forwardly and reversely; thus, reliability of a light-emitting display device can be improved. Additionally, either digital driving or analog driving can be applied.

A color filter (colored layer) may be formed over a sealing substrate. The color filter (colored layer) can be formed by an evaporation method or a droplet discharging method. High-resolution display can be performed with the use of the color filter (colored layer). This is because a broad peak can be modified to be sharp in an emission spectrum each of R, G, and B by the color filter (colored layer).

Full color display can be performed by forming a material emitting light of a single color and combining with a color filter or a color conversion layer. Preferably, the color filter (colored layer) or the color conversion layer is formed over, for example, a second substrate (a sealing substrate) and attached to a substrate.

Needless to say, display of a single color emission may also be performed. For example, an area color type display device may be manufactured by using single color emission. The area color type is suitable for a passive matrix display portion, and can mainly display characters and symbols.

Figure 18A:
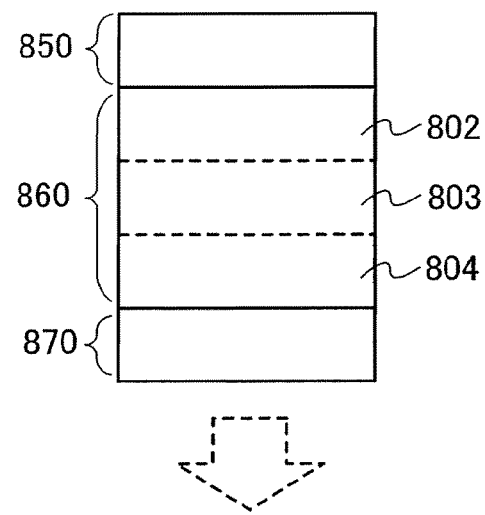
FIGS. 18A to 18D are diagrams each explaining a structure of a light-emitting element applicable to the present invention.
Figure 18B:
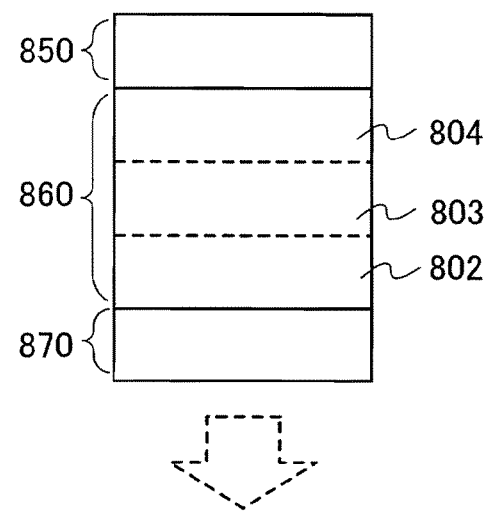

Materials of the first electrode layer 870 and the second electrode layer 850 are required to be selected considering the work function. The first electrode layer 870 and the second electrode layer 850 can be either an anode or a cathode depending on the pixel structure. In a case where polarity of a driving thin film transistor is a p-channel type, the first electrode layer 870 preferably serves as an anode and the second electrode layer 850 preferably serves as a cathode as shown in FIG. 18A. In a case where polarity of the driving thin film transistor is an n-channel type, the first electrode layer 870 preferably serves as a cathode and the second electrode layer 850 preferably serves as an anode as shown in FIG. 18B. Materials that can be used for the first electrode layer 870 and the second electrode layer 850 will be described. It is preferable to use a material having a higher work function (specifically, a material having a work function of 4.5 eV or more) for one of the first electrode layer 870 and the second electrode layer 850, which serves as an anode, and a material having a lower work function (specifically, a material having a work function of 3.5 eV or less) for the other electrode layer which serves as a cathode. However, since the first layer 804 is superior in a hole-injecting property and a hole-transporting property and the third layer 802 is superior in an electron-injecting property and an electron transporting property, both of the first electrode layer 870 and the second electrode layer 850 are scarcely restricted by a work function, and various materials can be used.

The light-emitting elements shown in FIGS. 18A and 18B have a structure where light is extracted from the first electrode layer 870; thus, the second electrode layer 850 is not always required to have a light-transmitting property. The second electrode layer 850 is preferably formed of a film mainly containing an element of Ti, Ni, W, Cr, Pt, Zn, Sn, In, Ta, Al, Cu, Au, Ag, Mg, Ca, Li and Mo, or an alloy material or a compound material containing the element as its main component such as TiN, $TiSi_xN_y$, $WSi_x$, $WN_x$, $WSi_xN_y$, or NbN; or a stacked film thereof in a total film thickness of 100 to 800 nm.

The second electrode layer 850 can be formed by an evaporation method, a sputtering method, a CVD method, a printing method, a dispenser method, a droplet discharging method, or the like.

In addition, when the second electrode layer 850 is formed by using a light-transmitting conductive material similarly to the material used for the first electrode layer 870, light is also extracted from the second electrode layer 850, and a dual emission structure can be obtained, in which light emitted from the light-emitting element is emitted from both the first electrode layer 870 side and the second electrode layer 850 side.

Note that the light-emitting element of the present invention has variations by changing types of the first electrode layer 870 and the second electrode layer 850.

FIG. 18B shows a case where the third layer 802, the second layer 803, and the first layer 804 are sequentially provided from the first electrode layer 870 side in the electroluminescent layer 860.

As described above, in the light-emitting element applicable to the present invention, the layer interposed between the first electrode layer 870 and the second electrode layer 850 is formed of the electroluminescent layer 860 including a layer in which an organic compound and an inorganic compound are combined. The light-emitting element is an organic-inorganic composite light-emitting element provided with layers (that is, the first layer 804 and the third layer 802) that provide functions called a high carrier-injecting property and carrier-transporting property by mixing an organic compound and an inorganic compound, where the functions are not obtainable from only either one of the organic compound or the inorganic compound. In addition, the first layer 804 and the third layer 802 are particularly required to be layers in which an organic compound and an inorganic compound are combined when provided on the first electrode layer 870 side, and may also contain only one of an organic compound and an inorganic compound when provided on the second electrode layer 850 side.

Further, various methods can be used as a method for forming the electroluminescent layer 860, which is a layer in which an organic compound and an inorganic compound are mixed. For example, the methods include a co-evaporation method of evaporating both an organic compound and an inorganic compound by resistance heating. Besides, for co-evaporation, an inorganic compound may be evaporated by an electron beam (EB) while evaporating an organic compound by resistance heating. Moreover, the methods also include a method of sputtering an inorganic compound while evaporating an organic compound by resistance heating to deposit the both at the same time. In addition, the electroluminescent layer may also be formed by a wet method.

In the same manner, for the first electrode layer 870 and the second electrode layer 850, evaporation by resistance heating, EB evaporation, sputtering, a wet method, or the like can be used.

Figure 18C:
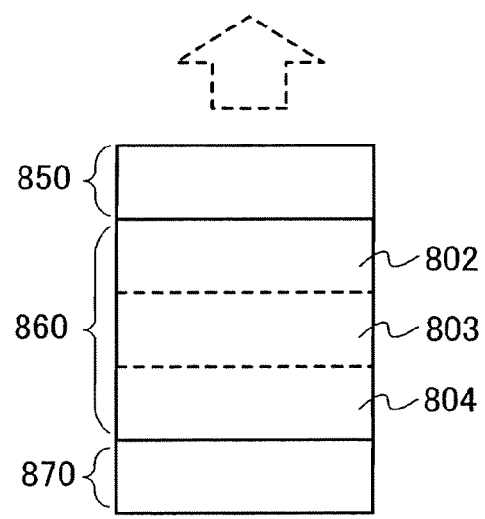
Figure 18D:
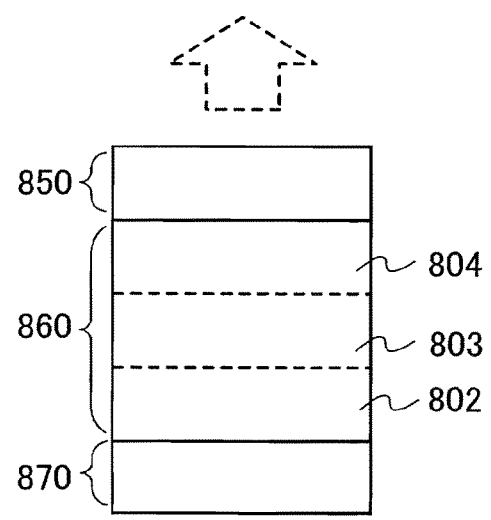

In FIG. 18C, an electrode layer having reflectivity is used for the first electrode layer 870, and an electrode layer having a light-transmitting property is used for the second electrode layer 850 in the structure of FIG. 18A. Light emitted from the light-emitting element is reflected by the first electrode layer 870, transmitted through the second electrode layer 850, and is emitted to outside. In the same manner, in FIG. 18D, an electrode layer having reflectivity is used for the first electrode layer 870, and an electrode layer having a light-transmitting property is used for the second electrode layer 850 in the structure of FIG. 18B. Light emitted from the light-emitting element is reflected by the first electrode layer 870, transmitted through the second electrode layer 850, and is emitted to outside.

This embodiment mode can be implemented by being arbitrarily combined with each of Embodiment Modes 1 to 4 described above.

By applying the present invention, a highly reliable display device can be manufactured. Thus, a high resolution and high performance display device can be manufactured with high yields.

Embodiment Mode 6

Another embodiment mode of the present invention will be described with reference to FIGS. 13A to 13C. This embodiment mode shows an example in which a structure of a gate electrode layer of a thin film transistor is different from the one of the display device manufactured in Embodiment Mode 1. Thus, explanations of the same portions or portions having the same functions will be omitted.

FIGS. 13A to 13C each show a display device in a manufacturing step, which correspond to the display device of FIG. 4B shown in Embodiment Mode 3.

In FIG. 13A, thin film transistors 273 and 274 are provided in a peripheral driver circuit region 214, and thin film transistors 275 and 276 are provided in a pixel region 216. A gate electrode layer of the thin film transistor in FIG. 13A is formed by a stacked structure of two conductive films, and the upper gate electrode layer is processed to have a width narrower than that of the lower gate electrode layer. The lower gate electrode layer has a taper shape; however, the upper gate electrode layer does not have a taper shape. As described here, the gate electrode layer may have a taper shape, or a shape without a taper portion, in which an angle of a side surface is almost perpendicular.

In FIG. 13B, thin film transistors 373 and 374 are provided in the peripheral driver circuit region 214, and thin film transistors 375 and 376 are provided in the pixel region 216. A gate electrode layer of the thin film transistor in FIG. 13B is also formed by a stacked structure of two conductive films, and the upper gate electrode layer and the lower gate electrode layer have a continuous taper shape.

In addition, in FIG. 13B, a surface of a gate insulating layer 377 is nitrided or oxidized by plasma treatment. The plasma treatment may be performed under the same condition as in Embodiment Mode 1. Since the surface of the gate insulating layer 377 is densified by this modification treatment, the film thickness of the gate insulating layer 377 is not decreased while the film thicknesses of the gate insulating layers in FIGS. 13A and 13C are decreased by etching in forming the gate electrode layer. Thus, the gate insulating layer 377 can cover a semiconductor layer enough; therefore, a short between other conductive layers and the semiconductor layer due to failure in coverage of the gate insulating layer, or the like can be prevented.

In FIG. 13C, thin film transistors 473 and 474 are provided in the peripheral driver circuit region 214, and thin film transistors 475 and 476 are provided in the pixel region 216. A gate electrode layer of the thin film transistor in FIG. 13C has a single layer structure and a taper shape. The gate electrode layer may also have a single layer structure like this.

In the display device shown in FIG. 13C, a gate insulating layer is formed by a gate insulating layer 477 and a gate insulating layer 478 that is selectively provided over the gate insulating layer 477. In such a manner, the gate insulating layer 478 may be selectively provided below the gate electrode layer, and an end portion thereof may have a taper shape. In FIG. 13C, both of the end portion of the gate insulating layer 478 and an end portion of the gate electrode layer that is formed over the gate insulating layer 478 have a taper shape, and are formed continuously; however, they may also be formed discontinuously so as to have a step. In this embodiment mode, the gate insulating layer 477 is formed by using a silicon oxynitride film and the gate insulating layer 478 is formed by using a silicon nitride film.

As described above, the gate electrode layer can have various structures in accordance with a structure and a shape thereof. Thus, a display device to be manufactured has also various structures. When an impurity region in a semiconductor layer is formed in a self-alignment manner using the gate electrode layer as a mask, a structure or a concentration distribution of the impurity region is changed depending on the structure of the gate electrode layer. By designing in consideration with the above matters, a thin film transistor having a desired function can be manufactured.

This embodiment mode can be implemented by being arbitrarily combined with each of Embodiment Modes 1 to 5.

Embodiment Mode 7

This embodiment mode will be explained with reference to FIG. 11. This embodiment mode will explain an example in which a first interlayer insulating layer and a second interlayer insulating layer are not formed by using a thin film transistor as a channel etch type reverse stagger thin film transistor in the display device manufactured in Embodiment Mode 3. Thus, explanations of the same portions or portions having the same functions will be omitted.

Figure 11:
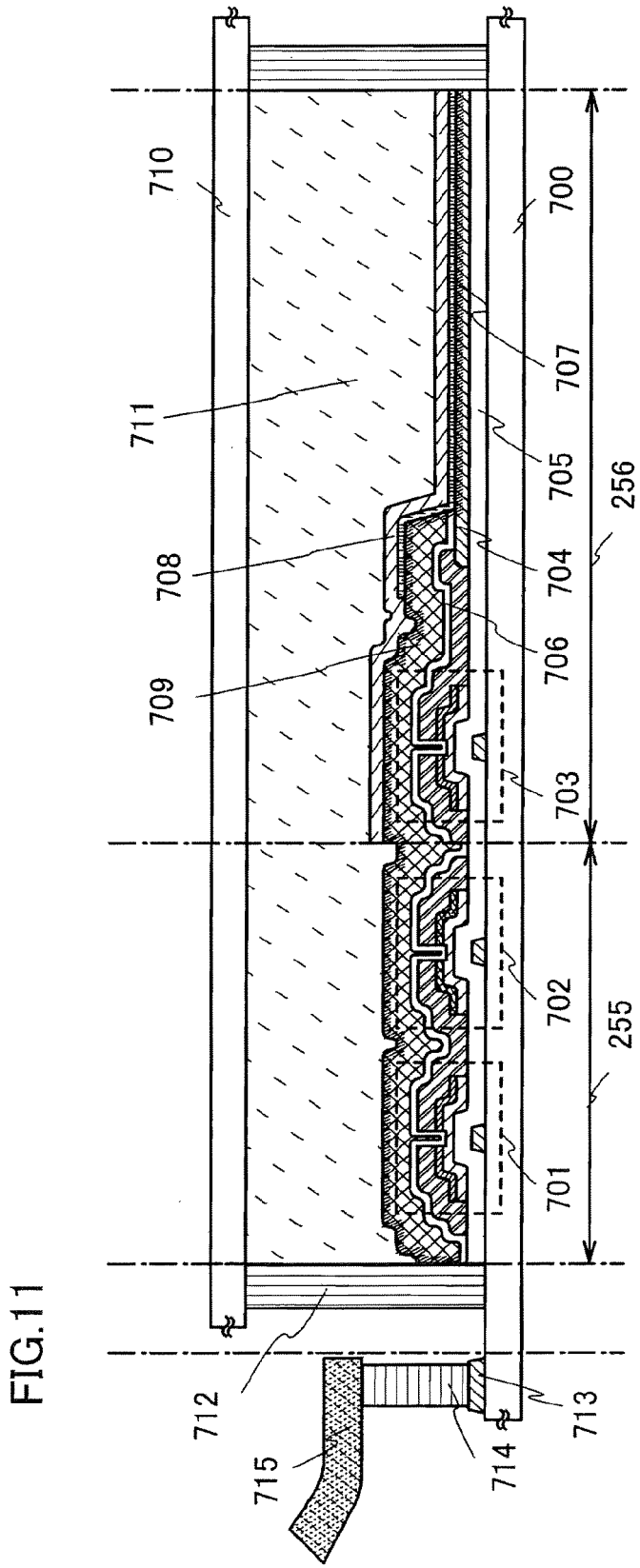
FIG. 11 is a view explaining a display device of the present invention.

FIG. 11 shows a display device, which includes, over a substrate 700, reverse stagger thin film transistors 701 and 702 in a peripheral driver circuit region 255; a reverse stagger thin film transistor 703, a first electrode layer 704, a gate insulating layer 705, an insulating film 706, an insulating layer 709, an electroluminescent layer 707, a second electrode layer 708, a filler 711, and a sealing substrate 710 in a pixel region 256; and a sealing material 712, a terminal electrode layer 713, an anisotropic conductive layer 714, and an FPC 715 in a sealing region.

A gate electrode layer, a source electrode layer, and a drain electrode layer of each of the reverse stagger thin film transistors 701, 702, and 703 manufactured in this embodiment mode are formed by a droplet discharging method. The droplet discharging method is a method for discharging a composition containing a liquid conductive material and solidifying the composition by drying and baking, thereby forming a conductive layer and an electrode layer. By discharging a composition containing an insulating material and solidifying it by drying and baking, an insulating layer can also be formed. By the droplet discharging method, a constituent of a display device such as a conductive layer and an insulating layer can be selectively formed, which can simplify the manufacturing steps and reduce the loss of materials; thus, a display device can be manufactured at low cost with high productivity.

A droplet discharging means used for the droplet discharging method is a generic term of a means of discharging droplets such as a head provided with a nozzle having a discharge outlet of a composition, or one or a plurality of nozzles. A diameter of a nozzle of a droplet discharging means is set 0.02 to 100 μm (preferably, 30 μm or less) and a discharged amount of a composition from the nozzle is set 0.001 to 100 pl (preferably, 0.1 to 40 pl, and much preferably 10 pl or less). The discharged amount increases in proportion to the diameter of nozzle. A distance between an object and the discharge outlet of the nozzle is preferably as close as possible for discharging at a desired position, which is preferably set 0.1 to 3 mm (much preferably, 1 mm or less).

In the case of forming a film (such as an insulating film or a conductive film) by a droplet discharging method, the film is formed as follows: a composition containing a film material, which is processed into a particle form, is discharged, and fused or welded by baking to solidify the composition as a film. Whereas many of films formed by a sputtering method or the like have a columnar structure, many of films formed by discharging and baking the composition containing a conductive material in this manner have a polycrystalline structure having a large number of grain boundaries.

As the composition discharged from the discharge outlet, a composition in which the conductive material is dissolved or dispersed in a solvent is used. The conductive material may include fine particles or dispersion nanoparticles of metal such as Ag, Au, Cu, Ni, Pt, Pd, Ir, Rh, W, and Al; metal sulfide of Cd and Zn; an oxide of Fe, Ti, Si, Ge, Zr, Ba, and the like; and fine particles or dispersion nanoparticles of silver halide or the like. The conductive material may be a mixture thereof. Although a transparent conductive film transmits light while exposing a back surface because it has a light-transmitting property, a transparent conductive film can be used as a stacked body with a material that does not transmit light. As the transparent conductive film, indium tin oxide (ITO), ITSO containing indium tin oxide and silicon oxide, organic indium, organic tin, zinc oxide, titanium nitride, or the like can be used. Moreover, indium zinc oxide (IZO) containing zinc oxide (ZnO), zinc oxide (ZnO), ZnO doped with gallium (Ga), tin oxide ($SnO_2$), indium oxide containing tungsten, oxide, indium zinc oxide containing tungsten oxide, indium oxide containing titanium oxide, indium tin oxide containing titanium oxide, or the like may also be used. However, as the composition discharged from the discharge outlet, a composition in which any of gold, silver, and copper is dissolved or dispersed in a solvent is preferably used by considering a specific resistance value, and much preferably, silver and copper having low resistance is used. However, in a case of using silver or copper, it is preferable to provide a barrier film as a measure against an impurity. As the barrier film, a silicon nitride film or nickel boron (NiB) can be used.

The composition to be discharged is a conductive material dissolved or dispersed in a solvent, which contains a dispersant, or a thermosetting resin referred to as a binder as well. In particular, the binder has a function of preventing the generation of cracks or uneven baking during baking. Thus, a conductive layer to be formed may contain an organic material in some cases. The organic material to be contained depends on heating temperature, atmosphere, or time. This organic material is an organic resin or the like which serves as a binder, a solvent, a dispersant, or a coating agent of metal particles. A typical example thereof is an organic resin such as polyimide, acrylic, a novolac resin, a melamine resin, a phenol resin, an epoxy resin, a silicone resin, a furan resin, or a diallyl phthalate resin.

In addition, particle in which a conductive material is coated with other conductive materials to be a plurality of layers may be used. For example, a three-layer structure particle in which copper is coated with nickel boron (NiB), and then coated with silver may be used. As for such solvents, esters such as butyl acetate or ethyl acetate; alcohols such as isopropyl alcohol or ethyl alcohol; organic solvents such as methyl ethyl ketone or acetone; water; or the like is used. The viscosity of the composition is preferably 20 mPa·s (cp) or less. This is because the composition is prevented from drying or the composition is smoothly discharged from the discharge outlet when discharged. The surface tension of the composition is preferably 40 mN/m or less. However, the viscosity of the composition and the like may be appropriately adjusted in accordance with a solvent to be used and intended use. For example, the viscosity of a composition in which ITO, organic indium, or organic tin is dissolved or dispersed in the solvent is from 5 to 20 mPa·s; the viscosity of a composition in which silver is dissolved or dispersed in the solvent is from 5 to 20 mPa·s; and the viscosity of a composition in which gold is dissolved or dispersed in the solvent is from 5 to 20 mPa·s.

The conductive layer may be formed by stacking a plurality of conductive materials. In addition, the conductive layer is preferably formed by a droplet discharging method by using silver as a conductive material, and then the conductive layer may be plated with copper or the like. Plating is preferably performed by electroplating or a chemical (electroless) plating method. Plating may be performed by soaking a substrate surface into a container filled with a solution having a plating material. A solution having a plating material may be applied so that the solution flows over the substrate surface with the substrate placed obliquely (or vertically). When the plating is performed by applying a solution with the substrate placed obliquely, there is an advantage of miniaturizing a process apparatus.

The diameter of particles of the conductive material is preferably as small as possible for the purpose of preventing clogged nozzles and manufacturing a high-resolution pattern, although it depends on the diameter of each nozzle, a desired shape of a pattern, and the like. Preferably, the diameter of the particles of the conductive material is 0.1 μm or less. The compound is formed by various methods such as an electrolyzing method, an atomizing method, and a wet reducing method, and the particle size thereof is typically about from 0.01 to 10 μm. However, when a gas evaporation method is employed, a nanomolecule protected with a dispersant is as minute as about 7 nm. When each surface of particles is covered with a coating agent, the nanoparticles do not cohere in the solvent and are uniformly dispersed in the solvent at a room temperature, and show a property similar to that of liquid. Thus, it is preferable to use a coating agent.

The step of discharging the composition may be performed under reduced pressure. The step of discharging the composition is preferably performed under reduced pressure because an oxide film or the like is not formed over the surfaces of the conductive layers. After discharging the composition to the substrate, one or both of a drying step and a baking step is/are performed. Each of the drying step and baking step is a step of heat treatment. For example, the drying step is performed at a temperature of 100° C. for 3 minutes whereas the baking step is performed at temperatures of 200 to 350° C. for 15 to 60 minutes, and the purposes, temperatures, and time thereof vary. The drying and baking steps are performed at a normal pressure or under reduced pressure by laser light irradiation, rapid thermal annealing, a heating furnace, or the like. Further, the timing of performing the heat treatment and number of the heat treatment are not particularly limited. The substrate may be heated in advance so as to perform the drying and baking steps well. At this time, the heating temperature depends on a material of the substrate and the like, but it is generally set to be 100 to 800° C. (preferably, 200 to 350° C.). According to this process, the nanometer-size particles are in contact with one another and fusing together and fusing bond are accelerated by hardening and shrinking resin in the periphery as well as volatilizing the solvent in the composition or removing the dispersing agent chemically.

A continuous wave, or pulsed gas laser or solid state laser may be used for laser light irradiation. An excimer laser, a YAG laser, and the like are given for the former gas laser, while lasers using crystals such as YAG, $YVO_4$ and $GdVO_4$ doped with Cr, Nd and the like are given for the latter solid state laser. Preferably, the continuous wave laser is used in relation to the rate of absorption of laser light. Alternatively, a laser irradiation method combining a pulsed oscillation and a continuous wave may be employed. Further, the heat treatment using laser light may be instantaneously performed for several microseconds to several ten seconds so as not to destroy the substrate according to heat resistance of the substrate 100. Rapid thermal annealing (RTA) is performed by instantaneously heating the substrate 100 for several microseconds to several minutes while rapidly raising the temperature with an infrared lamp, a halogen lamp, or the like that emits ultraviolet light through infrared light under an inert gas atmosphere. Since this treatment is performed instantaneously, only a thin film of a top surface is substantially heated so that underlying films are not adversely affected. In other words, this heat treatment does not adversely affect a substrate having low heat resistance such as a plastic substrate.

After forming the conductive layer and the insulating layer by discharging a liquid composition by a droplet discharging method, the surfaces thereof may be planarized by applying pressure so as to increase the planarity. As the method for pressing the surfaces of the conductive layer and the insulating layer, a roller or the like may scan the surfaces to level the unevenness, or the surfaces may be pressed with a flat plate or the like. In pressing the surfaces, a heating step may also be performed. Alternatively, the surfaces of the conductive layer and the insulating layer may be softened or dissolved by using a solvent or the like and the unevenness may be removed by an air knife. Still alternatively, the unevenness may be polished by a CMP method. This step can be arbitrarily applied in the case where unevenness occurs due to the droplet discharging method so as to level the uneven surface.

In this embodiment mode, an amorphous semiconductor is used as a semiconductor layer, and a semiconductor layer having one conductivity type may be formed if necessary. In this embodiment mode, amorphous N-type semiconductor layers are stacked as the semiconductor layer and the semiconductor layer having one conductivity type. In addition, an NMOS structure having an N-channel TFT formed using an N-type semiconductor layer, a PMOS structure having a P-channel TFT formed using a P-type semiconductor layer, and a CMOS structure having an N-channel TFT and a P-channel TFT can be manufactured. In this embodiment mode, the reverse stagger thin film transistors 701 and 703 are each formed of an N-channel TFT, whereas the reverse stagger thin film transistor 702 is formed of a P-channel TFT, and the reverse stagger thin film transistors 701 and 702 each have a CMOS structure in the peripheral driver circuit region 255.

In addition, in order to impart conductivity, an N-channel TFT and a P-channel TFT can also be formed by adding an element imparting conductivity by doping and forming an impurity region in a semiconductor layer. Instead of forming the N-type semiconductor layer, conductivity may be imparted to the semiconductor layer by performing plasma treatment with a $PH_3$ gas.

A semiconductor may be formed using an organic semiconductor material by a printing method, a spray method, a spin coating method, a droplet discharging method, a dispenser method or the like. In this case, since the above etching step is not required, the number of steps can be reduced. As an organic semiconductor, a low molecular organic material, a high molecular organic material, an organic coloring matter, a conductive high molecular organic material, or the like can be employed. Desirably, a p-conjugated high molecular material with skeleton including conjugated double bonds is used as an organic semiconductor material used in the present invention. Typically, a soluble high molecular material such as polythiophene, polyfluorene, poly(3-alkyl thiophene), a polythiophene derivative, or pentacene can be used.

As a structure of a light-emitting element applicable to the present invention, the structure as described in the above embodiment mode can be used.

In the present invention, the insulating layer to be a partition and the first electrode layer are subjected to plasma treatment. By performing plasma treatment under a nitrogen atmosphere or an oxygen atmosphere, surfaces of the insulating layer and the first electrode layer are nitrided or oxidized. When the insulating layer and the first electrode layer are oxidized or nitrided (or may be both oxidized and nitrided) by using plasma treatment, surfaces of the insulating layer and the first electrode layer are modified, and an insulating layer and a first electrode layer which are much denser can be obtained. Thus, characteristics or the like of the display device can be improved by suppressing a defect such as a pinhole.

In this embodiment mode, the surfaces of the insulating layer 709 and the first electrode layer 704 are nitrided or oxidized by plasma treatment, and the surfaces of the insulating layer 709 and the first electrode layer 704 are densified by this modification treatment. Thus, contaminant such as moisture is not transmitted; therefore, a light-emitting element can be prevented from being deteriorated due to contaminant penetrated from outside of a display device.

This embodiment mode can be implemented by being arbitrarily combined with each of Embodiment Modes 1 to 6.

By applying the present invention, a highly reliable display device can be manufactured. Thus, a high resolution and high performance display device can be manufactured with high yields.

Embodiment Mode 8

Figure 24:
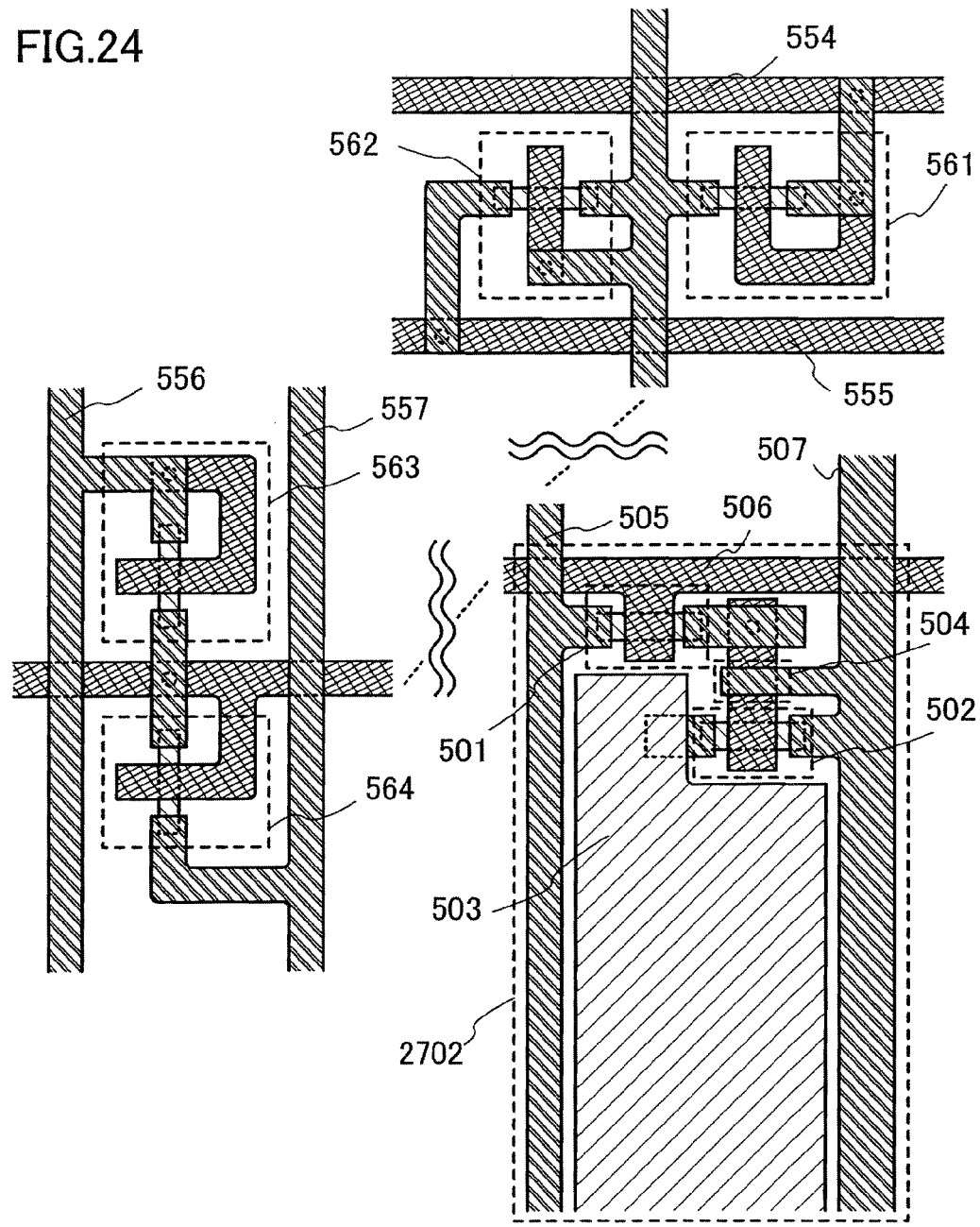
FIG. 24 is a diagram explaining a display device of the present invention.

One mode in which a protective diode is provided for a scanning line input terminal portion and a signal line input terminal portion will be explained with reference to FIG. 24. In FIG. 24, a pixel 2702 is provided with TFTs 501 and 502, a capacitor element 504, a pixel electrode layer 503, a gate electrode layer 506 and a source or drain electrode layer 507 which functions as a power supply line.

Figure 23:
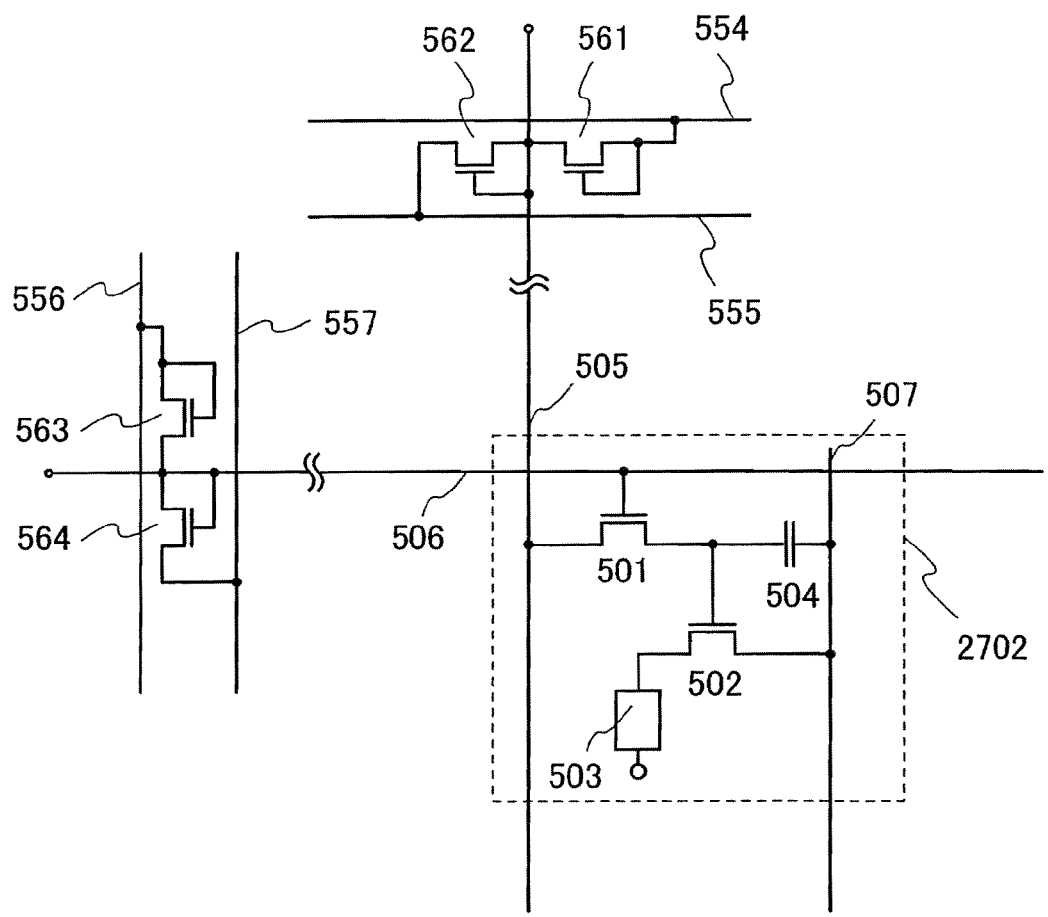
FIG. 23 is an equivalent circuit diagram of a display device explained in FIG. 24.

Protective diodes 561 and 562 are provided in the signal line input terminal portion. These protective diodes are manufactured by the same steps to the TFTs 501 and 502; therefore, a gate and one of a drain and a source are connected to operate as a diode. FIG. 23 shows an equivalent circuit diagram of a top view of FIG. 24.

The protective diode 561 includes a gate electrode layer, a semiconductor layer, and a wiring layer. The protective diode 562 has the same structure. Common potential lines 554 and 555 connected to these protective diodes are formed of the same layer as the gate electrode layer. Thus, a contact hole is required to be formed in an insulating layer so as to be electrically connected to the wiring layer.

A contact hole in the insulating layer may be formed by forming a mask layer and applying etching thereto. In this case, by applying etching of atmospheric pressure discharge, local electric discharge can be performed, in which case a mask layer is not required to be formed over the entire surface of the substrate.

The signal wiring layer is formed of the same layer as a source and drain wiring layer 505. The signal wiring layer, and the source or drain side are connected to each other.

An input terminal portion on the scanning signal line side has the same structure. A protective diode 563 includes a gate electrode layer, a semiconductor layer, and a wiring layer. A protective diode 564 has the same structure. Common potentials 556 and 557, which are connected to these protective diodes, are formed of the same layer as the source and drain electrode layers. The protective diodes provided in the input stage can be formed at the same time. Note that the protective diode is not limited to be disposed at a position shown in this embodiment mode, but may be disposed between a driver circuit and a pixel.

As shown in the top view of FIG. 24, the wiring layer has a pattern where a corner that is a right triangle in each edge bent into an L shape is removed so that one side of the triangle is 10 µm or less, or equal to or longer than one-fifth the width of the wiring layer and equal to or shorter than half the width of the wiring layer; therefore, the edge is rounded. In other words, the circumference of the wiring layer in the edge is curved when seen from above. Specifically, in order to form a round circumference of the edge, part of the wiring layer is removed, which corresponds to an isosceles right triangle having two first straight lines that are perpendicular to each other making the edge, and a second straight line that makes an angle of about 45 degrees with the two first straight lines. When removing the triangle, two obtuse angles are formed in the wiring layer. At this time, the wiring layer is preferably etched by appropriately adjusting the etching conditions and/or a mask design so that a curved line in contact with the first straight line and the second straight line is formed in each obtuse angle portion. Note that the length of the two sides of the isosceles right triangle, which are equal to each other, is equal to or longer than one-fifth the width of the wiring layer and equal to or shorter than half the width of the wiring layer. In addition, the inner circumference of the edge is also made curved in accordance with the circumference of edge.

In such a wiring layer, the corner and the portion where the wiring width changes are curved, generation of fine particles due to abnormal discharge can be suppressed in dry etching using plasma. In addition, even when fine particles which tend to gather at a depressed portion are generated, the fine particles can be washed, and yield can be expected to increase significantly. In other words, the problems of dusts and fine particles in manufacturing steps can be solved. Moreover, the round corner of the wiring allows electrical conduction. Further, dusts in multiple parallel wirings can be washed effectively.

Embodiment Mode 9

Figure 25:
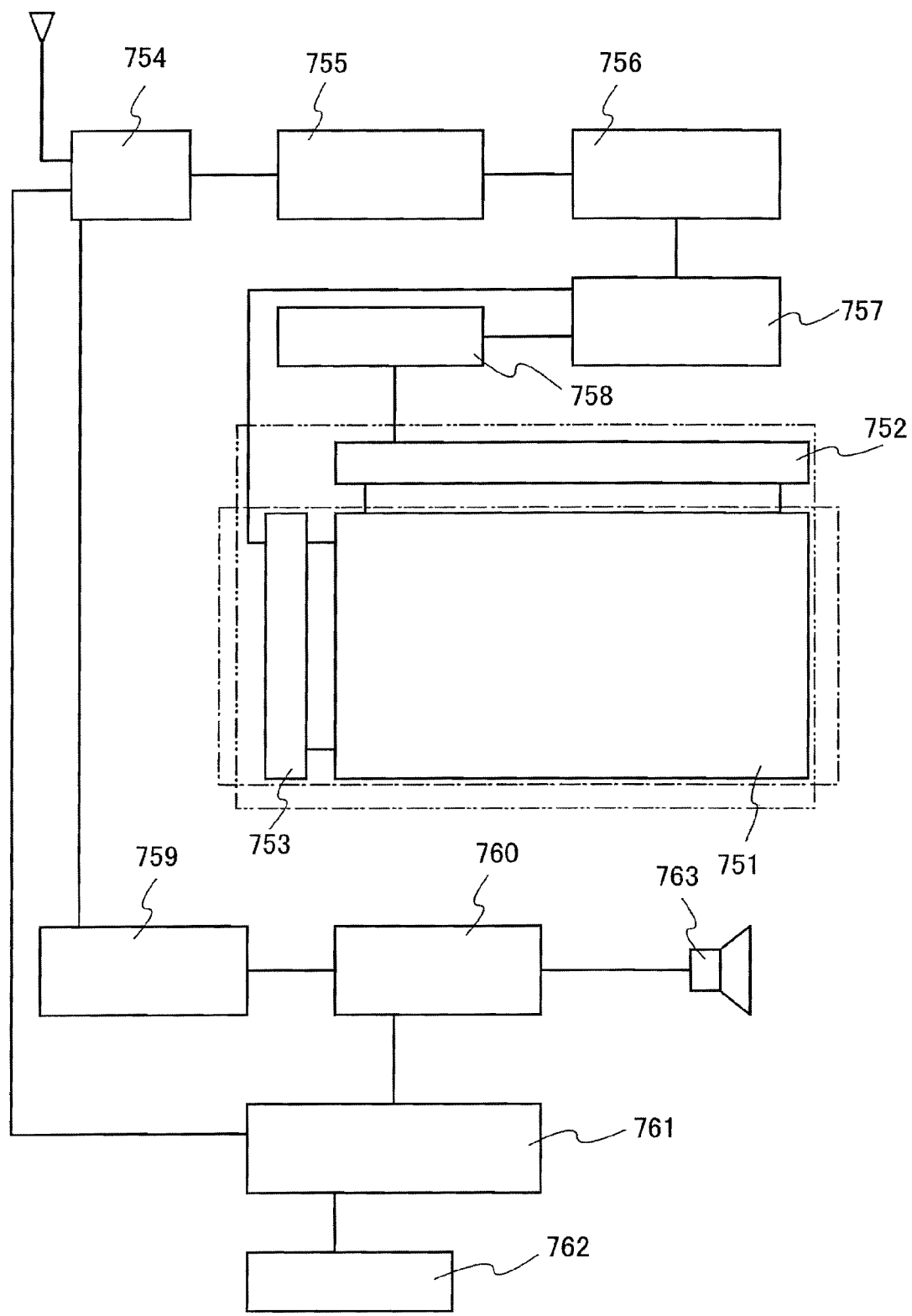
FIG. 25 is a diagram explaining an electronic device to which the present invention is applicable.

By using a display device formed by the present invention, a television device can be completed. FIG. 25 shows a block diagram that shows a main structure of a television device (in this embodiment mode, an EL television device). A display panel has a structure in which a signal line driver circuit 752, a scan line driver circuit 753 and a pixel portion 751 are formed, however, the display panel may have any one of a structure shown in FIG. 16A in which only a pixel portion is formed and a scanning line driver circuit and a signal line driver circuit are mounted by a TAB method as shown in FIG. 17B or a COG method shown in FIG. 17A; a structure shown in FIG. 16B in which a TFT is formed of SAS, a pixel portion and a scanning line driver circuit are integrated over the substrate, and a signal line driver circuit is mounted as a driver IC separately; a structure as shown in FIG. 16C in which a pixel portion, a signal line driver circuit, and a scanning line driver circuit are integrated over the substrate, and the like.

Other external circuits include, on the video signal input side, a video signal amplifier circuit 755 for amplifying a video signal received by a tuner 754, a video signal processing circuit 756 for converting the outputted signal into a color signal corresponding to each color of red, green and blue, a control circuit 757 for converting the video signal so as to be inputted to a driver IC, and the like. The control circuit 757 outputs a signal to each of the scanning line side and the signal line side. In a case where the display panel is driven in a digital manner, a configuration in which an input digital signal is divided into m signals to be supplied may be adopted by providing a signal divider circuit on the signal line side.

An audio signal received by the tuner 754 is transmitted to an audio signal amplifier circuit 759 the output of which is supplied to a speaker 763 through an audio signal processing circuit 760. A control circuit 761 receives data on receiving station (received frequency) and volume control from an input portion, and transmits the signals to the tuner 754 or the audio signal processing circuit 760.

Figure 20A:
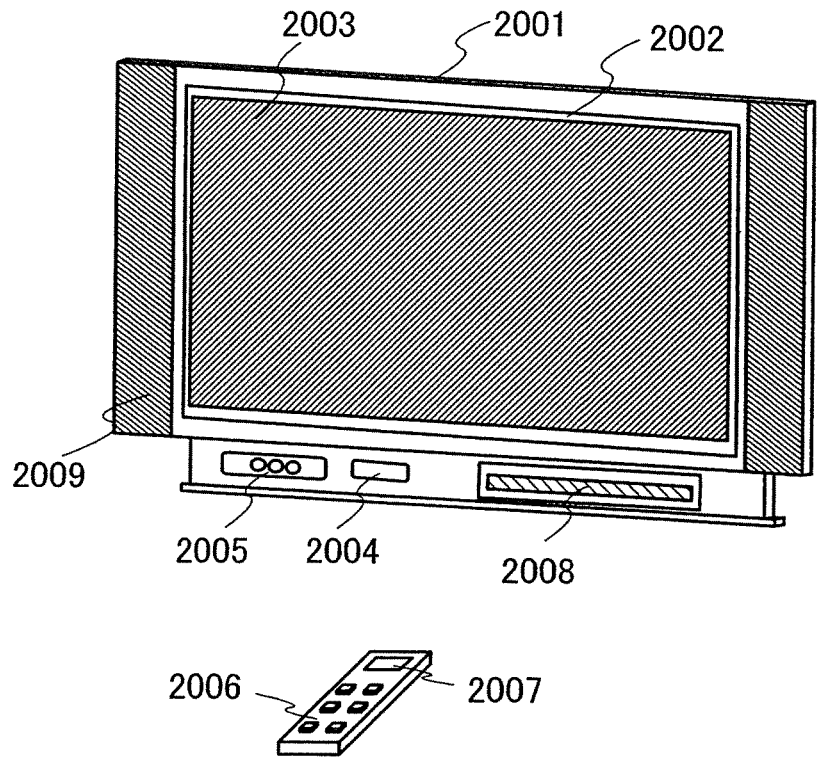
FIGS. 20A and 20B are views each showing an electronic device to which the present invention is applicable.
Figure 20B:
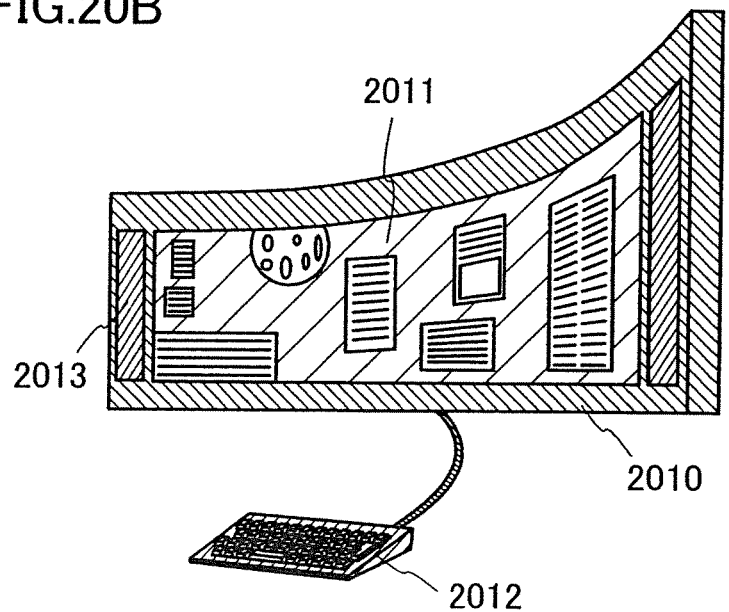

By incorporating the display module into a housing, a television device as shown in FIGS. 20A and 20B can be completed. A display panel to which an FPC is attached as shown in FIG. 7 is generally referred to as an EL display module. Thus, by using the EL display module as shown in FIG. 7, an EL television device can be completed. A main display 2003 is formed of a display module, which is provided with a speaker portion 2009, operating switches, and the like as accessory equipment. In this manner, a television device can be completed according to the present invention.

Moreover, a retardation plate or a polarizing plate may be used to block the reflection of external incident light. In a case of a top emission type structure, an insulating layer serving as a partition may be colored to be used as a black matrix. This partition can be formed by a droplet discharging method or the like. For example, the partition can be formed by using a black pigment resin or mixing a carbon black or the like into a resin material such as polyimide. In addition, a stacked-layer structure of the partitions may also be used. The partition may be formed by discharging different materials at the same region a plurality of times by the droplet discharging method. As retardation plates, λ/4 and λ/2 plates may be used to control light. A TFT element substrate, a light emitting element, a sealing substrate (sealing member), the retardation plates (λ/4 and λ/2 plates), and the polarizing plate are sequentially stacked, and light generated from the light-emitting element is emitted outside from the polarizing plate side through the sealing substrate and the retardation plates. The retardation plates and the polarizing plate may be disposed on a side through which light is emitted. In a case of a dual emission display device, which emits light both upward and downward, retardation plates and a polarizing plate can be provided over both surfaces of the display device. In addition, an anti-reflection film may be provided over the outer sides of the polarizing plate. According to this structure, high resolution and fine image can be displayed.

As shown in FIG. 20A, a display panel 2002 using a display element is incorporated in a housing 2001, and a receiver 2005 is connected to a communication network by wired or wireless connections via a modem 2004 to receive general TV broadcast so that one-way (from a sender to a receiver) or two-way (between a sender and a receiver or between receivers) information communication can be performed. The television device can be operated by using a switch built in the housing or a remote control unit 2006. Besides, a display portion 2007 for displaying output information may also be provided in the remote control unit.

Further, the television device may include a sub screen 2008 formed using a second display panel to display channels, volume, and the like, in addition to the main screen 2003. In this structure, the main screen 2003 may be formed by using an EL display panel having wide viewing angle and the sub screen may be formed by using a liquid crystal display panel capable of displaying images at lower power consumption. Alternatively, in order to give priority to the reduction in power consumption, the main screen 2003 may be formed by using a liquid crystal display panel and the sub screen may be formed by using an EL display panel, which can be switched on/off. According to the present invention, a highly reliable display device can be formed even when a large-sized substrate is used and a large number of TFTs or electronic components are used.

FIG. 20B shows a television device having a display portion with a size of 20 to 80 inches. The television device includes a housing 2010, a keyboard portion 2012 that is an operation portion, a display portion 2011, speakers 2013, and the like. The present invention is applied to the display portion 2011. Since the display portion of FIG. 20B is formed using a flexible substance, this television device has a curved display portion. Since the shape of the display portion can be designed freely in this manner, a television device with a desired shape can be manufactured.

By using the present invention, the manufacturing process can be simplified and cost can be reduced as well. Thus, a television device using the present invention can be formed at low cost even with a large display portion. Accordingly, a high performance and highly reliable television device can be manufactured with high yield.

It is needless to say that the present invention is not limited to the television device and can be used as a large area display medium for various applications such as a monitor of a personal computer; an information display at a train station, airport, and the like; an advertisement display on the streets; and the like.

Embodiment Mode 10

This embodiment mode will be explained with reference to FIGS. 21A and 21B. In this embodiment mode, explanation will be made on an example of a module using a panel with a display device manufactured according to Embodiment Modes 3 to 7.

Figure 21A:
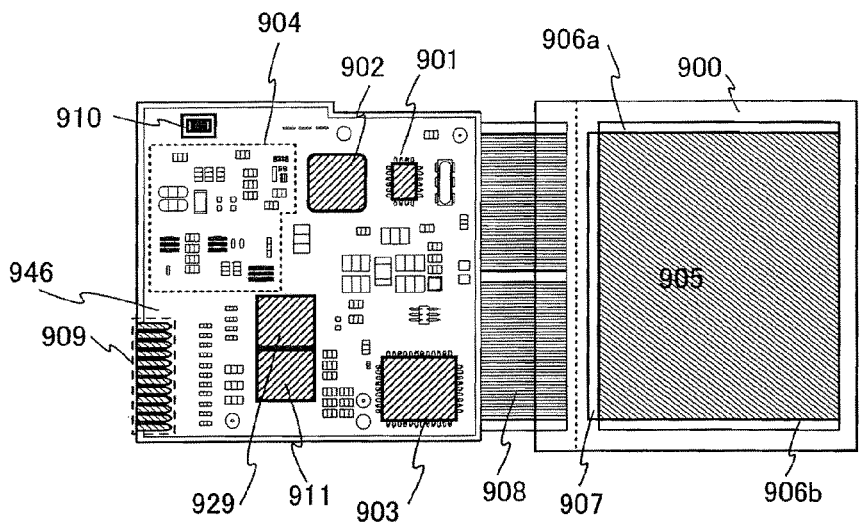
FIGS. 21A and 21B are a view and a diagram each explaining an electronic device to which the present invention is applicable.

An information terminal module shown in FIG. 21A has a printed wiring board 946 over which a controller 901, a central processing unit (CPU) 902, a memory 911, a power source circuit 903, an audio processing circuit 929, a transmission/reception circuit 904, and other elements such as a resistor, a buffer, and a capacitor element are mounted. In addition, a panel 900 is connected to the printed wiring board 946 through a flexible printed circuit (FPC) 908.

The panel 900 includes a pixel portion 905 in which each pixel has a light emitting element, a first scanning line driver circuit 906a and a second scanning line driver circuit 906b which select a pixel in the pixel portion 905, and a signal line driver circuit 907 which supplies a video signal to the selected pixel.

Various control signals are inputted and outputted through an interface (I/F) portion 909 provided over the printed wiring board 946. An antenna port 910 for transmitting and receiving signals with an antenna is provided over the printed wiring board 946.

Note that the printed wiring board 946 is connected to the panel 900 through the FPC 908 in this embodiment mode; however, the present invention is not limited to this structure. The controller 901, the audio processing circuit 929, the memory 911, the CPU 902, or the power source circuit 903 may be directly mounted on the panel 900 by a COG (Chip On Glass) method. In addition, various elements such as a capacitor element and a buffer are provided over the printed wiring board 946; therefore, it can be prevented that a noise occurs in the power source voltage and signals and the signal rise time becomes slow.

Figure 21B:
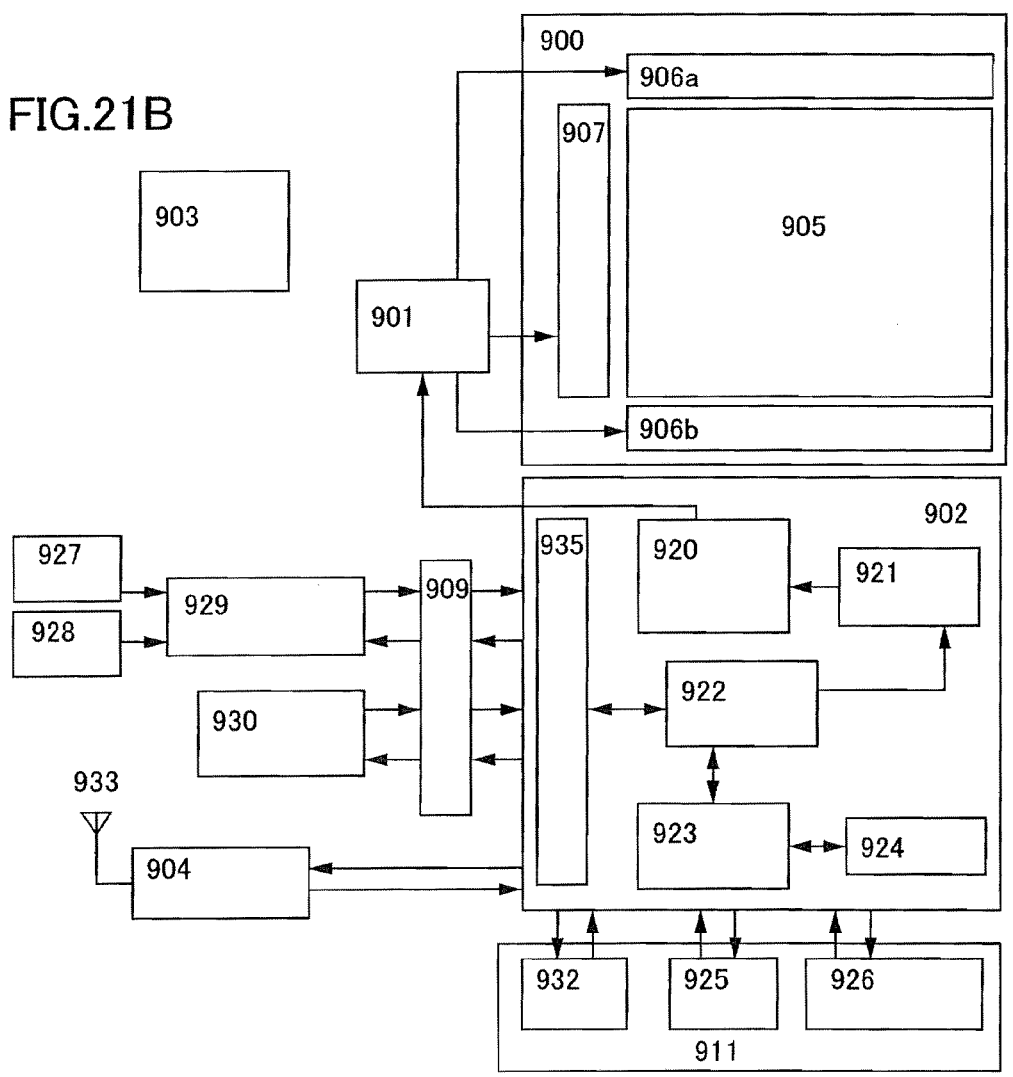

FIG. 21B is a block diagram of a module shown in FIG. 21A. This module 999 includes a VRAM 932, a DRAM 925, a flash memory 926, and the like as a memory 911. The VRAM 932 has data on the image to be displayed on a panel, the DRAM 925 has image data or audio data, and the flash memory has various programs.

The power source circuit 903 generates a power source voltage applied to the panel 900, the controller 901, the CPU 902, the audio processing circuit 929, the memory 911, and the transmission/reception circuit 904. There is a case where a current source is provided in the power source circuit 903 depending on the specifications of the panel.

The CPU 902 includes a control signal generating circuit 920, a decoder 921, a register 922, an arithmetic circuit 923, a RAM 924, an interface 935 for the CPU, and the like. Various signals inputted to the CPU 902 through the interface 935 are held in the resister 922 and then inputted to the arithmetic circuit 923, the decoder 921, and the like. In the arithmetic circuit 923, an arithmetic operation is performed based on the inputted signal, and the address of various instructions is determined. Meanwhile, a signal inputted to the decoder 921 is decoded and inputted to the control signal generating circuit 920. The control signal generating circuit 920 generates a signal containing various instructions based on the inputted signal, and then transmits the signals to the address determined by the arithmetic circuit 923, specifically the memory 911, the transmission/reception circuit 904, the audio processing circuit 929, the controller 901, and the like.

Each of the memory 911, the transmission/reception circuit 904, the audio processing circuit 929, and the controller 901 operates according to the received instruction. The operation thereof will be briefly explained.

A signal inputted from an input means 930 is transmitted to the CPU 902 which is mounted on the printed wiring board 946 through the interface 909. The control signal generating circuit 920 converts the image data stored in the VRAM 932 into a predetermined format based on the signal transmitted from the input means 930 such as a pointing device and a keyboard, and transmits the data to the controller 901.

The controller 901 processes the signals containing image data transmitted from the CPU 902 according to the specifications of the panel and then transmits the signals to the panel 900. In addition, the controller 901 generates an Hsync signal, a Vsync signal, a clock signal CLK, an alternating current voltage (AC Cont), and a switching signal L/R based on the power source voltage inputted from the power source circuit 903 and the various signals inputted from the CPU 902, and supplies the signals to the panel 900.

The transmission/reception circuit 904 processes signals which are transmitted and received as electromagnetic waves by an antenna 933. Specifically, the transmission/reception circuit 904 includes a high frequency circuit such as an isolator, a band pass filter, a VCO (Voltage Controlled Oscillator), an LPF (Low Pass Filter), a coupler, and a balun. A signal containing audio data among the signals transmitted and received by the transmission/reception circuit 904 is transmitted to the audio processing circuit 929 according to the instruction of the CPU 902.

The signal containing audio data transmitted according to the instruction of the CPU 902 is demodulated into an audio signal by the audio processing circuit 929 and transmitted to a speaker 928. An audio signal transmitted from a microphone 927 is modulated by the audio processing circuit 929 and transmitted to the transmission/reception circuit 904 according to the instruction of the CPU 902.

The controller 901, the CPU 902, the power source circuit 903, the audio processing circuit 929, and the memory 911 can be mounted as a package of this embodiment mode. This embodiment mode is applicable to any circuits but a high frequency circuit such as an isolator, a band pass filter, a VCO (Voltage Controlled Oscillator), an LPF (Low Pass Filter), a coupler, and a balun.

Embodiment Mode 11

Figure 22:
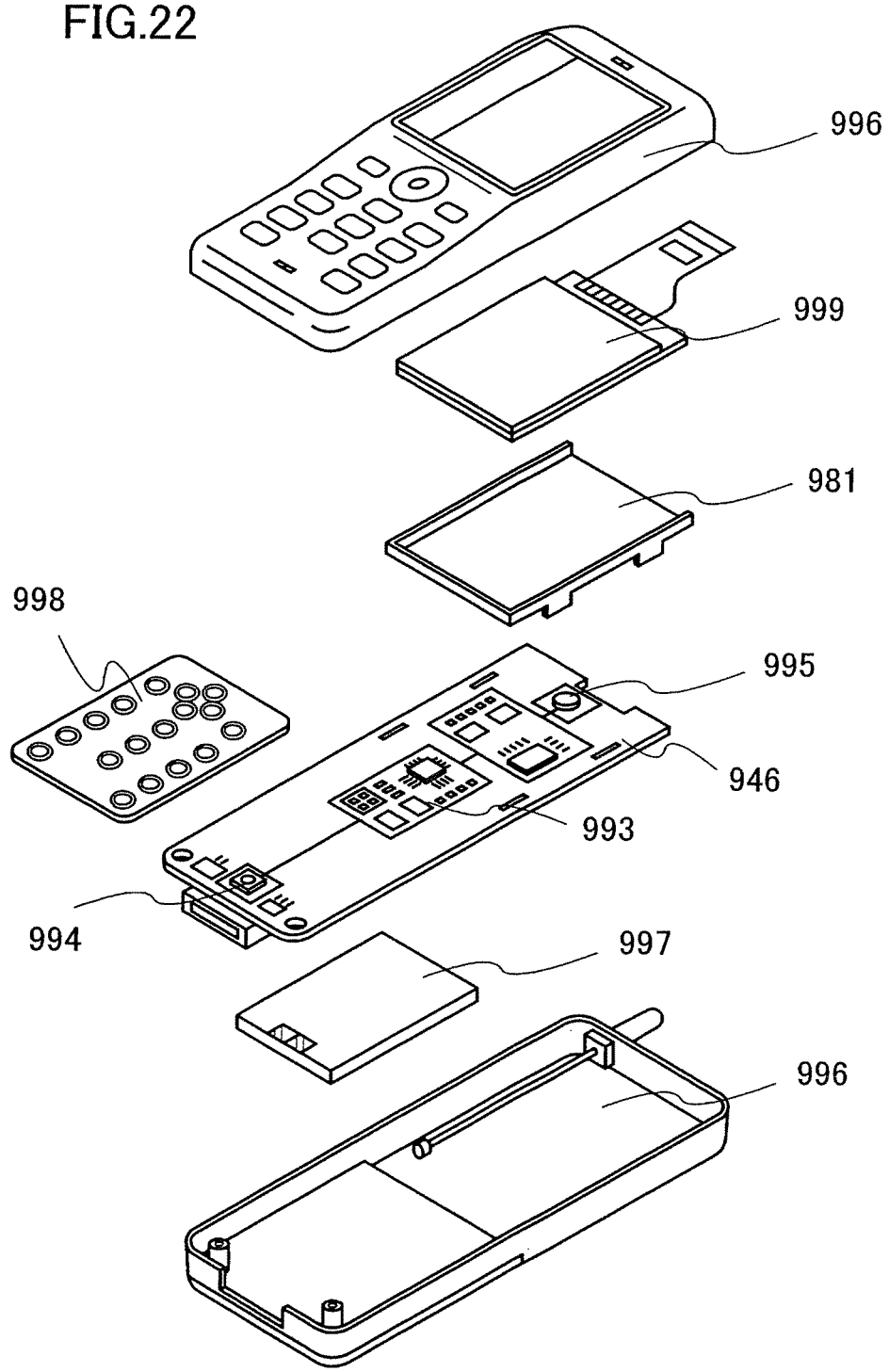
FIG. 22 is a view explaining an electronic device to which the present invention is applicable.

This embodiment mode will be explained with reference to FIG. 22. FIG. 22 shows one mode of a wireless, compact phone (portable phone) including the module manufactured according to Embodiment Mode 10. The panel 900 which is detachable can be incorporated in a housing 981 and easily combined with a module 999. The shape and size of the housing 981 can be appropriately changed according to an electronic device.

The housing 981 to which the panel 900 is fixed is mounted on the printed wiring board 946 and completed as a module. A plurality of packaged semiconductor devices is mounted on the printed wiring board 946. A plurality of the semiconductor devices mounted on the printed wiring board 946 has any of functions such as a controller, a Central Processing Unit (CPU), a memory, a power source circuit, and other functions such as a resistor, a buffer, and a capacitor element. Further, an audio processing circuit including a microphone 994 and a speaker 995, and a signal processing circuit 993 such as a transmission/reception circuit are provided. The panel 900 is connected to the printed wiring board 946 through the FPC 908.

Such a module 999, the housing 981, the printed wiring board 946, an input means 998, and a buttery 997 are stored in a housing 996. A pixel portion of the panel 900 is disposed to be seen from an opening window formed in the housing 996. According to the present invention, a highly reliable electronic device can be manufactured with high productivity.

The housing 996 shown in FIG. 22 shows an example of an external appearance of a telephone hand set. However, an electronic device according to this embodiment mode may change into various modes according to the function and application. An example of the modes will be explained in the following embodiment mode.

Embodiment Mode 12

By applying the present invention, various display devices can be manufactured. In other words, the present invention is applicable to various electronic devices having the display device incorporated in a display portion thereof.

The various electronic devices include a camera such as a video camera and a digital camera, a projector, a head mounted display (a goggle type display), a car navigation, a car stereo, a personal computer, a game machine, a portable information terminal (a mobile computer, a cellular phone, an electronic book, and the like), an image reproducing device provided with a recording medium (specifically, a device which reproduces a recording medium such as a Digital Versatile Disc (DVD) and has a display which can display the reproduced image), and the like. Example thereof are shown in FIGS. 19A to 19D.

Figure 19A:
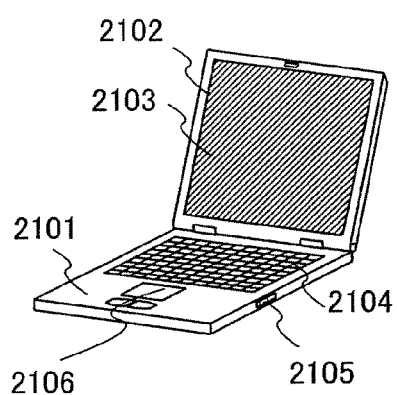
FIG. 19A to 19D are views each showing an electronic device to which the present invention is applicable.

FIG. 19A shows a computer, which includes a main body 2101, a housing 2102, a display portion 2103, a keyboard 2104, an external connection port 2105, a pointing mouse 2106, and the like. The display portion 2103 in the computer includes the structure of the above embodiment mode. Accordingly, a defect is prevented in the display portion 2103 in the computer; therefore, the computer can be used for a long period. In addition, a computer, in which an image with high reliability and high quality can be displayed, can be provided.

Figure 19B:
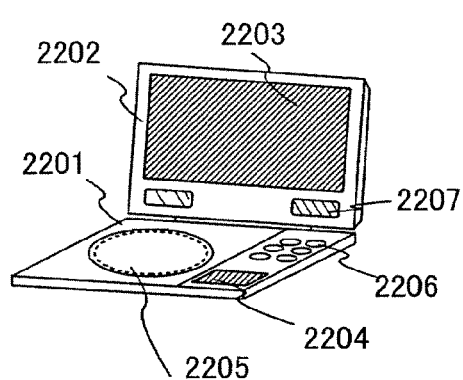

FIG. 19B shows an image reproducing device provided with a recording medium (specifically, a DVD reproducing device), which includes a main body 2201, a housing 2202, a display portion A 2203, a display portion B 2204, a recording medium (such as a DVD) reading portion 2205, operating keys 2206, a speaker portion 2207, and the like. The display portion A 2203 mainly displays image data while the display portion B 2204 mainly displays text data. The display portion A 2203 and the display portion B 2204 in the image reproducing device provided with a recording medium includes the structure of the above embodiment mode. Accordingly, a defect is prevented in the display portion A 2203 and the display portion B 2204 in the image reproducing device provided with a recording medium; therefore, the image reproducing device provided with a recording medium can be used for a long period. In addition, an image reproducing device provided with a recording medium, in which an image with high reliability and high quality can be displayed, can be provided.

Figure 19C:
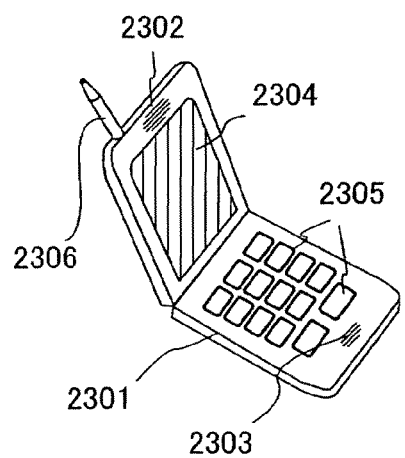

FIG. 19C shows a cellular phone, which includes a housing 2301, an audio output portion 2302, an audio input portion 2303, a display portion 2304, operating switches 2305, an antenna 2306, and the like. The display portion 2304 in the cellular phone includes the structure of the above embodiment mode. Accordingly, a defect is prevented in the display portion 2304 in the cellular phone; therefore, the cellular phone can be used for a long period. In addition, a cellular phone, in which an image with high reliability and high quality can be displayed, can be provided.

Figure 19D:
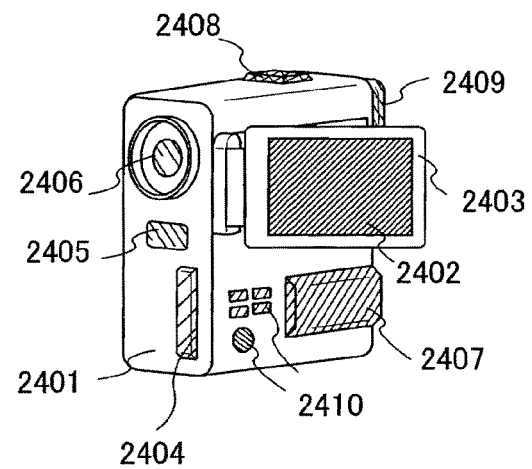

FIG. 19D shows a video camera, which includes a main body 2401, a display portion 2402, a housing 2403, an external connection port 2404, a remote control receiving portion 2405, an image receiving portion 2406, a battery 2407, an audio input portion 2408, an eyepiece portion 2409, operating keys 2410, and the like. The display portion 2402 in the video camera includes the structure of the above embodiment mode. Accordingly, a defect is prevented in the display portion 2402 in the video camera; therefore, the video camera can be used for a long period. In addition, a video camera, in which an image with high reliability and high quality can be displayed, can be provided. This embodiment mode can be arbitrarily combined with the above embodiment mode.

Embodiment Mode 13

This embodiment mode will explain another structure applicable to a light-emitting element of the present invention with reference to FIGS. 28A to 28C and FIGS. 29A to 29C.

A light-emitting element utilizing electroluminescence is distinguished by whether a light-emitting material is an organic compound or an inorganic compound. Generally, the former is referred to as an organic EL element, whereas the latter is referred to as an inorganic EL element.

The inorganic EL element is classified into a dispersion type inorganic EL element and a thin film type inorganic EL element, depending on its element structure. The former and the latter are different in that the former has an electroluminescent layer where particles of a light-emitting material are dispersed in a binder, whereas the latter has an electroluminescent layer formed of a thin film of a light-emitting material. However, the former and the latter have in common that they need an electron accelerated by a high electric field. Note that, as a mechanism of luminescence that is obtained, there are donor-acceptor recombination type luminescence that utilizes a donor level and an acceptor level, and localized type luminescence that utilizes inner-shell electron transition. Generally, in many cases, donor-acceptor recombination type luminescence is employed in a dispersion type inorganic EL element, whereas localized type luminescence is employed in a thin film type inorganic EL element.

The light-emitting material, which can be used in the present invention, includes a host material and an impurity element to be a light-emission center. By changing an impurity element that is contained, light emission of various colors can be obtained. As a manufacturing method of the light-emitting material, various methods such as a solid phase method and a liquid phase method (a coprecipitation method) can be used. In addition, an evaporative decomposition method, a double decomposition method, a method by heat decomposition reaction of a precursor, a reversed micelle method, a method in which these methods are each combined with high temperature baking, a liquid phase method such as a lyophilization method, or the like can also be used.

A solid phase method is a method by which a host material, and an impurity element or a compound containing an impurity element are measured, mixed in a mortar, heated in an electric furnace, and baked to be reacted to contain the impurity element in the host material. The baking temperature is preferably 700 to 1500° C. This is because the solid reaction does not progress when the temperature is too low, and the host material is decomposed when the temperature is too high. The baking may be performed in a powder state; however, it is preferable to perform the baking in a pellet state. Although the baking have to be performed at a comparatively high temperature, the solid phase method is easy; thus, the solid phase method is suitable for mass production with high productivity.

A liquid phase method (a coprecipitation method) is a method by which a host material or a compound containing a host material is reacted in a solution with an impurity element or a compound containing an impurity element, dried, and then baked. Particles of a light-emitting material are distributed uniformly, and the reaction can progress even when the grain size is small and the baking temperature is low.

As a host material used for a light-emitting material, a hydrosulfide, an oxide, or a nitride can be used. As a hydrosulfide, for example, zinc sulfide (ZnS), cadmium sulfide (CdS), calcium sulfide (CaS), yttrium sulfide ($Y_2S_3$), gallium sulfide ($Ga_2S_3$), strontium sulfide (SrS), barium sulfide (BaS), or the like can be used. As an oxide, for example, zinc oxide (ZnO), yttrium oxide ($Y_2O_3$), or the like can be used. As a nitride, for example, aluminum nitride (AlN), gallium nitride (GaN), indium nitride (InN), or the like can be used. Further, zinc selenide (ZnSe), zinc telluride (ZnTe), or the like can also be used, and a three-component mixed crystal such as calcium sulfide-gallium ($CaGa_2S_4$), strontium sulfide-gallium ($SrGa_2S_4$), or barium sulfide-gallium ($BaGa_2S_4$) may also be used.

As a light-emission center of localized type luminescence, manganese (Mn), copper (Cu), samarium (Sm), terbium (Tb), erbium (Er), thulium (Tm), europium (Eu), cerium (Ce), praseodymium (Pr), or the like can be used. Note that a halogen element such as fluorine (F) or chlorine (Cl) may be added as charge compensation.

On the other hand, as a light-emission center of donor-acceptor recombination type luminescence, a light-emitting material containing a first impurity element which forms a donor level and a second impurity element which forms an acceptor level can be used. As the first impurity element, for example, fluorine (F), chlorine (Cl), aluminum (Al), or the like can be used for example. As the second impurity element, for example, copper (Cu), silver (Ag), or the like can be used.

In a case of synthesizing the light-emitting material of donor-acceptor recombination type luminescence by a solid phase method, a host material, the first impurity element or a compound containing the first impurity element, and the second impurity element or a compound containing the second impurity element are each measured, mixed in a mortar, heated in an electric furnace, and baked. As the host material, the above host material can be used. As the first impurity element or the compound containing the first impurity element, for example, fluorine (F), chlorine (Cl), aluminum sulfate ($Al_2S_3$), or the like can be used. As the second impurity element or the compound containing the second impurity element, for example, copper (Cu), silver (Ag), copper sulfide ($Cu_2S$), silver sulfide ($Ag_2S$), or the like can be used. The baking temperature is preferably 700 to 1500° C. This is because the solid reaction does not progress when the temperature is too low, and the host material is decomposed when the temperature is too high. The baking may be performed in a powder state; however, it is preferable to perform the baking in a pellet state.

As the impurity element in the case of utilizing solid reaction, a compound containing the first impurity element and the second impurity element may be combined. In this case, since the impurity element is easily diffused and solid reaction progresses easily, a uniform light-emitting material can be obtained. Further, since a surplus impurity element does not enter, a light-emitting material having high purity can be obtained. As the compound containing the first impurity element and the second impurity element, for example, copper chloride (CuCl), silver chloride (AgCl), or the like can be used.

Note that a concentration of these impurity elements may be 0.01 to 10 atom % with respect to the host material, and the concentration is preferably 0.05 to 5 atom %.

In the case of a thin film type inorganic EL element, an electroluminescent layer is a layer containing the above light-emitting material, which can be formed by a vacuum evaporation method such as a resistance heating evaporation method or an electron beam evaporation (EB evaporation) method, a physical vapor deposition (PVD) method such as a sputtering method, a chemical vapor deposition (CVD) method such as an organic metal CVD method or a hydride transport low-pressure CVD method, an atomic layer epitaxy method (ALE), or the like.

Figure 28A:
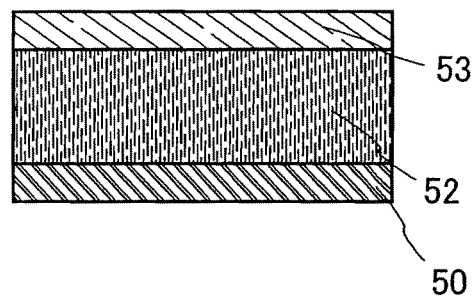
FIGS. 28A to 28C are views each explaining a structure of a light-emitting element applicable to the present invention.
Figure 28B:
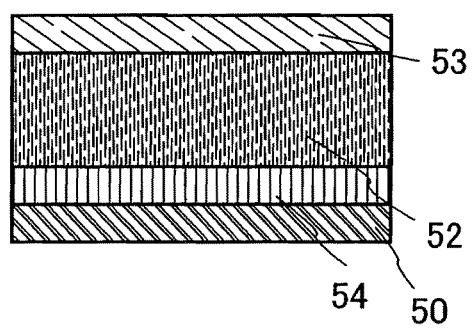
Figure 28C:
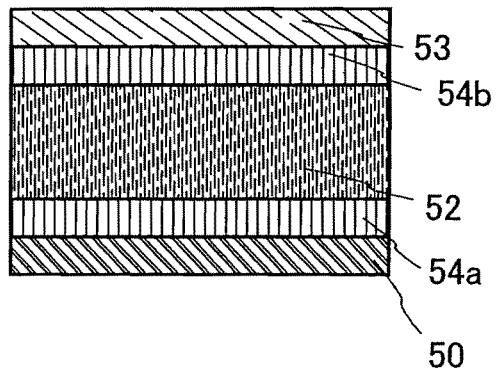

FIGS. 28A to 28C each show an example of a thin film type inorganic EL element that can be used as a light-emitting element. In FIGS. 28A to 28C, the light-emitting elements each include a first electrode layer 50, an electroluminescent layer 52, and a second electrode layer 53.

The light-emitting elements shown in FIGS. 28B and 28C each have a structure where an insulating layer is formed between the electrode layer and the electroluminescent layer in the light-emitting element of FIG. 28A. The light-emitting element shown in FIG. 28B has an insulating layer 54 between the first electrode layer 50 and the electroluminescent layer 52. The light-emitting element shown in FIG. 28C has an insulating layer 54a between the first electrode layer 50 and the electroluminescent layer 52, and an insulating layer 54b between the second electrode layer 53 and the electroluminescent layer 52. In this manner, the insulating layer may be provided between the electroluminescent layer and one electrode layer of a pair of electrode layers that sandwiches the electroluminescent layer, or may be provided between the electroluminescent layer and the both electrode layers. Moreover, the insulating layer may be a single layer or a stacked layer including a plurality of layers.

In addition, although the insulating layer 54 is provided to be in contact with the first electrode layer 50 in FIG. 28B, the insulating layer 54 may be provided to be in contact with the second electrode layer 53 by reversing the order of the insulating layer and the electroluminescent layer.

In the case of a dispersion type inorganic EL element, an electroluminescent layer where particles of a light-emitting material are dispersed in a binder is formed. When particles with desired grain sizes cannot be obtained enough by a manufacturing method of a light-emitting material, the electroluminescent layer may be formed in a particle state by being crushed with a mortar or the like. A binder refers to a substance in which a light-emitting material in a particle state is fixed in a dispersed state to hold in a shape as an electroluminescent layer. The light-emitting material is uniformly dispersed and fixed in an electroluminescent layer by the binder.

In the case of a dispersion type inorganic EL element, as a method for forming an electroluminescent layer, a droplet discharging method that can selectively form an electroluminescent layer, a printing method (such as screen printing or offset printing), a coating method such as a spin coating method, a dipping method, a dispenser method, or the like can be used. A film thickness of an electroluminescent layer is not particularly limited, and the film thickness of 10 to 1000 nm is preferable. In addition, in an electroluminescent layer containing a light-emitting material and a binder, a ratio of the light-emitting material is preferably set to be 50 to 80 wt %.

Figure 29A:
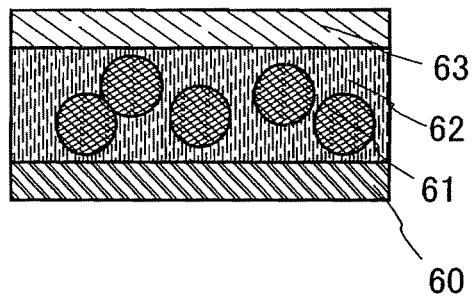
FIGS. 29A to 29C are views each explaining a structure of a light-emitting element applicable to the present invention.
Figure 29B:
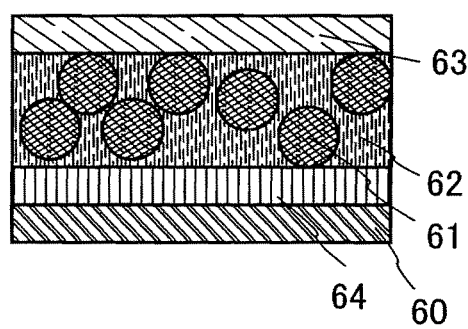
Figure 29C:
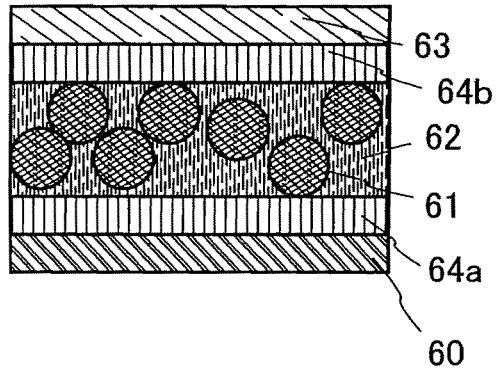

FIGS. 29A to 29C each show an example of a dispersion type inorganic EL element that can be used as a light-emitting element. In FIG. 29A, the light-emitting element has a stacked structure of a first electrode layer 60, an electroluminescent layer 62, and a second electrode layer 63, where a light-emitting material 61 held by a binder in the electroluminescent layer 62 is contained.

As the binder that can be used for this embodiment mode, an insulating material, an organic material, or an inorganic material can be used, and a mixed material of an organic material and an inorganic material may also be used. As the organic insulating material, a resin such as a polymer, polyethylene, polypropylene, a polystyrene based resin, a silicone resin, an epoxy resin, or vinylidene fluoride each having a comparatively high dielectric constant like a cyanoethyl cellulose based resin can be used. In addition, a heat-resistant high molecular compound such as aromatic polyamide or polybenzimidazole, or a siloxane resin may be used. Siloxane is composed of a skeleton structure formed by the bond of silicon (Si) and oxygen (O). As a substituent thereof, an organic group containing at least hydrogen (such as an alkyl group or aromatic hydrocarbon) is used. Alternatively, a fluoro group may be used as the substituent. Further alternatively, an organic group containing at least hydrogen and a fluoro group may be used as the substituent. Moreover, a vinyl resin such as polyvinyl alcohol or polyvinyl butyral, or a resin material such as a phenol resin, a novolac resin, an acrylic resin, a melamine resin, a urethane resin, an oxazole resin (polybenzoxazole) may also be used. A dielectric constant can also be adjusted by appropriately mixing these resins with fine particles having a high dielectric constant such as barium titanate ($BaTiO_3$) or strontium titanate ($SrTiO_3$).

The inorganic insulating material contained in the binder can be formed with a material of silicon oxide ($SiO_x$), silicone nitride ($SiN_x$), silicon containing oxygen and nitrogen, aluminum nitride (AlN), aluminum containing oxygen and nitrogen or aluminum oxide ($Al_2O_3$), titanium oxide ($TiO_2$), $BaTiO_3$, $SrTiO_3$, lead titanate ($PbTiO_3$), potassium niobate ($KNbO_3$), lead niobate ($PbNbO_3$), tantalum oxide ($Ta_2O_5$), barium tantalate ($BaTa_2O_6$), lithium tantalate ($LiTaO_3$), yttrium oxide ($Y_2O_3$), zirconium oxide ($ZrO_2$), and other substances containing an inorganic insulating material. By mixing an organic material with an inorganic material having a high dielectric constant (by adding or the like), a dielectric constant of an electroluminescent layer including a light-emitting material and a binder can be further controlled and the dielectric constant can be further increased. When a mixed layer of an inorganic material and an organic material is used for the binder to have a high dielectric constant, the light-emitting material can be induced with a higher electric charge.

In a manufacturing process, the light-emitting material is dispersed in a solution containing a binder. However, as a solvent of the solution containing a binder that can be used in this embodiment mode, it is preferable to appropriately select such a solvent, where the binder material is dissolved, that can manufacture a solution with the viscosity of which is appropriate for a method for forming an electroluminescent layer (various wet processes) and a desired film thickness. In a case where an organic solvent can be used and, for example, a siloxane resin is used as the binder, propylene glycolmonomethyl ether, propylene glycolmonomethyl ether acetate (also referred to as PGMEA), 3-methoxy-3-methyl-1-butanol (also referred to as MMB), or the like can be used.

The light-emitting elements shown in FIGS. 29B and 29C each have a structure where an insulating layer is formed between the electrode layer and the electroluminescent layer in the light-emitting element of FIG. 29A. The light-emitting element shown in FIG. 29B has an insulating layer 64 between the first electrode layer 60 and the electroluminescent layer 62. The light-emitting element shown in FIG. 29C has an insulating layer 64a between the first electrode layer 60 and the electroluminescent layer 62, and an insulating layer 64b between the second electrode layer 63 and the electroluminescent layer 62. In this manner, the insulating layer may be provided between the electroluminescent layer and one electrode layer of a pair of electrode layers that sandwiches the electroluminescent layer, or may be provided between the electroluminescent layer and the both electrode layers. Moreover, the insulating layer may be a single layer or a stacked layer including a plurality of layers.

In addition, although the insulating layer 64 is provided to be in contact with the first electrode layer 60 in FIG. 29B, the insulating layer 64 may be provided to be in contact with the second electrode layer 63 by reversing the order of the insulating layer and the electroluminescent layer.

The insulating layer like the insulating layer 54 in FIG. 28B and the insulating layer 64 in FIG. 29B are not particularly limited, and the insulating layers preferably have high insulating resistance and dense film qualities, and much preferably high dielectric constants. For example, silicon oxide ($SiO_2$), yttrium oxide ($Y_2O_3$), titanium oxide ($TiO_2$), aluminum oxide ($Al_2O_3$), hafnium oxide ($HfO_2$), tantalum oxide ($Ta_2O_5$), barium titanate ($BaTiO_3$), strontium titanate ($SrTiO_3$), lead titanate ($PbTiO_3$), silicon nitride ($Si_3N_4$), zirconium oxide ($ZrO_2$), or the like, or a mixed film or a staked film of two kinds or more thereof can be used. These insulating films can be formed by sputtering, evaporation, CVD, or the like. In addition, the insulating layers each may be formed by dispersing the particles of these insulating materials in a binder. The binder material is preferably formed with the same material and by the same method as the binder contained in each electroluminescent layer. A film thickness of each insulating layer is not particularly limited, and the film thickness of 10 to 1000 nm is preferable.

The light-emitting elements shown in this embodiment mode can obtain light emission by applying a voltage between a pair of electrode layers that sandwiches an electroluminescent layer; however, the light-emitting elements can be operated by any of DC driving and AC driving.

The insulating layer to be a partition and the first electrode layer are subjected to plasma treatment also in this embodiment mode. By performing plasma treatment under a nitrogen atmosphere or an oxygen atmosphere, surfaces of the insulating layer and the first electrode layer are nitrided or oxidized. When the insulating layer and the first electrode layer are oxidized or nitrided (or may be both oxidized and nitrided) by using plasma treatment, surfaces of the insulating layer and the first electrode layer are modified, and an insulating layer and a first electrode layer which are much denser can be obtained. Thus, characteristics or the like of the display device can be improved by suppressing a defect such as a pinhole. Consequently, contaminant such as moisture is not transmitted; therefore, a light-emitting element can be prevented from being deteriorated due to contaminant penetrated from outside of a display device.

Embodiment

This embodiment shows an example of forming an insulating layer serving as a partition by using an inorganic insulating material.

Figure 26A:
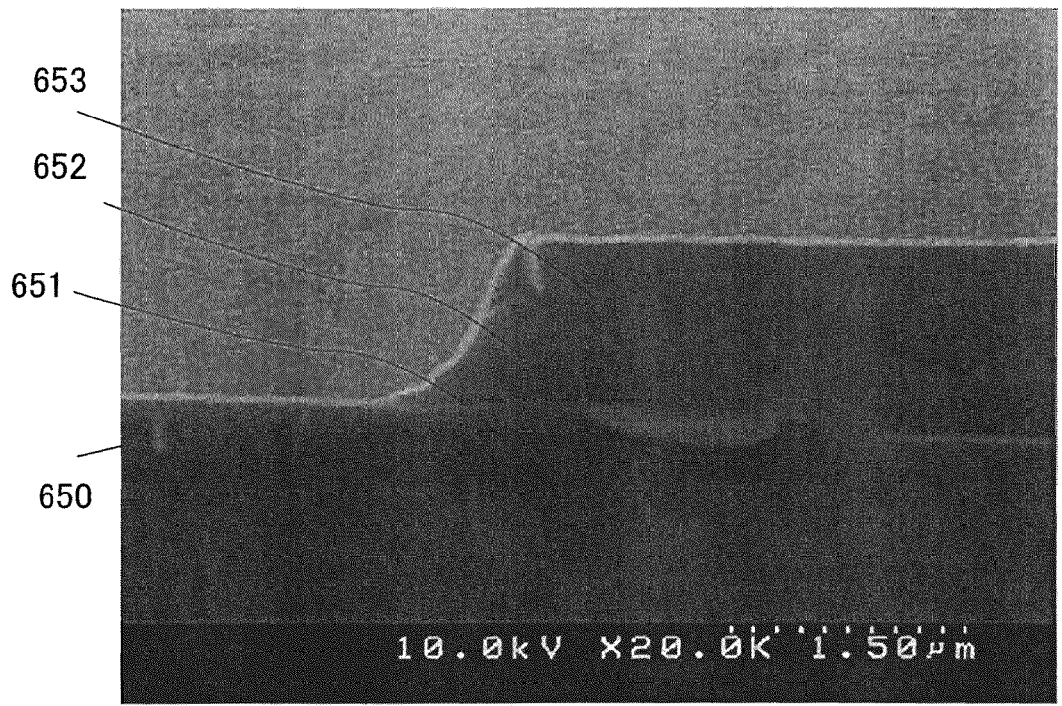
FIGS. 26A and 26B are views each showing experiment data of a sample shown in Embodiment 1.

An insulating film was formed over a first electrode layer and processed by an etching method to form an insulating layer serving as a partition, which was formed of two stacked layers. A first insulating film and a second insulating film were formed over the first electrode layer by being stacked and processed by an etching method to form a stacked layer of a first insulating layer and a second insulating layer. As a first electrode layer 650, an ITSO film was formed by a sputtering method, and the first insulating film formed of a silicon nitride film was formed by a plasma CVD method. As the second insulating film, a silicon nitride oxide film was stacked over the first insulating film by a plasma CVD method and etched by a parallel plate RIE apparatus with a resist mask 653 to form a first insulating layer 651 and a second insulating layer 652 having a taper shape. FIG. 26A shows an SEM photograph which is observed by a scanning electron microscope (SEM), which shows a cross-sectional view. An etching condition was as follows: an RF power of 400 W; a pressure of 39 Pa; and an etching gas of $CF_4$ (a flow rate of 50 sccm), $O_2$ (a flow rate of 35 sccm), and He (a flow rate of 50 sccm). The first insulating layer 651 and the second insulating layer 652 were continuously formed to have a taper shape.

Figure 26B:
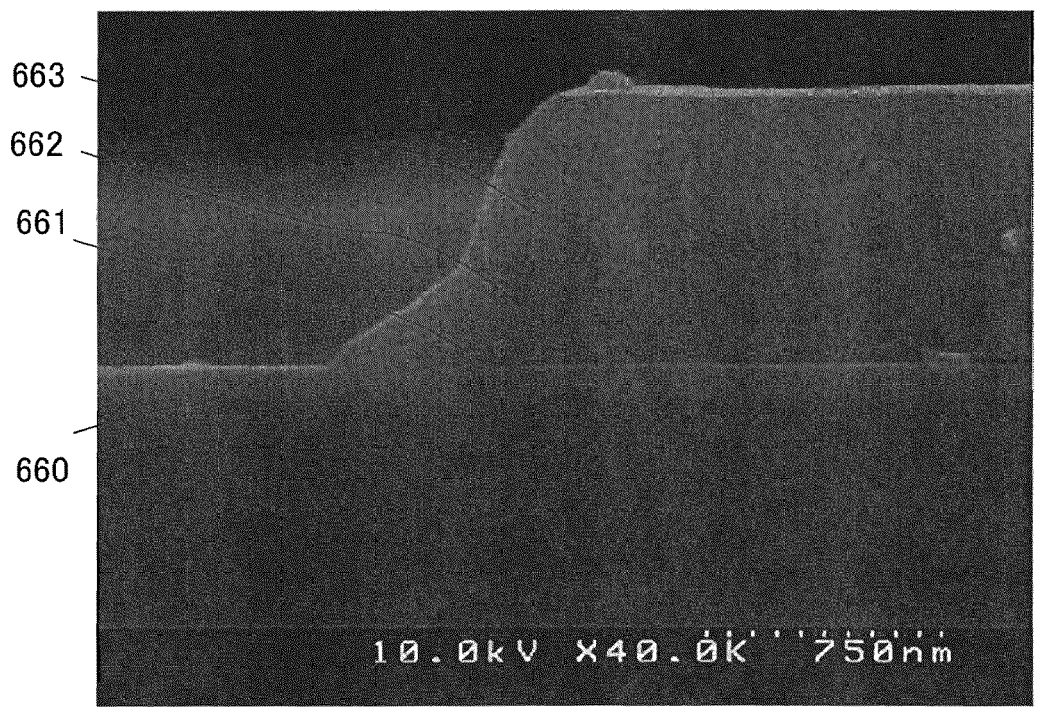

In the same manner, the insulating layer serving as a partition was formed by stacking two insulating layers. A first insulating film and a second insulating film were formed over a first electrode layer by being stacked and processed by an etching method to form a stacked layer of a first insulating layer and a second insulating layer. As a first electrode layer 660, an ITSO film was formed by a sputtering method, and the first insulating film formed of a silicon nitride film was formed by a plasma CVD method. As the second insulating film, a silicon oxynitride film was stacked over the first insulating film by a plasma CVD method and etched by a parallel plate RIE apparatus with a resist mask 663 to form a first insulating layer 661 and a second insulating layer 662 having a taper shape. FIG. 26B shows an SEM photograph which is observed by a scanning electron microscope (SEM), which shows a cross-sectional view. An etching condition was as follows: an RF power of 400 W; a pressure of 39 Pa; and an etching gas of $CF_4$ (a flow rate of 87 sccm), $O_2$ (a flow rate of 35 sccm), and He (a flow rate of 13 sccm). The first insulating layer 661 and the second insulating layer 662 were continuously formed to have a taper shape. The taper angles of the first insulating layer 661 and the second insulating layer 662 are different, which has a taper shape in two steps. In the first insulating layer 651, the second insulating layer 652, the first insulating layer 661, and the second insulating layer 662, taper angles were 40 degrees or more (approximately 45 degrees).

The insulating layers using the inorganic insulating material as described above can be formed as dense films; therefore, contaminant such as moisture is not transmitted. Thus, a light-emitting element can be prevented from being deteriorated due to contaminant penetrated from outside of a display device.

The present application is based on Japanese Patent Application serial No. 2005-233890 filed on Aug. 12, 2005 in Japanese Patent Office, the entire contents of which are hereby incorporated by reference.

What is claimed is:

1. A light emitting display device comprising:
a thin film transistor over a substrate;
an interlayer insulating film over the thin film transistor;
a wiring over the interlayer insulating film, wherein the wiring is electrically connected to the thin film transistor;
a first electrode over the wiring, wherein the first electrode is electrically connected to the wiring;
an inorganic insulating film over the first electrode, wherein the inorganic insulating film has an opening which reaches the first electrode;
a rounded corner at the opening of the inorganic insulating film;
an electroluminescent layer over the inorganic insulating film; and
a second electrode over the electroluminescent layer,
wherein a top surface of the first electrode has a first region overlapping with the inorganic insulating film and a second region not overlapping with the inorganic insulating film,
wherein the second region is nitrided and the first region is not nitrided, and
wherein the second region contains nitrogen at a rate of 20 to 50 atomic %.

2. A light emitting display device according to claim 1, wherein the inorganic insulating film comprises any one of silicon oxide and aluminum oxide.

3. A light emitting display device according to claim 1, wherein the rounded corner is formed by a plasma treatment under a nitrogen atmosphere.

4. A light emitting display device according to claim 3, wherein the plasma treatment is performed with an electron density of $1 \times 10^{11}$ $cm^{-3}$ to $1 \times 10^{13}$ $cm^{-3}$, and a plasma electron temperature of 0.5 eV to 1.5 eV.

5. A light emitting display device according to claim 3, wherein the inorganic insulating film comprises 20 atomic % to 50 atomic % of a nitrogen concentration in a portion from a plasma treated surface of the inorganic insulating film to 1 nm depth.

6. A light emitting display device according to claim 1, wherein the inorganic insulating film comprises 40-60 degrees of a taper angle between an end portion of the inorganic insulating film and the first electrode.

7. A light emitting display device according to claim 1, wherein the inorganic insulating film comprises any one of silicon oxide and aluminum oxide, and
wherein a surface of the inorganic insulating film is nitrided.

8. A light emitting display device comprising:
a thin film transistor over a substrate;
an interlayer insulating film over the thin film transistor;
a wiring over the interlayer insulating film, wherein the wiring is electrically connected to the thin film transistor;
a first electrode over the wiring, wherein the first electrode is electrically connected to the wiring;
a first inorganic insulating film over the first electrode;
a second inorganic insulating film over the first inorganic insulating film, wherein the first and the second inorganic insulating film have openings which reach the first electrode;
a rounded corner at the opening of the second inorganic insulating film;
an electroluminescent layer over the second inorganic insulating film and the first electrode; and
a second electrode over the electroluminescent layer,
wherein a top surface of the first electrode has a first region overlapping with the inorganic insulating film and a second region not overlapping with the inorganic insulating film,
wherein the second region is nitrided and the first region is not nitride, and
wherein the second region contains nitrogen at a rate of 20 to 50 atomic %.

9. A light emitting display device according to claim 8, wherein the first inorganic insulating film comprises any one of silicon nitride and aluminum nitride.

10. A light emitting display device according to claim 8, wherein the second inorganic insulating film comprises any one of silicon oxide and aluminum oxide.

11. A light emitting display device according to claim 8, wherein the rounded corner is formed by a plasma treatment under a nitrogen atmosphere.

12. A light emitting display device according to claim 11, wherein the plasma treatment is performed with an electron density of $1 \times 10^{11}$ $cm^{-3}$ to $1 \times 10^{13}$ $cm^{-3}$, and a plasma electron temperature of 0.5 eV to 1.5 eV.

13. A light emitting display device according to claim 11, wherein the second inorganic insulating film comprises 20 atomic % to 50 atomic % of a nitrogen concentration in a portion from a plasma treated surface of the second inorganic insulating film to 1 nm depth.

14. A light emitting display device according to claim 8, wherein the first inorganic insulating film comprises 40-60 degrees of a taper angle between an end portion of the first inorganic insulating film and the first electrode.

15. A light emitting display device according to claim 8, wherein the second inorganic insulating film comprises any one of silicon oxide and aluminum oxide, and
wherein a surface of the second inorganic insulating film is nitrided.

16. A light emitting display device comprising:
a thin film transistor over a substrate;

an interlayer insulating film over the thin film transistor;
a wiring over the interlayer insulating film, wherein the wiring is electrically connected to the thin film transistor;
a first electrode over the wiring, wherein the first electrode is electrically connected to the wiring;
an inorganic insulating film over the first electrode, wherein the inorganic insulating film has an opening which reaches the first electrode;
a rounded corner at the opening of the inorganic insulating film;
an electroluminescent layer over the inorganic insulating film; and
a second electrode over the electroluminescent layer,
wherein a top surface of the first electrode has a first region overlapping with the inorganic insulating film and a second region not overlapping with the inorganic insulating film,
wherein the second region is nitrided and the first region is not nitrided,
wherein the second region contains nitrogen at a rate of 20 to 50 atomic %, and
wherein the opening has a taper angle.

17. A light emitting display device according to claim 16, wherein the inorganic insulating film comprises any one of silicon oxide and aluminum oxide.

18. A light emitting display device according to claim 16, wherein the rounded corner is formed by a plasma treatment performed under a nitrogen atmosphere.

19. A light emitting display device according to claim 18, wherein the plasma treatment is performed with an electron density of $1\times10^{11}$ cm$^{-3}$ to $1\times10^{13}$ cm$^{-3}$, and a plasma electron temperature of 0.5 eV to 1.5 eV.

20. A light emitting display device according to claim 18, wherein the inorganic insulating film comprises 20 atomic % to 50 atomic % of a nitrogen concentration in a portion from a plasma treated surface of the inorganic insulating film to 1 nm depth.

21. A light emitting display device according to claim 16, wherein the inorganic insulating film comprises 40-60 degrees of the taper angle between an end portion of the inorganic insulating film and the first electrode.

22. A light emitting display device according to claim 16, wherein the opening of the inorganic insulating film is formed by a dry etching in an atmosphere containing oxygen.

23. A light emitting display device according to claim 16, wherein the inorganic insulating film comprises any one of silicon oxide and aluminum oxide, and
wherein a surface of the inorganic insulating film is nitrided.

24. A light emitting display device comprising:
a thin film transistor over a substrate;
an interlayer insulating film over the thin film transistor;
a wiring over the interlayer insulating film, wherein the wiring is electrically connected to the thin film transistor;
a first electrode over the wiring, wherein the first electrode is electrically connected to the wiring;
a first inorganic insulating film over the first electrode;
a second inorganic insulating film over the first inorganic insulating film, wherein the first and the second inorganic insulating film have a first opening and a second opening respectively, which reach the first electrode;
a rounded corner at the second opening of the second inorganic insulating film;
an electroluminescent layer over the second inorganic insulating film and the first electrode; and
a second electrode over the electroluminescent layer,
wherein a top surface of the first electrode has a first region overlapping with the inorganic insulating film and a second region not overlapping with the inorganic insulating film,
wherein the second region is nitrided and the first region is not nitrided,
wherein the second region contains nitrogen at a rate of 20 to 50 atomic %, and
wherein a first taper angle of the first opening and a second taper angle of the second opening are different.

25. A light emitting display device according to claim 24, wherein the first inorganic insulating film comprises any one of silicon nitride and aluminum nitride.

26. A light emitting display device according to claim 24, wherein the second inorganic insulating film comprises any one of silicon oxide and aluminum oxide.

27. A light emitting display device according to claim 24, wherein the rounded corner is formed by a plasma treatment under a nitrogen atmosphere.

28. A light emitting display device according to claim 27, wherein the plasma treatment is performed with an electron density of $1\times10^{11}$ cm$^{-3}$ to $1\times10^{13}$ cm$^{-3}$, and a plasma electron temperature of 0.5 eV to 1.5 eV.

29. A light emitting display device according to claim 27, wherein the second inorganic insulating film comprises 20 atomic % to 50 atomic % of a nitrogen concentration in a portion from a plasma treated surface of the second inorganic insulating film to 1 nm depth.

30. A light emitting display device according to claim 24, wherein the first inorganic insulating film and the second inorganic insulating film comprise a taper angle of 40-60 degrees.

31. A light emitting display device according to claim 24, wherein the first opening of the first inorganic insulating film and the second opening of the second inorganic insulating film are formed by a dry etching in an atmosphere containing oxygen.

32. A light emitting display device according to claim 24, wherein the second inorganic insulating film comprises any one of silicon oxide and aluminum oxide, and
wherein a surface of the second inorganic insulating film is nitrided.

* * * * *